(12) United States Patent
Limberg

(10) Patent No.: US 8,111,769 B2
(45) Date of Patent: *Feb. 7, 2012

(54) TRANSMISSIONS WITH REDUCED CODE RATE IN 8VSB DIGITAL TELEVISION

(75) Inventor: Allen LeRoy Limberg, Port Charlotte, FL (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/691,858

(22) Filed: Jan. 22, 2010

(65) Prior Publication Data

US 2010/0124287 A1 May 20, 2010

Related U.S. Application Data

(63) Continuation of application No. 11/602,771, filed on Nov. 21, 2006, now Pat. No. 7,668,257, which is a continuation-in-part of application No. 10/955,212, filed on Sep. 30, 2004, now Pat. No. 7,668,250.

(60) Provisional application No. 60/507,797, filed on Oct. 1, 2003, provisional application No. 60/524,984, filed on Nov. 25, 2003, provisional application No. 60/531,124, filed on Dec. 19, 2003, provisional application No. 60/738,737, filed on Nov. 22, 2005.

(51) Int. Cl.
*H04L 23/02* (2006.01)
*H04L 5/12* (2006.01)

(52) U.S. Cl. ......... 375/265; 375/262; 375/263; 375/264

(58) Field of Classification Search .................. 375/265, 375/259, 301, 148

See application file for complete search history.

(56) References Cited

U.S. PATENT DOCUMENTS

| | | | |
|---|---|---|---|
| 6,351,500 B2 | 2/2002 | Kumar | |
| 6,430,159 B1 | 8/2002 | Wan et al. | |
| 6,973,137 B2 * | 12/2005 | Birru et al. | 375/265 |
| 6,980,603 B2 | 12/2005 | Choi et al. | |
| 7,050,511 B2 | 5/2006 | Jeong et al. | |
| 2004/0237024 A1 | 11/2004 | Limberg | |
| 2006/0039503 A1 * | 2/2006 | Choi et al. | 375/301 |

* cited by examiner

*Primary Examiner* — Khanh C Tran
*Assistant Examiner* — Qutbuddin Ghulamali
(74) *Attorney, Agent, or Firm* — Sughrue Mion, PLLC

(57) ABSTRACT

Procedures performed prior to convolutional interleaving of 8VSB digital television signals restrict the alphabet of symbols in novel methods of generating trellis-coded digital television signals that include more robust symbol coding using a restricted alphabet of symbols selected from a full 8VSB symbol alphabet consisting of $-7, -5, -3, -1, +1, +3, +5$ and $+7$ normalized modulation levels superposed on a background modulation level. Certain of these novel procedures generate pseudo-2VSB or P-2VSB robust symbol coding with a restricted alphabet of symbols consisting of $-7, -5, +5$ and $+7$ normalized modulation levels superposed on a background modulation level. Others of these novel procedures generate prescribed-coset-pattern-modulation or PCPM robust symbol coding intermixing two restricted alphabets of symbols according to a prescribed pattern. One of the two restricted alphabets of symbols used in PCPM consists of $-3, -1, +5$ and $+7$ normalized modulation levels superposed on a background modulation level. The other of the two restricted alphabets of symbols used in PCPM consists of $-7, -5, +1$ and $+3$ normalized modulation levels superposed on a background modulation level.

29 Claims, 33 Drawing Sheets

| ADDRESS | X-SUB-ONE | ADDRESS | X-SUB-ONE |
|---------|-----------|---------|-----------|
| 000000 | 1 | 011000 | 0 |
| 000001 | 0 | 011001 | 1 |
| 000010 | 1 | 011010 | 0 |
| 000011 | 0 | 011011 | 1 |
| 000100 | 0 | 011100 | 1 |
| 000101 | 1 | 011101 | 0 |
| 000110 | 1 | 011110 | 0 |
| 000111 | 0 | 011111 | 1 |
| 001000 | 0 | 100000 | 1 |
| 001001 | 1 | 100001 | 0 |
| 001010 | 0 | 100010 | 1 |
| 001011 | 1 | 100011 | 0 |
| 001100 | 1 | 100100 | 0 |
| 001101 | 0 | 100101 | 1 |
| 001110 | 1 | 100110 | 0 |
| 001111 | 0 | 100111 | 1 |
| 010000 | 0 | 101000 | 1 |
| 010001 | 1 | 101001 | 0 |
| 010010 | 1 | 101010 | 0 |
| 010011 | 0 | 101011 | 1 |
| 010100 | 0 | 101100 | 1 |
| 010101 | 1 | 101101 | 0 |
| 010110 | 0 | 101110 | 1 |
| 010111 | 1 | 101111 | 0 |

ROUTINE TO VALIDATE INSERTION OF RESTRICTED-ALPHABET DATA SEGMENTS INTO TDM

START.

RESET SEGMENT SLOT COUNTER TO NUMBER CORRESPONDING TO PROPOSED POSITION OF FINAL DATA SEGMENT OF PAIR WITHIN A DATA FIELD.

RANDOMIZE DATA PACKET WITH PRBS FOR SEGMENT SLOT COUNT.

PERFORM 1ST TYPE LATERAL (207, 187) R-S FEC CODING ON RANDOMIZED DATA PACKET TO GENERATE SEED DATA SEGMENT.

RE-SAMPLE 1ST HALF OF SEED DATA SEGMENT OF X-SUB-2 BITS BY ALTERNATING THOSE BITS WITH X-SUB-1 BITS OF PRESCRIBED PATTERN TO HALVE CODE RATE & GENERATE INITIAL DATA SEGMENT OF PAIR.

PERFORM 1ST TYPE LATERAL (207, 187) R-S FEC DECODING ON INITIAL DATA SEGMENT OF PAIR.

DOES RESULTING DATA PACKET HAVE BOTH VALID PID & TEI INDICATING CORRECTABLE BYTE ERROR?

IF YES, INCREMENT SEGMENT SLOT COUNT & RE-START ROUTINE.

IF NO, RE-SAMPLE 2ND HALF OF SEED DATA SEGMENT OF X-SUB-2 BITS BY ALTERNATING THOSE BITS WITH X-SUB-1 BITS OF PRESCRIBED PATTERN TO HALVE CODE RATE & TO GENERATE FINAL DATA SEGMENT OF PAIR.

PERFORM 1ST TYPE LATERAL (207, 187) R-S FEC DECODING ON FINAL DATA SEGMENT OF PAIR.

DOES RESULTING DATA PACKET HAVE BOTH VALID PID & TEI INDICATING CORRECTABLE BYTE ERROR?

IF YES, INCREMENT SEGMENT SLOT COUNT & RE-START ROUTINE.

IF NO, INSERT PAIR OF DATA SEGMENTS INTO TIME-DIVISION MULTIPLEX INTO POSITIONS CORRESPONDING WITH FINALLY PROPOSED POSITION OF FINAL DATA SEGMENT OF PAIR.

FINISH.

Fig. 11

ROUTINE TO VALIDATE INSERTION OF RESTRICTED-ALPHABET DATA SEGMENTS INTO TDM

START.

RESET SEGMENT SLOT COUNTER TO NUMBER CORRESPONDING TO PROPOSED POSITION OF FINAL DATA SEGMENT OF PAIR WITHIN A DATA FIELD.

RANDOMIZE DATA PACKET WITH PRBS FOR SEGMENT SLOT COUNT.

PERFORM 1ST TYPE LATERAL (207, 187) R-S FEC CODING ON RANDOMIZED DATA PACKET TO GENERATE SEED DATA SEGMENT.

RE-SAMPLE 1ST HALF OF SEED DATA SEGMENT BY IMMEDIATELY REPEATING EACH BIT THEREOF TO HALVE CODE RATE & GENERATE INITIAL DATA SEGMENT OF PAIR.

PERFORM 1ST TYPE LATERAL (207, 187) R-S FEC DECODING ON INITIAL DATA SEGMENT OF PAIR.

DOES RESULTING DATA PACKET HAVE BOTH VALID PID & TEI INDICATING CORRECTABLE BYTE ERROR?

IF YES, INCREMENT SEGMENT SLOT COUNT & RE-START ROUTINE.

IF NO, RE-SAMPLE 2ND HALF OF SEED DATA SEGMENT BY IMMEDIATELY REPEATING EACH BIT THEREOF TO HALVE CODE RATE & GENERATE FINAL DATA SEGMENT OF PAIR.

PERFORM 1ST TYPE LATERAL (207, 187) R-S FEC DECODING ON FINAL DATA SEGMENT OF PAIR.

DOES RESULTING DATA PACKET HAVE BOTH VALID PID & TEI INDICATING CORRECTABLE BYTE ERROR?

IF YES, INCREMENT SEGMENT SLOT COUNT & RE-START ROUTINE.

IF NO, INSERT PAIR OF DATA SEGMENTS INTO TIME-DIVISION MULTIPLEX INTO POSITIONS CORRESPONDING WITH FINALLY PROPOSED POSITION OF FINAL DATA SEGMENT OF PAIR.

FINISH.

Fig. 12

ROUTINE TO VALIDATE INSERTION OF RESTRICTED-ALPHABET TRS-PARITY-BYTE SEGMENTS INTO TDM

START.

RESET SEGMENT SLOT COUNTER TO NO. CORRESPONDING TO PROPOSED POSITION OF FINAL DATA SEGMENT OF PAIR WITHIN A DATA FIELD.

PERFORM 2ND TYPE LATERAL (207, 187) R-S FEC CODING ON PACKET OF TRS PARITY BYTES TO GENERATE SEED DATA SEGMENT.

RE-SAMPLE 1ST HALF OF SEED DATA SEGMENT OF X-SUB-2 BITS BY ALTERNATING THOSE BITS WITH X-SUB-1 BITS OF PRESCRIBED PATTERN TO HALVE CODE RATE & GENERATE INITIAL DATA SEGMENT OF PAIR.

PERFORM 1ST TYPE LATERAL (207, 187) R-S FEC DECODING ON INITIAL DATA SEGMENT OF PAIR.

DOES RESULTING DATA PACKET HAVE BOTH VALID PID & TEI INDICATING CORRECTABLE BYTE ERROR?

IF YES, INCREMENT SEGMENT SLOT COUNT & RE-START ROUTINE.

IF NO, RE-SAMPLE 2ND HALF OF SEED DATA SEGMENT OF X-SUB-2 BITS BY ALTERNATING THOSE BITS WITH X-SUB-1 BITS OF PRESCRIBED PATTERN TO HALVE CODE RATE & TO GENERATE FINAL DATA SEGMENT OF PAIR.

PERFORM 1ST TYPE LATERAL (207, 187) R-S FEC DECODING ON FINAL DATA SEGMENT OF PAIR.

DOES RESULTING DATA PACKET HAVE BOTH VALID PID & TEI INDICATING CORRECTABLE BYTE ERROR?

IF YES, INCREMENT SEGMENT SLOT COUNT & RE-START ROUTINE.

IF NO, INSERT PAIR OF DATA SEGMENTS INTO TIME-DIVISION MULTIPLEX INTO POSITIONS CORRESPONDING WITH FINALLY PROPOSED POSITION OF FINAL DATA SEGMENT OF PAIR.

FINISH.

Fig. 13

ROUTINE TO VALIDATE INSERTION OF RESTRICTED-ALPHABET TRS-PARITY-BYTE SEGMENTS INTO TDM

START.

RESET SEGMENT SLOT COUNTER TO NO. CORRESPONDING TO PROPOSED POSITION OF FINAL DATA SEGMENT OF PAIR WITHIN A DATA FIELD.

PERFORM 3RD TYPE LATERAL (207, 187) R-S FEC CODING ON PACKET OF TRS PARITY BYTES TO GENERATE SEED DATA SEGMENT.

RE-SAMPLE 1ST HALF OF SEED DATA SEGMENT BY IMMEDIATELY REPEATING EACH BIT THEREOF TO HALVE CODE RATE & GENERATE INITIAL DATA SEGMENT OF PAIR.

PERFORM 1ST TYPE LATERAL (207, 187) R-S FEC DECODING ON INITIAL DATA SEGMENT OF PAIR.

DOES RESULTING DATA PACKET HAVE BOTH VALID PID & TEI INDICATING CORRECTABLE BYTE ERROR?

IF YES, INCREMENT SEGMENT SLOT COUNT & RE-START ROUTINE.

IF NO, RE-SAMPLE 2ND HALF OF SEED DATA SEGMENT BY IMMEDIATELY REPEATING EACH BIT THEREOF TO HALVE CODE RATE & TO GENERATE FINAL DATA SEGMENT OF PAIR.

PERFORM 1ST TYPE LATERAL (207, 187) R-S FEC DECODING ON FINAL DATA SEGMENT OF PAIR.

DOES RESULTING DATA PACKET HAVE BOTH VALID PID & TEI INDICATING CORRECTABLE BYTE ERROR?

IF YES, INCREMENT SEGMENT SLOT COUNT & RE-START ROUTINE.

IF NO, INSERT PAIR OF DATA SEGMENTS INTO TIME-DIVISION MULTIPLEX INTO POSITIONS CORRESPONDING WITH FINALLY PROPOSED POSITION OF FINAL DATA SEGMENT OF PAIR.

FINISH.

TRANSMISSIONS WITH REDUCED CODE RATE IN 8VSB DIGITAL TELEVISION

This is a continuation application of U.S. patent application Ser. No. 11/602,771 filed on Nov. 21, 2006, which is a continuation-in-part of U.S. patent application Ser. No. 10/955,212 filed 30 Sep. 2004 under 35 U.S.C. 111(a), claiming pursuant to 35 U.S.C. 119(e)(1) benefit of the filing dates of provisional U.S. patent applications Ser. Nos. 60/507,797, 60/524,984 and 60/531,124 filed under 35 U.S.C. 111(b) on 1 Oct. 2003, 25 Nov. 2003 and 19 Dec. 2003, respectively. This application also claims pursuant to 35 U.S.C. 119(e)(1) benefit of the filing date of provisional U.S. patent application Ser. No. 60/738,737 filed under 35 U.S.C. 111(b) on 22 Nov. 2005.

This invention relates to modifications of 8VSB digital television (DTV) signals to restrict the 8VSB symbol alphabet and thereby increase robustness of over-the-air transmission.

BACKGROUND OF THE INVENTION

The ⅔ trellis coding used in 8VSB DTV broadcasting already restricts the 8VSB symbol alphabet, which includes normalized modulation levels of −7, −5, −3, −1, +1, +3, +5 and +7. 8VSB without ⅔ trellis coding would have a symbol-error-distance distance of two normalized modulation levels. The ⅔ trellis coding can be exploited to increase the symbol-error-distance in effect, so an error of at least four normalized modulation levels is required to cause an error in decision. A signal-to-noise ratio (SNR) of at least 14.5 dB is required for the trellis coded 8 VSB DTV signal to exceed the threshold of visibility (TOV) of errors in the received DTV signal.

Certain ways of further restricting the 8VSB symbol alphabet to increase robustness of over-the-air transmission were specifically described in U.S. patent application Ser. No. 10/078,933 titled "ATSC DIGITAL TELEVISION SYSTEM" and filed 19 Feb. 2002 by D. Birru, V. R. Gaddam and M. Ghosh. The 5 Dec. 2002 publication number is 2002-0181581, and the application is assigned to Koninklijke Philips Electronics, N.V. This Philips application describes hierarchical 8VSB modulation, trellis-coded 4VSB modulation, and pseudo-2VSB (P-2VSB) modulation.

U.S. patent application Ser. No. 10/078,933 teaches that P-2VSB modulation can be generated by choosing the $Y_2$ bit in each two-bit symbol supplied to the ⅔ trellis encoder in an 8VSB DTV transmitter to be the same as the $X_1$ bit. This restricts the 8VSB symbol alphabet to consist of only those symbols corresponding to normalized modulation levels of −7, −5, +5 and +7. In the resulting pseudo-2VSB or P-2VSB modulation a symbol-error-distance of at least ten normalized modulation levels is required to cause an error in decision between the 00 and the 11 two-bit symbols. Presuming the transmitted data to be random, P-2VSB modulation has a higher ratio of average power to peak power than 8VSB modulation. When P-2VSB signal is time-division multiplexed with 8VSB signal, there is a need to cut back on DTV transmitter modulation levels to stay within the bounds of average power permitted to the particular broadcast station. The reduction in power reduces the strength of the 8VSB signal to some degree. The loss of 8VSB signal strength becomes objectionably large as the proportion of P-2VSB signal time-division multiplexed with the 8VSB signal is increased beyond a few percent.

U.S. patent application Ser. No. 10/078,933 teaches that trellis-coded 4VSB modulation can be generated by choosing the $Y_2$ bit in each two-bit symbol supplied to a ⅔ trellis encoder in an 8VSB DTV transmitter to be the same as the $Z_0$ bit generated by the ⅔ trellis encoder. This results in ⅓ trellis encoding that restricts the 8VSB symbol alphabet so as to consist of only those symbols corresponding to normalized modulation levels of −7, −3, +3 and +7. A symbol-error distance of at least four normalized modulation levels is required to cause a simple data slicer to make an error in decision as to the received $Z_1$ information bit. Presuming the transmitted data to be random, the trellis-coded 4VSB modulation has a ratio of average power to peak power that is nominally the same as 8VSB modulation has.

U.S. patent application Ser. No. 10/078,933 describes P-2VSB and trellis-coded 4VSB modulation being generated subsequent to the convolutional interleaving of data segments that follows Reed-Solomon coding. Such procedure undesirably complicates the time-division multiplexing of P-2VSB and trellis-coded 4VSB signal with ordinary 8VSB signal. U.S. patent application Ser. No. 10/733,645 filed 12 Dec. 2003 by A. L. R. Limberg and titled "ROBUST SIGNAL TRANSMISSIONS IN DIGITAL TELEVISION BROADCASTING" was published 25 Nov. 2004 with publication number 2004-0237024 and issued 27 Mar. 2007 as U.S. Pat. No. 7,197,685, and the entire publication of that patent application is incorporated by reference herein. That published patent application describes P-2VSB being generated subsequent to data randomization, but prior to the convolutional interleaving of data segments that follows Reed-Solomon coding. Such procedure simplifies the time-division multiplexing of P-2VSB with ordinary 8VSB signal, since interleaving can be done on a data-segment-by-data-segment basis. This facilitates assembly of a program originating from more than one source. Switching among several TV cameras is simpler, and so is switching between live TV and recorded TV. Editing recorded TV is simpler.

U.S. patent application Ser. No. 10/955,212 filed 30 Sep. 2004 by A. L. R. Limberg and titled "TIME-DEPENDENT TRELLIS CODING FOR MORE ROBUST DIGITAL TELEVISION SIGNALS" was published 7 Apr. 2005 with publication number 2005-0074074. That publication in its entirety is incorporated herein by reference. That published patent application describes PCMP (prescribed coset pattern modulation) for DTV signals, describing specific types of PCPM as well as describing PCPM generically. In PCMP the 8VSB symbol alphabet is restricted in one of two prescribed ways for each symbol. The $Y_2$ bit in each two-bit symbol supplied to the ⅔ trellis encoder in an 8VSB DTV transmitter is chosen in accordance with a prescribed value to restrict the symbol alphabet. If the prescribed $Y_2$ bit is ONE, the symbol alphabet is restricted to a first coset of −3, −1, +5 and +7 normalized modulation levels. If the prescribed $Y_2$ bit is ZERO, the symbol alphabet is restricted to a second coset of −7, −5, +1 and +3 normalized modulation levels. The pattern of prescribed $Y_2$ bits is chosen so that the ratio of average power to peak power for PCPM is nominally the same as for 8VSB modulation. A symbol-error-distance of at least six normalized modulation levels is required to cause a simple data slicer to make an error in decision as to the received $Z_2$ information bit.

Published patent application No. 2005-0074074 describes PCPM being generated subsequent to data randomization, but prior to the convolutional interleaving of data segments that follows Reed-Solomon coding. This procedure facilitates the time-division multiplexing of PCPM signal with ordinary 8VSB signal.

U.S. Pat. No. 6,178,209 titled "METHOD OF ESTIMATING TRELLIS ENCODED SYMBOLS UTILIZING SIMPLIFIED TRELLIS DECODING" issued 19 Jun. 1998 to S.

N. Hulyalkar, T. J. Endres, T. A. Schaffer and C. H. Strolle. U.S. Pat. No. 6,178,209 describes a "smart" data slicer that takes into consideration the $Z_o$ bit predicted by trellis code when making a symbol decision. The symbol-error-distance of 8VSB signal is at least two normalized modulation levels with a simple data slicer. Theoretically, a smart data slicer can double the symbol-error-distance of 8VSB signal to four normalized modulation levels. A smart data slicer can be modified such that in theory a symbol-error-distance of at least twelve normalized modulation levels is required to cause an error in decision as to the received $Z_1$ information bit in a P-2VSB signal. A smart data slicer can be modified such that in theory a symbol-error-distance of at least eight normalized modulation levels is required to cause an error in decision as to the received $Z_2$ information bit in a PCPM signal. A smart data slicer is not particularly advantageous when symbol decoding trellis-coded 4VSB modulation.

The entirety of U.S. patent application Ser. No. 11/119,662 titled "DIGITAL TELEVISION SIGNALS USING LINEAR BLOCK CODING" filed 2 May 2005 by A. L. R. Limberg is included herein by reference. application Ser. No. 11/119,662 describes linear block coding of digital data to be transmitted using PCPM. This application, now abandoned, was published 2 Nov. 2006 with publication number 2006-0245505.

SUMMARY OF THE INVENTION

Procedures performed previous to convolutional interleaving of 8VSB digital television signals restrict the alphabet of symbols in novel methods of generating trellis-coded digital television signals that include more robust symbol coding using a restricted alphabet of symbols selected from a full 8 VSB symbol alphabet consisting of $-7, -5, -3, -1, +1, +3, +5$ and $+7$ normalized modulation levels superposed on a background modulation level. Certain of these novel procedures generate pseudo-2VSB or P-2VSB robust symbol coding with a restricted alphabet of symbols consisting of $-7, -5, +5$ and $+7$ normalized modulation levels superposed on a background modulation level. Others of these novel procedures generate robust symbol coding of prescribed-coset-pattern-modulation or PCPM type, intermixing two restricted alphabets of symbols according to a prescribed pattern. One of the two restricted alphabets of symbols used in PCPM consists of $-3, -1, +5$ and $+7$ normalized modulation levels superposed on a background modulation level. The other of the two restricted alphabets of symbols used in PCPM consists of $-7, -5, +1$ and $+3$ normalized modulation levels superposed on a background modulation level.

BRIEF DESCRIPTION OF THE DRAWING

FIG. 11 is a listing of the steps in a routine to validate the insertion of restricted-alphabet data segments into the time-division multiplex (TDM) signal that defines a data field before subsequent convolutional interleaving and trellis coding carried out in a DTV transmitter of FIG. 1 sort.

FIG. 12 is a listing of the steps in a routine to validate the insertion of restricted-alphabet data segments into the time-division multiplex (TDM) signal that defines a data field before subsequent convolutional interleaving and trellis coding carried out in a DTV transmitter of FIG. 7 sort.

FIG. 13 is a listing of the steps in a routine to validate the insertion of restricted-alphabet data segments into the time-division multiplex (TDM) signal that defines a data field before subsequent convolutional interleaving and trellis coding carried out in a DTV transmitter of FIG. 1 sort or FIG. 2 sort, as modified per FIG. 8.

FIG. 14 is a listing of the steps in a routine to validate the insertion of restricted-alphabet data segments into the time-division multiplex (TDM) signal that defines a data field before subsequent convolutional interleaving and trellis coding carried out in a DTV transmitter of FIG. 7 sort, as modified similar to FIG. 8.

DETAILED DESCRIPTION

Figure 1:
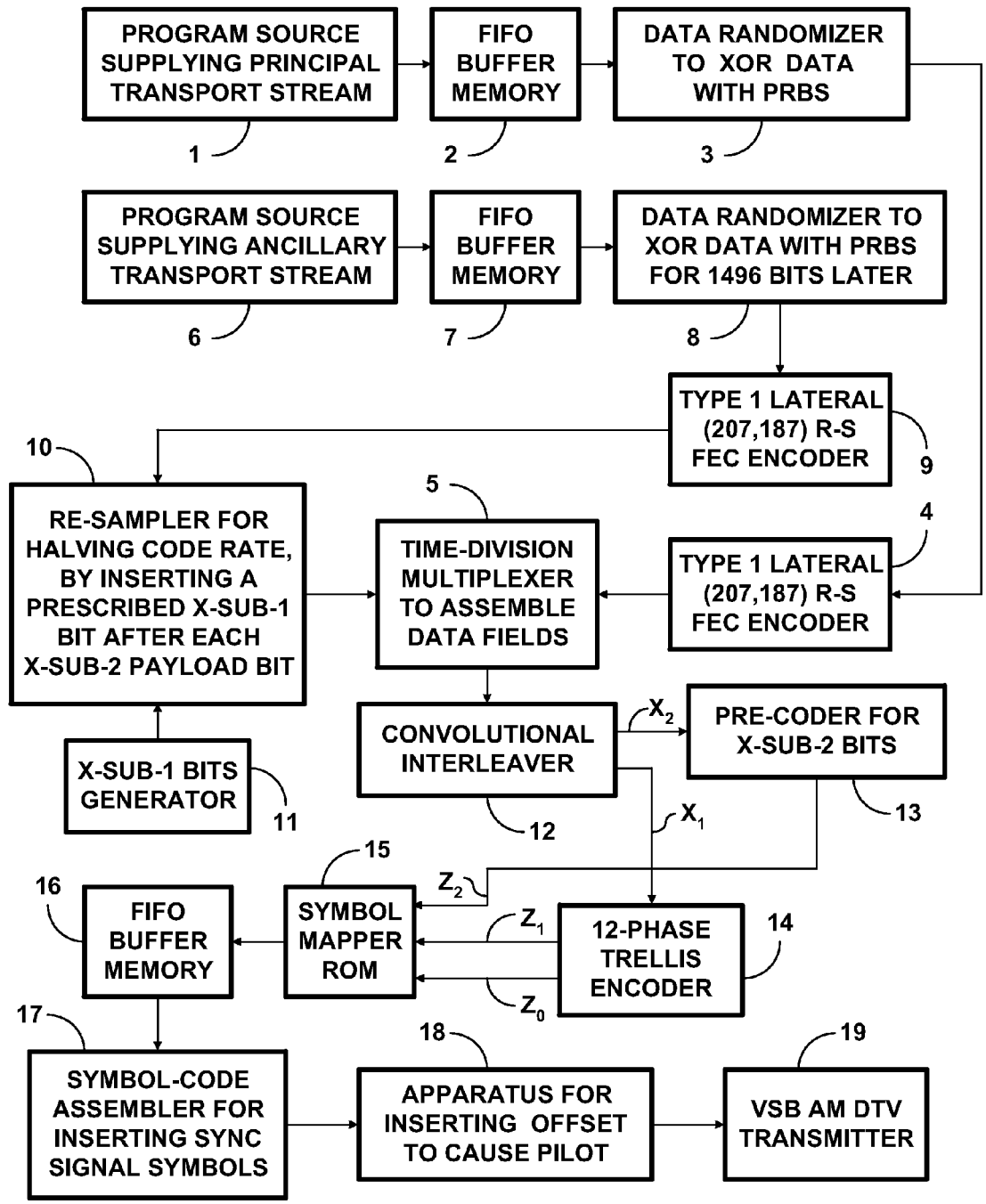
FIG. 1 is a generic schematic diagram of a DTV transmitter constructed in accordance with an aspect of the invention, which DTV transmitter provides for the transmission of ordinary 8VSB signals in time-division multiplex with more robust signals using a restricted symbol alphabet.

FIG. 1 shows a program source 1 of a principal transport stream connected for supplying the successive 187-byte data packets in that transport stream to be written into a first-in/first-out buffer memory 2 for temporary storage therein. A data randomizer 3 is connected for receiving data packets read from the FIFO buffer memory 2 and randomizing the bits in those data packets by exclusive-ORing those bits with the bits of a $2^{16}$-bit maximal length pseudo-random binary sequence (PRBS). The PRBS, which is initialized at the beginning of each data field, is that specified in A/53, Annex D, §§4.2.2 titled "Data randomizer". The portion of the PRBS used in exclusive-ORing each data segment is that portion which is suitable for the location of that data segment in the non-interleaved data field that will be assembled for subsequent lateral (207, 187) R-S FEC coding, convolutional interleaving and trellis coding. A lateral (207, 187) Reed-Solomon forward-error-correction encoder 4 is connected for receiving from the data randomizer 3 the randomized 187-byte data packets of the principal transport stream. The lateral (207, 187) R-S FEC encoder 4 converts these randomized 187-byte data packets to respective 207-byte segments of lateral (207, 187) Reed-Solomon forward-error-correction coding that appends the respective twenty parity bytes of the coding of each randomized 187-byte data packet after the conclusion thereof. The lateral (207, 187) R-S FEC encoder 4 is of a first type, which is conventional in nature; and the practice specified in A/53, Annex D, §§4.2.3 titled "Reed-Solomon encoder" is followed. A time-division multiplexer 5 used to assemble data fields is connected for receiving at a first of its two input ports the 207-byte segments of lateral (207, 187) R-S FEC coding generated by the lateral (207, 187) R-S FEC encoder 4.

FIG. 1 shows a program source 6 of an ancillary transport stream connected for supplying the successive 187-byte data packets in that transport stream to be written into a first-in/first-out buffer memory 7 for temporary storage therein. A data randomizer 8 is connected for receiving data packets read from the FIFO buffer memory 7. The data randomizer 8 is operated for randomizing the bits in those data packets by exclusive-ORing them with the bits of the PRBS advanced 1496 bits (1 data packet) respective to the location of that data segment in the non-interleaved data field. I.e., the portion of the PRBS used for PRBS exclusive-ORing these bits is suitable for the location of the next data segment in the non-interleaved data field. This next data segment can be thought of as a null data segment that is replaced during a subsequent re-sampling procedure for halving code rate. A lateral (207, 187) Reed-Solomon forward-error-correction encoder 9 of conventional first type is connected for receiving from the data randomizer 8 the randomized 187-byte data packets of the ancillary transport stream. The lateral (207, 187) R-S FEC encoder 9 converts these randomized 187-byte data packets to respective 207-byte segments of lateral (207, 187) R-S FEC coding that appends the respective twenty parity bytes of the coding of each randomized 187-byte data packet after the conclusion thereof. A re-sampler 10 is connected for receiving these 207-byte segments from the lateral (207, 187) R-S FEC encoder 9 and generates in response to each of these 207-byte segments a respective pair of 207-byte segments at halved code rate. That is, the re-sampler 10 is connected to function as a code-rate-reduction encoder, further encoding each of said 207-byte lateral Reed-Solomon codewords for subsequent transmission at one-half of normal code rate. The re-sampler 10 treats each of these 207-byte segments from the lateral (207, 187) R-S FEC encoder 9 as consisting of the $X_2$ bits utilized in the data stream that the re-sampler 10 supplies to a second of the two input ports of the time-division multiplexer 5. The re-sampler 10 halves the code rate of its response by inserting a respective $X_1$ bit received from an $X_1$ bits generator 11 after each of the $X_2$ bits it receives from the lateral (207, 187) R-S FEC encoder 9.

A convolutional interleaver 12 is connected for receiving the successive data segments of the non-interleaved data field assembled by the time-division multiplexer 5. The convolutional interleaver 12 responds to supply the successive data segments of an interleaved data field using interleaving as prescribed by A/53, Annex D, §§4.2.4 titled "Interleaving". A precoder 13 is connected for receiving the $X_2$ bits of the convolutional interleaver 12 response and generating $Z_2$ bits by adding modulo-2 the $X_2$ bits with those bits from twelve symbol epochs previous. A 12-phase trellis encoder 14 is connected for receiving the $X_1$ bits of the convolutional interleaver 12 response and supplying them as $Z_1$ bits. The trellis encoder 14 is connected for supplying $Z_0$ bits that it generates dependent on previously received $X_1$ bits. A symbol map read-only memory 15 is connected for receiving $Z_2$ bits from the precoder 13 as a portion of its addressing input signal and for receiving the $Z_1$ and $Z_0$ bits from the trellis encoder 14 as the remaining portion of its addressing input signal. The trellis encoder 14, the precoder 13 and the symbol map ROM 15 conform with the 8VSB trellis encoder, precoder and symbol mapper shown in FIG. 7 of A/53, annex D. The precoder 13, the trellis encoder 14 and the symbol map ROM 15 are operated in conformance with A/53, Annex D, §§4.2.5 titled "Trellis coding".

The symbol map ROM 15 operates as a symbol mapper supplying 3-bit, 8-level symbols to a first-in/first-out buffer memory 16. The FIFO buffer memory 16 is operated to provide rate buffering and to open up intervals between 828-symbol groups in the symbol stream supplied to a symbol-code assembler 17, into which intervals the symbol-code assembler 17 inserts synchronizing signal symbols. Each of the successive data fields begins with a respective interval into which the symbol-code assembler 17 inserts symbol code descriptive of a data-segment-synchronization (DSS) sequence followed by symbol code descriptive of an initial data segment including an appropriate data-field-synchronization (DFS) sequence. Each data segment in the respective remainder of each data field is followed by a respective interval into which the symbol-code assembler 17 inserts symbol code descriptive of a respective DSS sequence. Apparatus 18 for inserting the offset to cause pilot is connected to receive assembled data fields from the symbol-code assembler 17. The apparatus 18 is simply a clocked digital adder that zero extends the number used as symbol code and adds a constant term thereto to generate a real-only modulating signal in digital form, supplied to a vestigial-sideband amplitude-modulation digital television transmitter 19 of conventional construction. The constant term introduced as the offset level in the stream of symbols supplied in digital form to the VSB AM DTV transmitter 19 as real-only modulating signal causes the background modulation level commonly referred to as "pilot" or "pilot carrier" signal.

Figure 2:
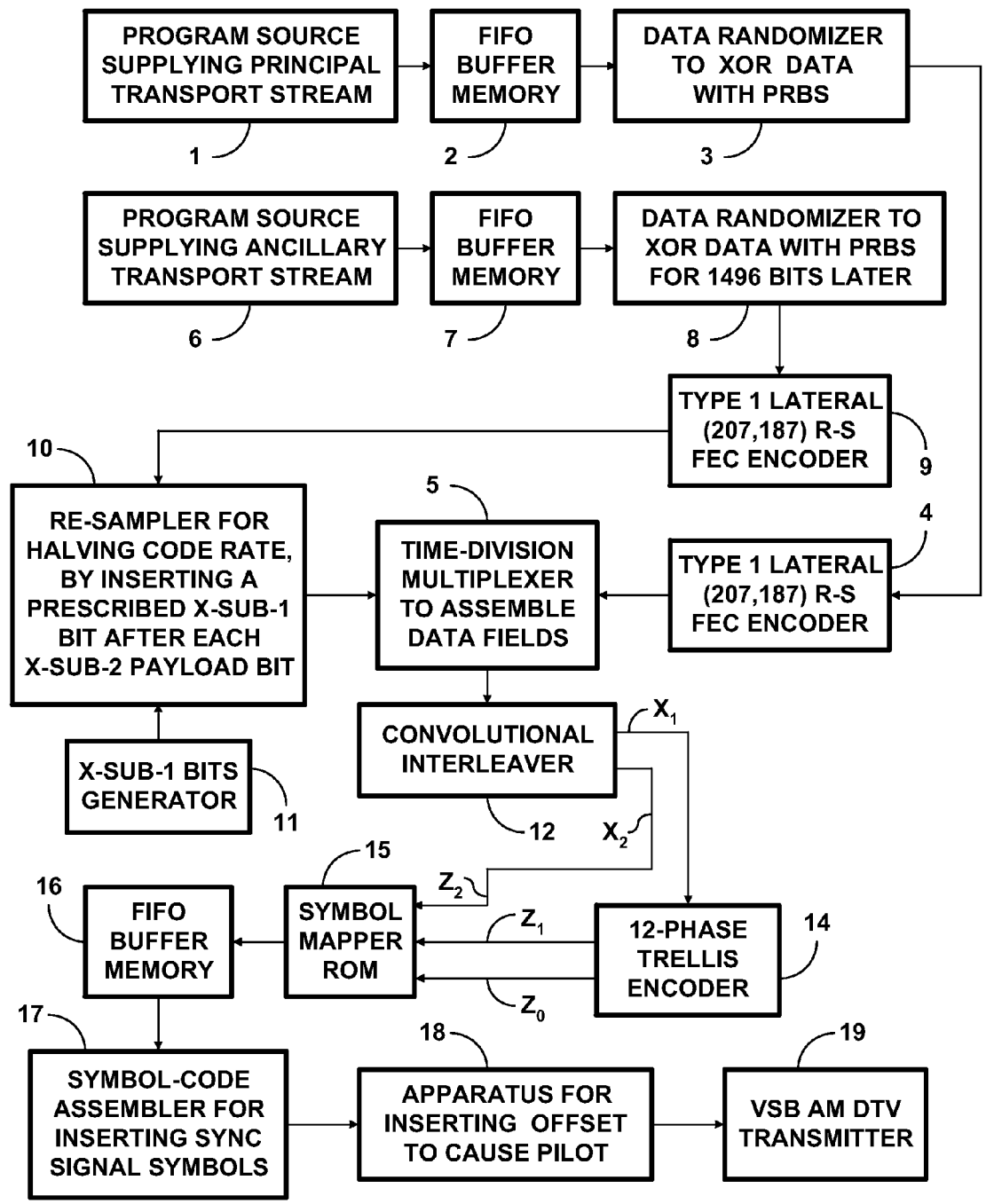
FIG. 2 is a generic schematic diagram of a DTV transmitter constructed in accordance with an aspect of the invention, which FIG. 2 DTV transmitter differs from the FIG. 1 DTV transmitter in not using a precoder for the most significant bits in 8VSB symbols.

The FIG. 2 DTV transmitter differs from the FIG. 1 DTV transmitter in not using the precoder 13 for the most significant bits in 8VSB symbols. Instead, the $X_2$ output bits supplied from the convolutional interleaver 12 are applied directly to the symbol mapper ROM 15 as the $Z_2$ input bits of a partial read address. It is preferable not to use the precoder 13 when there is no likelihood of interference from co-channel NTSC signals. This is because the simple comb filter used in a DTV receiver to complement the precoder 13 reduces the signal-to-nose ratio (SNR) of the received DTV signal.

Figures 3, 4:
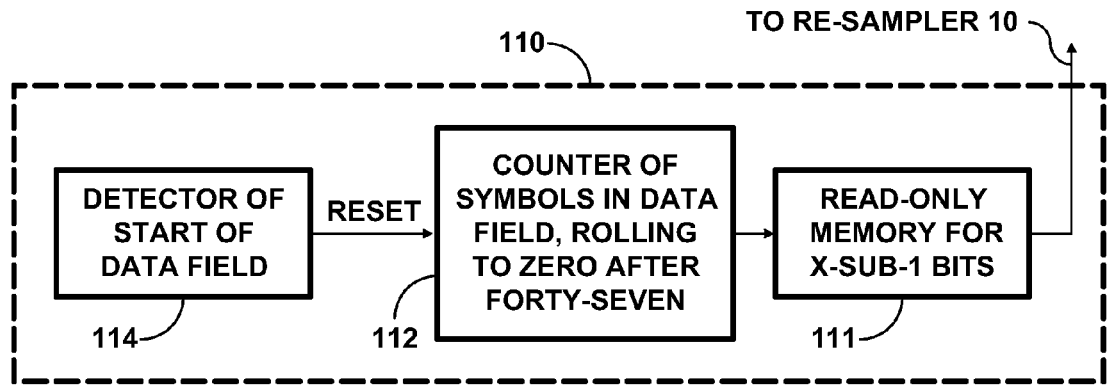
FIG. 3 is a schematic diagram showing a first particular construction of the $X_1$ bits generator for the FIG. 1 DTV transmitter or for the FIG. 2 DTV transmitter, which first particular construction of the $X_1$ bits generator was previously shown and described in U.S. patent application Ser. No. 10/955,212.
FIG. 4 is a table showing a possible set of $X_1$ bits stored in read-only memory included in the $X_1$ bits generator of FIG. 3, which table was previously shown and described in U.S. patent application Ser. No. 10/955,212.

FIG. 3 shows one particular construction 110 of the $X_1$ bits generator 11 for the FIG. 1 DTV transmitter or for the FIG. 2 DTV transmitter. A read-only memory 111 responds to input addressing received from a symbol counter 112 to supply $X_1$ bits to the re-sampler 10 in the FIG. 1 or FIG. 2 DTV transmitter, conditioning the re-sampler 10 to function as a particular kind of code-rate-reduction encoder. FIG. 4 is a table showing a possible set of $X_1$ bits stored in the ROM 111, conditioning the re-sampler 10 to function as a particular kind of code-rate-reduction encoder. The symbol counter 112 is of a type supplying consecutive counts zero through forty-seven and rolling back to zero count after forty-seven count. If the trellis encoder 14 receives $X_1$ bits that change value every second $X_1$ bit for each of the twelve trellis coding phases, the trellis encoder 14 generates all four types of $Z_1$, $Z_0$ pairs in substantially the same number over a long enough period of time. By staggering the way the $X_1$ repeats occur in the twelve trellis coding phases, the length of this period of time can be shortened some.

However, there is a preference that each grouping of the halved-code-rate signal in the convolutional interleaver 12 response contains 48 or a multiple of 48 successive symbols. This can be achieved most of the time by grouping the halved-code-rate signal in the time-division multiplexer 5 response so it occurs in bands of twelve contiguous data segments.

Since the $X_2$ bits are randomized, the $Z_2$ bits supplied from the precoder 13 are also randomized. The randomized nature of the $Z_2$ bits, all four types of $Z_1$, $Z_0$ pairs occurring in substantially the same number over a period of time, and the independence of the $Z_2$ and $Z_1$ bits cause the eight 8VSB symbols to occur substantially as often as each other in the robust modulation. Accordingly, the ratio of peak power to average power in the robust modulation generated in response to the particular construction 110 of the $X_1$ bits generator 11 is substantially the same as in normal 8VSB modulation.

FIG. 3 shows a detector 114 of the start of the data field connected to supply the symbol counter 112 with a reset pulse at the beginning of each data field, which reset pulse resets the count to 0000000. A typical construction for the detector 114 includes a match filter for generating a pulse response to the PN511 sequence in the initial data segment of the data field DFS. The typical construction for the detector 114 further includes a clocked digital delay line for delaying that pulse response to provide the reset pulse to the symbol counter 112 to reset it to the 0000000 count at the beginning of the actual data field, exclusive of synchronizing signals.

As each of the application Ser. No. 10/733,645 and Ser. No. 10/955,212 disclosed in its "Background of Invention", a ONE can be inserted after each bit in a stream of randomized data to generate a modified stream of data. This modified stream of data causes a subsequent ⅔ trellis coding procedure to generate a first-coset restricted-symbol-alphabet signal which excludes the second-coset −7, −5, +1 and +3 symbol values of the full 8VSB alphabet. Pilot carrier energy is increased substantially in the resulting modulation, which makes synchronous demodulation easier in the DTV receiver. The gap between the least negative normalized modulation level, −5, and the least positive normalized modulation level, +1, is 6 in this restricted-alphabet signal. This gap is three times the gap of 2 between adjacent modulation levels in an 8VSB signal, permitting TOV to be achieved at significantly poorer SNR under AWGN conditions than is the case with 8VSB. Better SNR under AWGN conditions is required to achieve TOV than is the case with P-2VSB. This first-coset restricted-symbol-alphabet signal has substantially less average power than a P-2VSB signal, but somewhat higher average power than normal 8VSB signal.

As each of the application Ser. No. 10/733,645 and Ser. No. 10/955,212 further disclosed in its "Background of Invention", by way of counterexample, a ZERO can be inserted after each bit in a stream of randomized data to generate a modified stream of data. This modified stream of data will cause a subsequent ⅔ trellis coding procedure to generate a second-coset restricted-symbol-alphabet signal which excludes the first-coset −3, −1, +5 and +7 symbol values of the full 8VSB alphabet. The gap between the least negative normalized modulation level, −5, and the least positive normalized modulation level, +1, is also 6 in this second-coset restricted-alphabet signal. Better SNR under AWGN conditions is required to achieve TOV than is the case with P-2VSB. This second-coset restricted-symbol-alphabet signal has somewhat less average power than normal 8VSB signal.

As each of the application Ser. No. 10/733,645 and Ser. No. 10/955,212 pointed out in its "Background of Invention", the polarity of the pilot signal is reversed in the modulation resulting from using just the second-coset restricted symbol alphabet. This interferes with synchronous demodulation in DTV receivers, particularly legacy ones, if the entire data field consists of second-coset symbols. This observation led away from considering patterns of cosets for PCPM which patterns would contain long sequences of second-coset symbols. However, upon subsequent reflection it appears that such patterns can be advantageous. Before convolutional interleaving, a prescribed coset pattern alternating data segments of first-coset symbols with data segments of second-coset symbols has substantially the same average power as ordinary 8VSB signal. Subsequent convolutional interleaving alternates every byte interval the effects of pilot offset in the first-coset restricted-symbol-alphabet signal and in the second-coset restricted-symbol-alphabet signal. This shifts the effects of pilot offset up in frequency to byte rate, so the effects of pilot offset do not appreciably affect automatic frequency and phase control (AFPC) signals developed from synchronous demodulation in DTV receivers.

Figure 5:
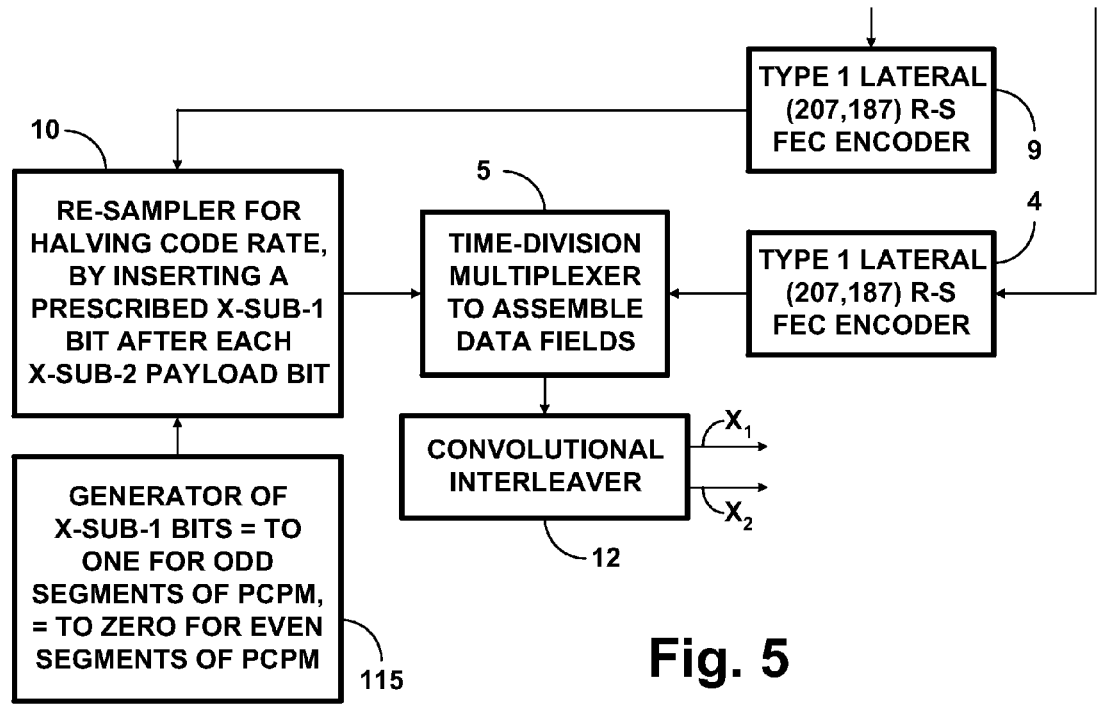
FIG. 5 is a schematic diagram showing how in a species of the DTV transmitter of FIG. 1 or FIG. 2 the $X_1$ bits generator is of a novel type in which the $X_1$ bits are all ONEs in odd data segments of PCPM signal and all ZEROes in even data segments of PCPM signal.

FIG. 5 shows the generic $X_1$ bits generator 11 for the FIG. 1 DTV transmitter or for the FIG. 2 DTV transmitter more specifically as being an $X_1$ bits generator 115 that conditions the re-sampler 10 to function as another particular kind of code-rate-reduction encoder. The $X_1$ bits generator 115 is of the following type. The $X_1$ bits generator 115 generates $X_1$ bits that are ONEs for "odd" data segments of PCPM and that are ZEROes for "even" data segments of PCPM. Presuming that code rate is one-half that of ordinary 8VSB, an "odd" data segment of PCPM is the earlier one of a pair of data segments, which earlier segment codes the initial half of an MPEG-2 compliant data packet. Then, an "even" data segment of PCPM is the later one of that pair of data segments, which later segment codes the final half of the MPEG-2 compliant data packet. If code rate is reduced to one-quarter that of ordinary 8VSB by coding of randomized data supplied to the R-S FEC encoder 9, the PCPM signal will be generated in groups of four data segments each. The first and third successive segments of each such group are considered to be "odd", and the second and fourth successive segments of each such group are considered to be "even".

Figure 6:
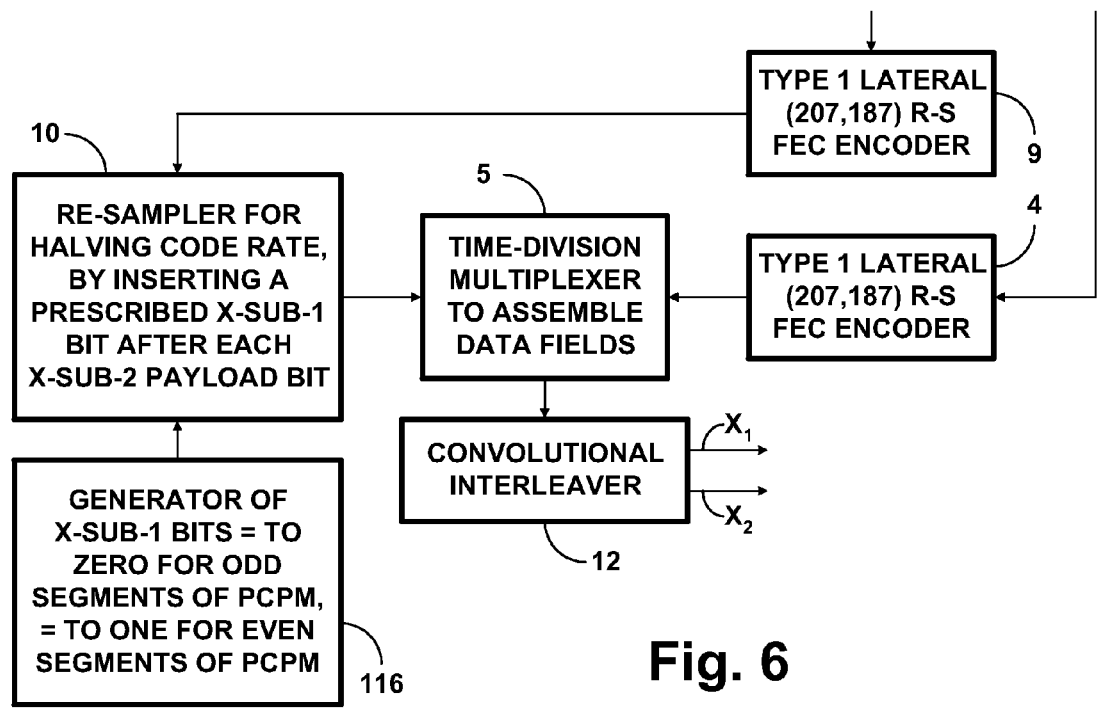
FIG. 6 is a schematic diagram showing how in a species of the DTV transmitter of FIG. 1 or FIG. 2 the $X_1$ bits generator is of a novel type in which the $X_1$ bits are all ZEROes in odd data segments of PCPM signal and all ONEs in even data segments of PCPM signal.

FIG. 6 shows the generic $X_1$ bits generator 11 for the FIG. 1 DTV transmitter or for the FIG. 2 DTV transmitter more specifically as being an $X_1$ bits generator 116 that conditions the re-sampler 10 to function as another particular kind of code-rate-reduction encoder. The $X_1$ bits generator 116 is of the following type. The $X_1$ bits generator 116 generates $X_1$ bits that are ZEROes for "odd" data segments of PCPM and that are ONEs for "even" data segments of PCPM. Suppose that one of the forms of PCPM described in connection with FIG. 5 and with FIG. 6 is adopted as a standard PCPM signal transmission. This will facilitate DTV receivers being able to determine from the transmission itself which portions of an MPEG-2 compliant data packet are encoded in each data segment thereof.

Figure 7:
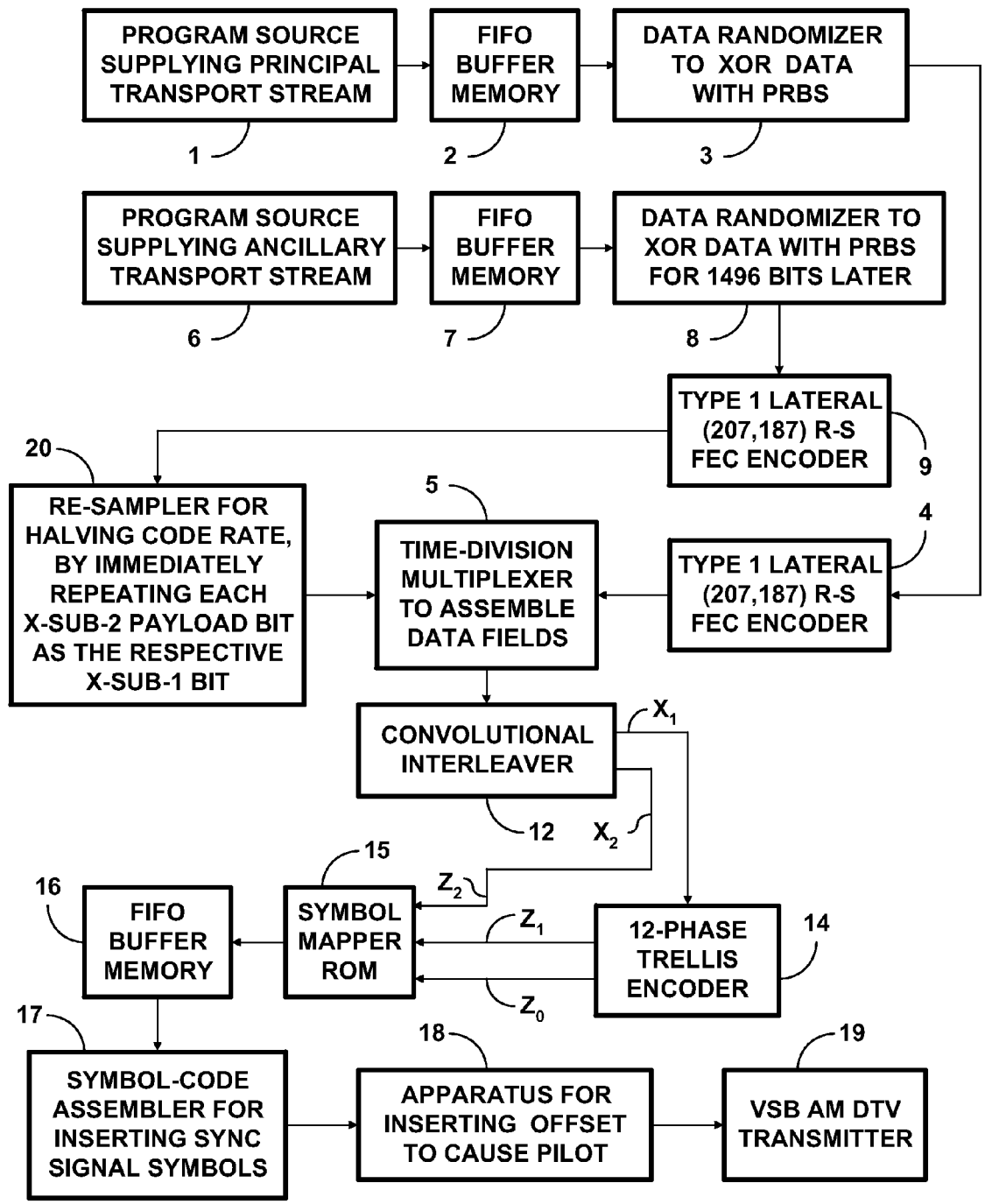
FIG. 7 is a schematic diagram of a DTV transmitter constructed in accordance with an aspect of the invention to provide for the transmission of pseudo-2VSB signals in time-division multiplex with ordinary 8VSB signals.

The FIG. 7 DTV transmitter modifies the FIG. 2 DTV transmitter to provide for the transmission of 8VSB and pseudo-2VSB signals in time-division multiplex. In the FIG. 7 DTV transmitter a re-sampler 20 replaces the re-sampler 10 and the $X_1$ bits generator 11 of the FIG. 2 DTV transmitter. The re-sampler 20 halves the code rate of its response by repeating each of the $X_2$ bits it receives from the lateral (207, 187) R-S FEC encoder 9 as a respective $X_1$ bit inserted immediately thereafter. The precoder 13 is not used, so the $X_2$ output bits supplied from the convolutional interleaver 12 are applied directly to the symbol mapper ROM 15 as the $Z_2$ input bits of a partial read address. The $X_1$ output bits supplied from the convolutional interleaver 12 and applied as $Y_1$ input bits to the 12-phase ⅔ trellis encoder 14 are relayed without changes to the symbol mapper ROM 15 as the $Z_1$ input bits of a partial read address. So, the $Z_1$ input bits of the ROM partial read address are the same as the $Z_2$ input bits they are concurrent with. This constrains the 8VSB symbol alphabet to the normalized modulation levels of −7, −5, +5 and +7 that characterize P-2VSB modulation.

Figure 8:
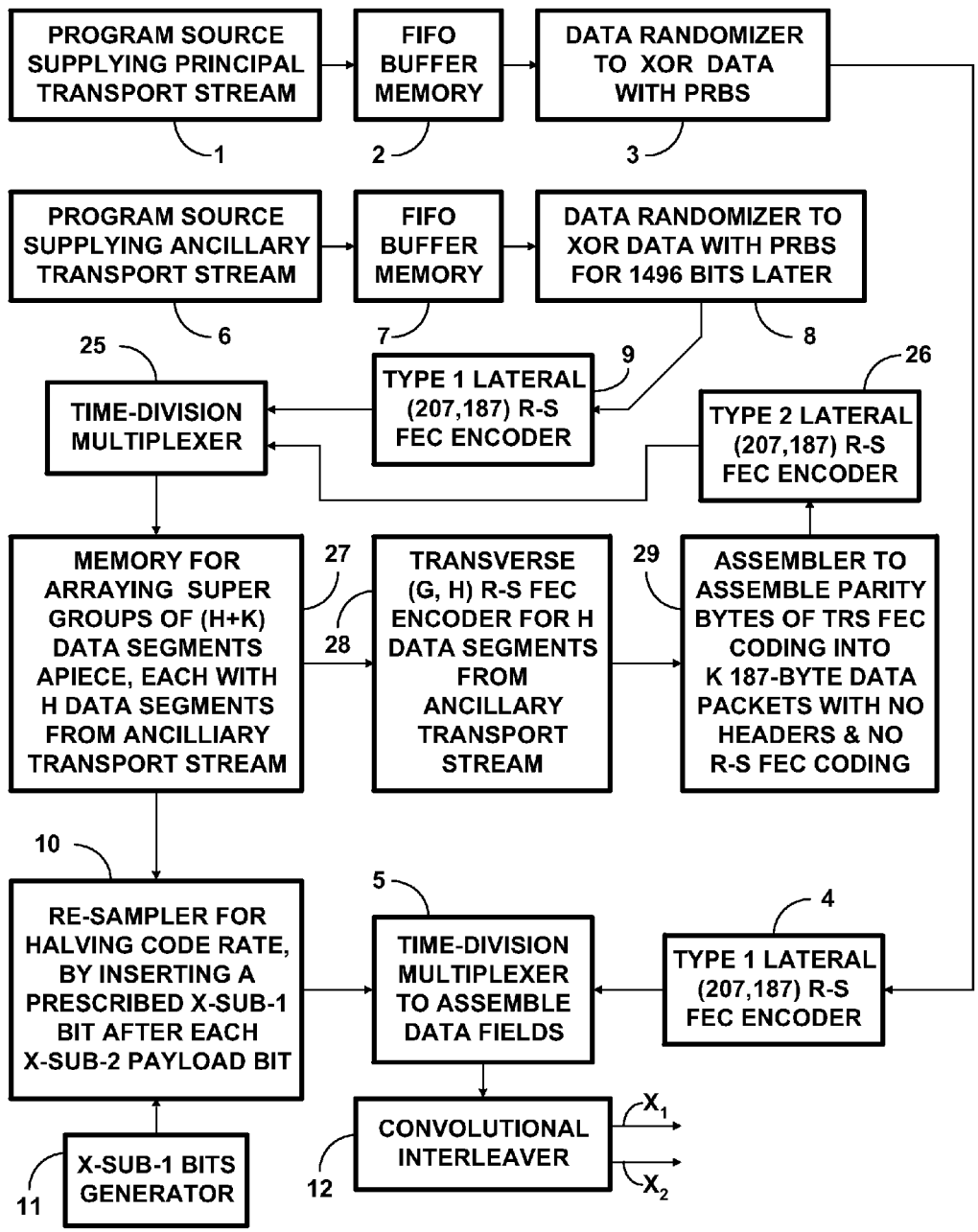
FIG. 8 is a schematic diagram of a modification of a DTV transmitter as shown in FIG. 1 or FIG. 2, which modification in accordance with an aspect of the invention provides transverse Reed-Solomon forward-error-correction coding to data for an ancillary service transmitted using a restricted alphabet of 8VSB symbols.

FIG. 8 shows a modification of the FIG. 1 DTV transmitter or the FIG. 2 DTV transmitter, in which modification the data packets in the ancillary transport stream are provided transverse Reed-Solomon forward-error-correction coding. This transverse R-S FEC coding combines with lateral (207, 187) R-S FEC coding to provide a form of two-dimensional forward-error-correction (FEC) coding of a sort generally described by the inventor, A. L. R. Limberg, in U.S. Pat. No. 7,197,685 issued 27 Mar. 2007 and titled "ROBUST SIGNAL TRANSMISSIONS IN DIGITAL TELEVISION BROADCASTING". A time-division multiplexer 25 has a first input port connected for receiving 207-byte data segments from the lateral (207, 187) R-S FEC encoder 9 of a first type. The time-division multiplexer 25 has a second input port connected for receiving 207-byte data segments from a lateral (207, 187) R-S FEC encoder 26 of a second type. The time-division multiplexer 25 has an output port at which 207-byte data segments from the R-S FEC encoders 9 and 26 are reproduced, connected for supplying these data segments to a random-access memory 27 for being written to one of two banks therein. The RAM 27 stores one 8-bit byte of code plus any byte extensions at each of its addressed storage locations.

The RAM 27 has enough addressed storage locations to store at least two successive supergroups of (H+K)207-byte data segments apiece.

After H successive ancillary-service data segments have been written into a bank of the RAM 27, read addressing is applied to this bank. This read addressing scans these H successive data segments in transverse direction to read H-byte transverse data packets to a transverse (G, H) Reed-Solomon forward-error-correction encoder 28. A data assembler 29 assembles the parity bytes generated by the transverse R-S FEC encoder 28 into K 187-byte packets with no headers. The data assembler 29 supplies each of these K packets to the lateral (207, 187) R-S FEC encoder 26 of second type to generate a respective one of K 207-byte data segments. The time-division multiplexer 25 reproduces these K data segments for being written into a bank of the RAM 27 to complete the supergroup that is temporarily stored therein. The (H+K) data segments in this completed supergroup are then read seriatim from that bank of the RAM 27 to the re-sampler 10 at appropriate intervals.

Preferably, the K data segments containing parity bytes from transverse R-S FEC coding are read from the RAM 27 before the H data segments containing the payload data selected for robust transmission. This procedure enables (or helps) a DTV receiver of new design to determine when the earliest of a supergroup of (H+K) data segments is received. This is important because the supergroups of (H+K) data segments are formed from selected ones of successive data segments, which selected data segments are scattered through one or more data fields. The supergroups of (H+K) data segments need not have defined boundaries respective to data fields as defined in A/53. A DTV receiver of new design can determine that lateral (207, 187) R-S FEC coding of second type is used in each of the K segments that contain parity bytes from transverse R-S FEC coding with correctable byte errors. A DTV receiver of new design can also determine the type of lateral (207, 187) R-S FEC coding used in ones of these K segments that contain parity bytes from transverse R-S FEC coding with no greater a number of byte errors than twice the number of correctable byte errors. A determination that lateral (207, 187) R-S FEC coding of second type is used in a data segment conditions the DTV receiver to temporarily store the data segment in a bank of memory for a supergroup of (H+K) data segments. The DTV receiver is further conditioned to select subsequent data segments of the same supergroup also to be temporarily stored in that bank of memory. The DTV receiver then proceeds to perform transverse R-S FEC decoding of the supergroup of (H+K) data segments. The type of lateral (207, 187) R-S FEC coding used in the K data segments containing parity bytes from transverse R-S FEC coding can specify the type of H data segments that should be selected for temporary storage in the supergroup of (H+K) data segments. These H data segments are identified by the PIDs in their headers, and the continuity counts in the headers can be used for determining when the supergroup of (H+K) data segments temporarily stored in a bank of memory is completed.

An (207, 187) R-S code is a shortened 255-byte (255, 235) R-S code, the 48 initial bytes of which are "virtual" bytes that are not transmitted. In the prior art, these virtual bytes are all null bytes. That is, when generating the parity bytes at the transmitter, all bits of each of these virtual bytes of a shortened R-S codeword are presumed to be ZEROes. When the receiver performs error location and correction on the shortened R-S codeword, all bits in each virtual byte are presumed to be ZEROes in the syndrome computations. If the R-S FEC coding of selected segments at the transmitter is done with other virtual bytes, the parity bytes can be made to differ from what they would be with R-S FEC coding with all virtual bytes being null bytes. The R-S FEC coding used by the lateral (207, 187) R-S FEC encoder 26 of second type is shortened differently than the R-S FEC coding used by the lateral (207, 187) R-S FEC encoder 9 of first type. The first type of (207, 187) R-S FEC coding is that implicitly specified in A/53 and is presumably shortened from a (255, 235) R-S FEC code using forty-eight virtual bytes that are all 0000 0000. Other types of (207, 187) R-S FEC coding can be generated by modifying at least ten selected bytes of its R-S FEC coding in a prescribed way, such as one's complementing each bit in the selected bytes. Alternatively, other types of (207, 187) R-S FEC coding can be generated using different sets of virtual bytes that are not all 0000 0000.

The FIG. 8 DTV transmitter can be modified to provide for the transmission of 8VSB and pseudo-2VSB signals in time-division multiplex. The lateral (207, 187) R-S FEC encoder 26 of second type is replaced by a lateral (207, 187) R-S FEC encoder of a third type, which identifies those data segments used for pseudo-2VSB transmission. The re-sampler 10 and the $X_1$ bits generator 11 of the FIG. 8 DTV transmitter are replaced by the re-sampler 20 of FIG. 6. The re-sampler 20 halves code rate in the data stream it supplies to the time-division multiplier 5 used to assemble data fields.

Figure 9:
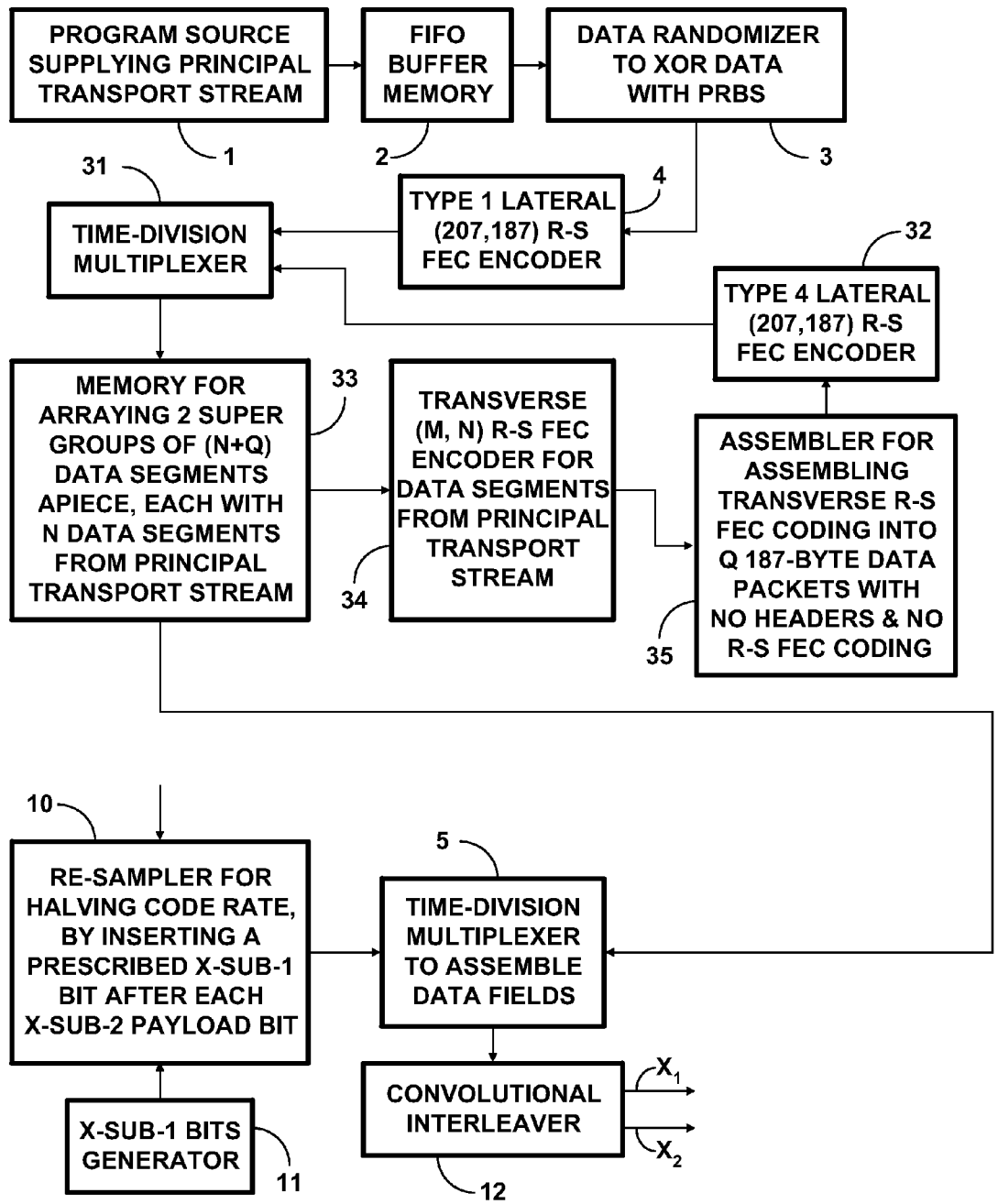
FIG. 9 is a schematic diagram of another modification of a DTV transmitter as shown in FIG. 1 or FIG. 2, which modification provides transverse Reed-Solomon forward-error-correction coding to data transmitted using the full alphabet of 8VSB symbols.

FIG. 9 shows another modification that can be made to either the FIG. 1 DTV transmitter or the FIG. 2 DTV transmitter, which modification provides transverse R-S FEC coding to data transmitted using the full alphabet of 8VSB symbols. This transverse R-S FEC coding combines with lateral (207, 187) R-S FEC coding to provide a form of two-dimensional FEC coding. A time-division multiplexer 31 has a first input port connected for receiving 207-byte data segments from the lateral (207, 187) R-S FEC encoder 4 of first type. The time-division multiplexer 31 has a second input port connected for receiving 207-byte data segments from a lateral (207, 187) R-S FEC encoder 32 of a fourth type. The time-division multiplexer 31 has an output port at which 207-byte data segments from the R-S FEC encoders 4 and 32 are reproduced. This output port is connected for supplying these data segments to a random-access memory 33 for being written to one of two banks therein. The RAM 33 stores one 8-bit byte of code plus any byte extensions at each of its addressed storage locations. The RAM 33 has enough addressed storage locations to store at least two successive supergroups of (N+Q) 207-byte data segments apiece. (N+Q) is presumed to be 156 or a multiple thereof, which simplifies keeping track of the phasing of data randomization in the DTV transmitter and in DTV receivers.

After N successive data segments have been written into a bank of the RAM 33, read addressing is applied to this bank This read addressing scans these N successive data segments in transverse direction to read H-byte transverse data packets to a transverse (M, N) Reed-Solomon forward-error-correction encoder 34. A data assembler 35 assembles the parity bytes generated by the transverse R-S FEC encoder 34 into Q 187-byte data packets with no headers. The data assembler 35 supplies each of these Q packets to the lateral (207, 187) R-S FEC encoder 32 of fourth type to generate a respective one of Q 207-byte data segments. The time-division multiplexer 31 reproduces these Q data segments for being written into a bank of the RAM 33 to complete the supergroup that is temporarily stored therein. The (N+Q) 207-byte data segments in this completed supergroup are then read seriatim from that bank of the RAM 33 to the first input port of the time-division multiplexer 5 at appropriate intervals. The second input port of the time-division multiplexer 5 is connected to receive 207-byte data segments from the re-sampler 10.

Generally, it is preferable that the Q data segments containing parity bytes from transverse R-S FEC coding are read from the RAM 33 after the N data segments containing the payload data selected for transverse R-S FEC coding. In many instances the transversal R-S FEC coding over supergroups of (N+Q) data segments involves more transverse paths than there are bytes in a packet assembled by the data assembler 35, so there is a progressive skew in the transverse paths as they traverse the correction field. If transversal R-S FEC coding is done on the parity bytes of the lateral (207, 187) R-S FEC coding of data segments in the information field, for example, there will be 207 transverse paths. Each successive set of 207 parity bytes will occupy more than the 187 bytes available in each data packet assembled by the data assembler 35, and so will have to be assembled within two consecutive data packets. The distance between bytes in the same transverse path is lengthened when crossing from the information field into the correction field if the Q data segments containing transverse R-S FEC coding are read from the RAM 33 after the N data segments containing the payload data. If the Q data segments containing transverse R-S FEC coding are read from the RAM 33 before the N data segments containing the payload data, the distance between bytes in the same transverse path is shortened when crossing from the information field into the correction field. This impairs the capability to withstand certain burst errors. Since all data segments except those containing DFS are contained in successive (N+Q) supergroups, a DTV receiver of new design temporarily stores all data segments in memory for possible transverse R-S FEC decoding. This is automatic. The DTV receiver of new design does not need to be prompted to this action responsive to information identifying the type of transverse R-S FEC coding included in the Q segments containing parity bytes from transverse R-S FEC code. So, there is no need to position these Q segments at the beginning of the supergroup.

The FIG. 9 DTV transmitter can be modified to provide for the transmission of 8VSB and pseudo-2VSB signals in time-division multiplex. In the modified FIG. 9 DTV transmitter the re-sampler 20 of FIG. 7 replaces the re-sampler 10 and the $X_1$ bits generator 11.

Figure 10:
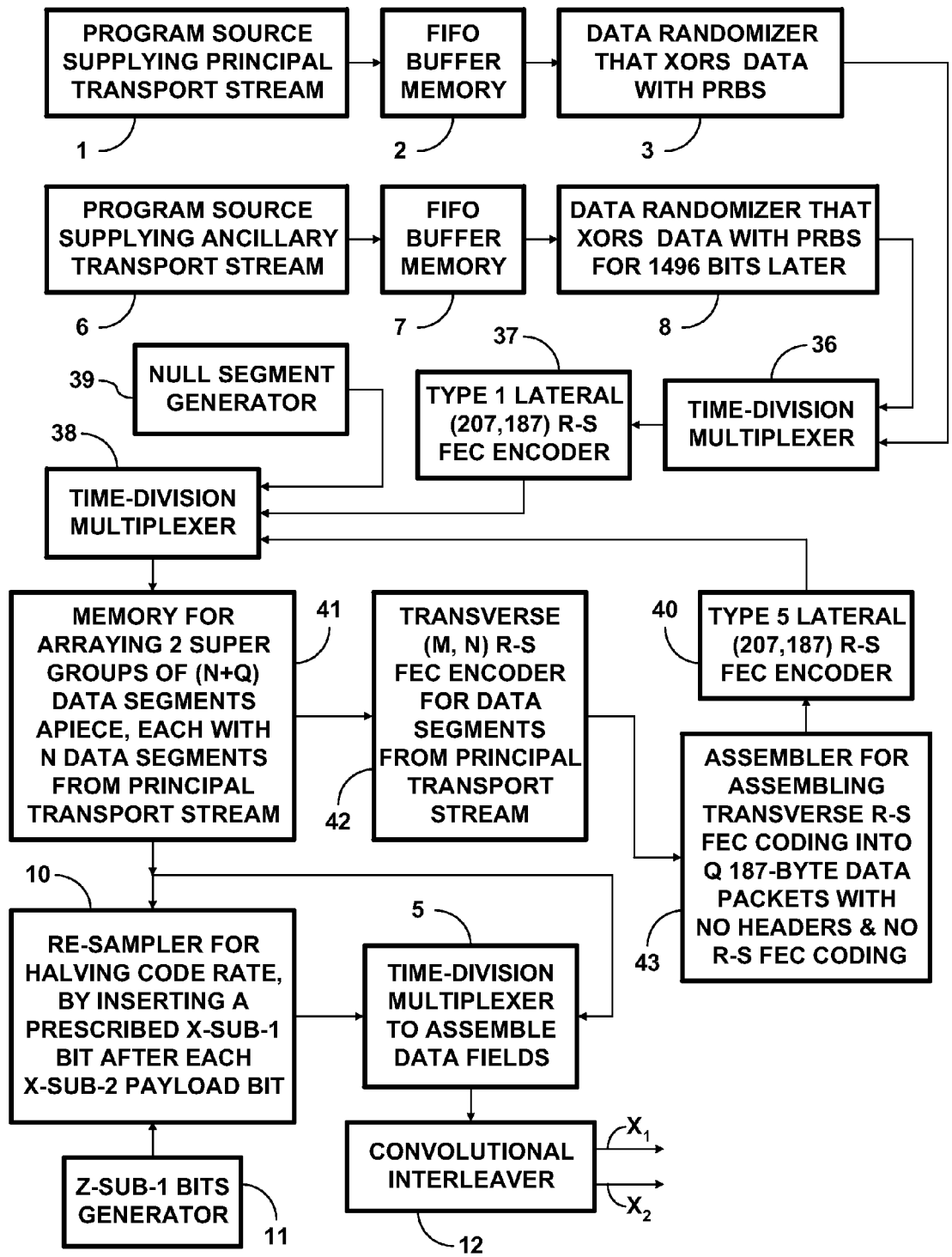
FIG. 10 is a schematic diagram of an alternative modification of the DTV transmitter as shown in FIG. 1 or FIG. 2, which modification provides transverse R-S FEC coding both to data subsequently transmitted using the full alphabet of 8VSB symbols and to data subsequently transmitted using a restricted alphabet of 8VSB symbols.

FIG. 10 shows a further modification of either the FIG. 1 DTV transmitter or the FIG. 2 DTV transmitter, which modification provides transverse R-S FEC coding to data subsequently transmitted using a restricted alphabet of 8VSB symbols as well as to data subsequently transmitted using the full alphabet of 8VSB symbols. This transverse R-S FEC coding combines with lateral (207, 187) R-S FEC coding to provide a form of two-dimensional FEC coding. The program source 1 of a principal transport stream is connected for writing data packets to the FIFO buffer memory 2 for temporary storage therein. The data randomizer 3 is connected for receiving data packets read from the FIFO buffer memory 2 and randomizing the bits in those data packets. The program source 6 of an ancillary transport stream is connected for writing data packets to the FIFO buffer memory 7 for temporary storage therein. The data randomizer 8 is connected for receiving data packets read from the FIFO buffer memory 7 and randomizing the bits in those data packets. A first input port of a time-division multiplexer 36 is connected to receive randomized data packets from the data randomizer 3, and the second input port of the multiplexer 36 is connected to receive randomized data packets from the data randomizer 8. The multiplexer 36 reproduces these 187-byte randomized data packets in a time-division multiplexed response supplied from the output port of the multiplexer 36 to the input port of a lateral (207, 187) R-S FEC encoder 37 of the first type. The lateral (207, 187) R-S FEC encoder 37 converts these randomized 187-byte data packets to respective 207-byte segments of lateral (207, 187) Reed-Solomon forward-error-correction coding that appends the respective twenty parity bytes of the coding of each randomized 187-byte data packet after the conclusion thereof. This complies with the practice specified in A/53, Annex D, §§4.2.3 titled "Reed-Solomon encoder.

A first input port of a time-division multiplexer 38 is connected to receive the 207-byte segments of lateral (207, 187) R-S FEC coding generated by the lateral (207, 187) R-S FEC encoder 37. A second input port of the time-division multiplexer 38 is connected to receive 207-byte segments of nulls generated by a null segment generator 39. The null segment generator 39 continuously generates 207-byte segments of null bytes. The time-division multiplexer 38 is operated so that one of these segments of null bytes is reproduced in its response immediately before each 207-byte segment supplied from the lateral (207, 187) R-S FEC encoder 37 is reproduced. A third input port of the time-division multiplexer 38 is connected to receive 207-byte segments of lateral (207, 187) R-S FEC coding generated by a lateral (207, 187) R-S FEC encoder 40 of fifth type.

A random-access memory 41 is connected to an output port of the time-division multiplexer 38, which supplies 207-byte data segments for being written to one of two banks of memory in the RAM 41. The RAM 41 stores one 8-bit byte of code plus any byte extensions at each of its addressed storage locations. The RAM 41 has enough addressed storage locations to store at least two successive supergroups of (N+Q) 207-byte data segments apiece.

After N successive data segments have been written into a bank of the RAM 41, read addressing is applied to this bank. This read addressing scans these N successive data segments in transverse direction to read H-byte transverse data packets to a transverse (M, N) Reed-Solomon forward-error-correction encoder 42. A data assembler 43 assembles the parity bytes generated by the transverse R-S FEC encoder 42 into Q 187-byte data packets with no headers. The data assembler 43 supplies each of these Q packets to the lateral (207, 187) R-S FEC encoder 40 of fifth type to generate a respective one of Q 207-byte data segments. The time-division multiplexer 38 reproduces these Q data segments for being written into a bank of the RAM 41 to complete the supergroup that is temporarily stored therein.

After transverse R-S FEC coding is completed, the (N+Q) data segments in each completed supergroup are read in prescribed order from the RAM 34 to the re-sampler 10, as well as to the first input port of the time-division multiplexer 5. This prescribed order of reading is generally serial in character, but reverses the order in which a null data segment and the immediately succeeding data segment in the supergroup are read from the RAM 34 as a pair of successive data segments. The immediately succeeding data segment is read from the RAM 34 one data segment interval early, so the pair of data segments generated by the re-sampler 10 is timed so as to be able to replace the pair of successive data segments read from the RAM 34. The time-division multiplexer 5 assembles data fields by time-division multiplexing pairs of data segments received from the re-sampler 10 with selected ones of the data segments read from the RAM 34.

The FIG. 10 DTV transmitter can be modified to provide for the transmission of 8VSB and pseudo-2VSB signals in time-division multiplex. In the modified FIG. 10 DTV transmitter the re-sampler 20 of FIG. 7 replaces the re-sampler 10 and the $X_1$ bits generator 11.

A concern in the development of methods for providing DTV transmissions more robust than ordinary 8VSB transmissions has been the effects on so-called "legacy" DTV receiving apparatus already in the field. One of the requirements of the more robust signals has been that they not disrupt the operation of the 12-phase ⅔ trellis decoders in legacy DTV receivers. Another concern has been whether legacy DTV receivers will mistake a 207-byte segment of de-interleaved data associated with robust transmission for a 207-byte segment of de-interleaved data associated with ordinary 8VSB transmission. There are several hurdles to such a mistake being made by a legacy DTV receiver. Firstly, the Transport Error Indicator bit at the beginning of the 207-byte segment must not be a ONE. Secondly, the 207-byte segment of de-interleaved data must appear to the R-S FEC decoding apparatus in the legacy DTV receiver to contain no more than ten erroneous bytes. Otherwise, that apparatus will cause the Transport Error Indicator (TEI) bit of the recovered data packet to be a ONE. The TEI bit of a packet being a ONE causes the packet decoders to reject the packet as containing uncorrected byte error. The TEI bit of the initial data segment used for the robust transmission of a data packet is always transmitted as a ONE, so a legacy DTV receiver should not mistake that data segment for one associated with ordinary 8VSB transmission. The TEI bit of each further data segment used for the robust transmission of the data packet is equally likely to be a ONE as a ZERO, so there should be no more than a 50% chance that a legacy DTV receiver will mistake that data segment for one associated with ordinary 8VSB transmission. Thirdly, the $4^{th}$ through $16^{th}$ bits of the 207-byte segment of de-interleaved data must appear to be a recognizable packet identifier (PID), or the transport stream de-multiplexer will not forward the data packet to any packet decoder, such as an MPEG-2 decoder or an AC-3 decoder. Fourthly, the $21^{st}$ through $24^{th}$ bits of the 207-byte segment of de-interleaved data must appear to be a valid continuity count if there be a recognized PID, or the data packet will not be utilized by the packet decoder to which it is forwarded by the transport stream de-multiplexer. So, the likelihood of a properly designed legacy DTV receiver mistaking a data segment used for robust transmission for one associated with ordinary 8VSB transmission is rather small. If a legacy DTV receiver is likely to mistake a particular data segment used for robust transmission for one associated with ordinary 8VSB transmission, that particular data segment can be modified in a prescribed way. The modification is such that the R-S FEC decoding apparatus in a legacy DTV receiver will find the data segment to contain uncorrectable byte errors. A DTV receiver designed to utilize robust signal transmissions can decode segments of robust signal presuming both that each particular data segment is so modified and is not so modified, selecting the valid one of the alternative decoding results.

FIG. 11 lists the steps in a routine that can be carried out in connection with a DTV transmitter as shown in FIG. 1 or FIG. 2. This routine validates that the operation of legacy receivers will not be disrupted by the insertion of restricted-alphabet data segments into the time-division multiplex (TDM) signal that defines a data field before subsequent convolutional interleaving and trellis coding. A segment slot counter that counts segment slots from one to 312 in a data field and then rolls over back to one is used in the routine. The count therefrom is reset to a number indicative of the segment slot in the data field it is proposed to fill with the final data segment descriptive of a data packet of symbol codes selected from a restricted alphabet. The data packet is randomized with the portion of the PRBS associated with that segment slot, thereby modeling the projected operation of the data randomizer 8. The randomized data packet is then (207, 187) R-S FEC coded, thereby modeling the projected operation of the lateral (207, 187) R-S FEC encoder 9. The resulting 207-byte data segment is called a "seed" data segment because it grows into a pair of data segments when subsequently re-sampled to halve its code rate in accordance with a particular type of alphabet restrictions, modeling the projected operation of the re-sampler 10.

The initial data segment in the pair is subjected to (207, 187) R-S FEC decoding to recover a data packet therefrom, thereby modeling projected operation of the lateral (207, 187) R-S FEC decoder in a legacy DTV receiver. If this data packet has a valid PID and its TEI bit indicates no uncorrected byte error remaining therein, the transport stream de-multiplexer of a legacy DTV receivers would fail to discard the data packet. So, insertion of the pair of data segments in the proposed segment slots of the data field is unacceptable. Accordingly, the FIG. 11 routine is begun again after incrementing the count supplied from the segment slot counter.

However, if the data packet recovered from the (207, 187) R-S FEC decoding of the initial data segment of the pair has an invalid PID or its TEI bit indicates uncorrected byte error remaining therein, the FIG. 11 routine continues. The initial data segment in the pair is subjected to (207, 187) R-S FEC decoding to recover a data packet therefrom, thereby modeling projected operation of the lateral (207, 187) R-S FEC decoder in a legacy DTV receiver. If this data packet has a valid PID and its TEI bit indicates no uncorrected byte error remaining therein, the transport stream de-multiplexer of a legacy DTV receivers would fail to discard the data packet. So, insertion of the pair of data segments in the proposed segment slots of the data field is unacceptable. Accordingly, the FIG. 11 routine is begun again after incrementing the count from the segment slot counter. However, if the data packet recovered from the (207, 187) R-S FEC decoding of the initial data segment of the pair has an invalid PID or its TEI bit indicates uncorrected byte error remaining therein, insertion of the pair of data segments in the proposed segment slots of the data field is acceptable.

The FIG. 11 routine will usually be carried out in software. Indeed, although FIGS. 1, 2, 5, 6, 7, 8, 9 and 10 show hardware for performing operations to generate modulating signal for the VSB AM DTV transmitter 19, in many DTV transmitters constructed in accordance with the invention these operations will be implemented in software.

FIG. 12 lists the steps in a routine that can be carried out in connection with the FIG. 7 DTV transmitter. This routine validates that the operation of legacy receivers will not be disrupted by the insertion of pseudo-2VSB data segments into the time-division multiplex (TDM) signal that defines a data field before subsequent convolutional interleaving and trellis coding. The steps are similar to those listed in the FIG. 11 routine, except that the re-sampling steps halve code rate by immediately repeating each bit of the seed data segment, modeling the projected operation of the re-sampler 24.

The FIG. 11 routine is also applicable to modified FIG. 1 and FIG. 2 DTV transmitters that are modified per FIG. 8. FIG. 13 lists the steps in a subsequent routine for validating that the operation of legacy receivers will not be disrupted by the insertion of restricted-alphabet segments of parity bytes for transverse R-S FEC coding into TDM signal that defines a data field before subsequent convolutional interleaving and trellis coding. A segment slot counter that counts segment slots from one to 312 in a data field and then rolls over back to one is also used in the FIG. 13 routine. The count therefrom is reset to a number indicative of the segment slot in the data field it is proposed to fill with the final data segment descriptive of a data packet of symbol codes selected from a restricted alphabet. The data packet is R-S FEC coded using the second type of lateral (207, 187) R-S FEC coding, thereby modeling the projected operation of the lateral (207, 187) R-S FEC encoder 26 of second type. The resulting 207-byte "seed" data is re-sampled to halve its code rate in accordance with a particular type of alphabet restrictions, modeling the projected operation of the re-sampler 10.

The initial data segment in the pair is subjected to (207, 187) R-S FEC decoding of first type to recover a data packet therefrom, thereby modeling projected operation of the lateral (207, 187) R-S FEC decoder in a legacy DTV receiver. If this data packet has a valid PID and its TEI bit indicates no uncorrected byte error remaining therein, the transport stream de-multiplexer of a legacy DTV receivers would fail to discard the data packet. So, insertion of the pair of data segments in the proposed segment slots of the data field is unacceptable. Accordingly, the FIG. 13 routine is begun again after incrementing the count supplied from the segment slot counter.

However, if the data packet recovered from the (207, 187) R-S FEC decoding of the initial data segment of the pair has an invalid PID or its TEI bit indicates uncorrected byte error remaining therein, the FIG. 13 routine continues. The initial data segment of the pair is subjected to (207, 187) R-S FEC decoding of first type to recover a data packet therefrom, thereby modeling projected operation of the lateral (207, 187) R-S FEC decoder in a legacy DTV receiver. If this data packet has a valid PID and its TEI bit indicates no uncorrected byte error remaining therein, the transport stream de-multiplexer of a legacy DTV receivers would fail to discard the data packet. So, insertion of the pair of data segments in the proposed segment slots of the data field is unacceptable. Accordingly, the FIG. 13 routine is begun again after incrementing the count from the segment slot counter. However, if the data packet recovered from the (207, 187) R-S FEC decoding of the initial data segment of the pair has an invalid PID or its TEI bit indicates uncorrected byte error remaining therein, insertion of the pair of data segments in the proposed segment slots of the data field is acceptable.

The FIG. 12 routine is also applicable to the FIG. 8 DTV transmitter modified so to as to replace the re-sampler 10 with the FIG. 7 re-sampler 20 for generating P-2VSB. FIG. 14 lists the steps in a subsequent routine for validating that the operation of legacy receivers will not be disrupted by the insertion of pseudo-2VSB segments of parity bytes for transverse R-S FEC coding into TDM signal that defines a data field before subsequent convolutional interleaving and trellis coding. The steps of the FIG. 14 routine are similar to those listed in the FIG. 13 routine, with the following exceptions. The seed data segment is generated by performing lateral (207, 187) R-S FEC coding of third type, rather than second type, on the randomized data packet to be transmitted using pseudo-2VSB symbols. The re-sampling steps halve code rate by immediately repeating each bit of the seed data segment, modeling the projected operation of the re-sampler 24.

The paths involved in transverse R-S FEC coding are of concern, the nature of these paths being a variable that affects results. A/53 prescribes convolutional interleaving of transmitted DTV signals. The effects of the convolutional interleaving and de-interleaving on the transverse R-S FEC coding paths have to be considered. It is preferable that the bytes within each transverse R-S FEC code are successively transmitted at intervals no shorter than the 77.3 microsecond duration of a data segment. U.S. Pat. No. 7,197,685 describes a method for assuring this.

The DTV transmitters shown in FIGS. 15, 16, 17, 18, 19, 20, 21 and 22 use another approach to forestalling legacy DTV receivers mistaking data segments used for robust transmission for data segments associated with ordinary 8VSB transmission. In this other approach every data segment is a 207-byte lateral (207, 187) R-S FEC codeword, the final twenty bytes of which are reserved for parity purposes. The lateral (207, 187) R-S FEC coding used for PCPM data segments differs from that used for ordinary 8VSB signal, so that the R-S FEC decoding apparatus in a legacy DTV receiver will find data segments used for PCPM to contain uncorrectable byte error. The lateral (207, 187) R-S FEC coding used for P-2VSB data segments differs from that used for ordinary 8VSB signal, so that the R-S FEC decoding apparatus in a legacy DTV receiver will find data segments used for P-2VSB to contain uncorrectable byte error. The lateral (207, 187) R-S FEC coding used for data segments of TRS parity bytes differs from that used for ordinary 8VSB signal, so that the R-S FEC decoding apparatus in a legacy DTV receiver will find data segments used for TRS parity bytes to contain uncorrectable byte error. The R-S FEC decoding apparatus in a legacy DTV receiver makes the TEI bits in the 187-byte "data packets" extracted from the data segments it finds to contain uncorrectable byte error to be ONEs, conditioning the transport stream demultiplexer to withhold those "data packets" from any packet decoder. Types of (207, 187) R-S FEC coding that are orthogonal to that used for data segments of ordinary 8VSB signal can be generated using different sets of virtual bytes that are not all 0000 0000.

Figure 15:
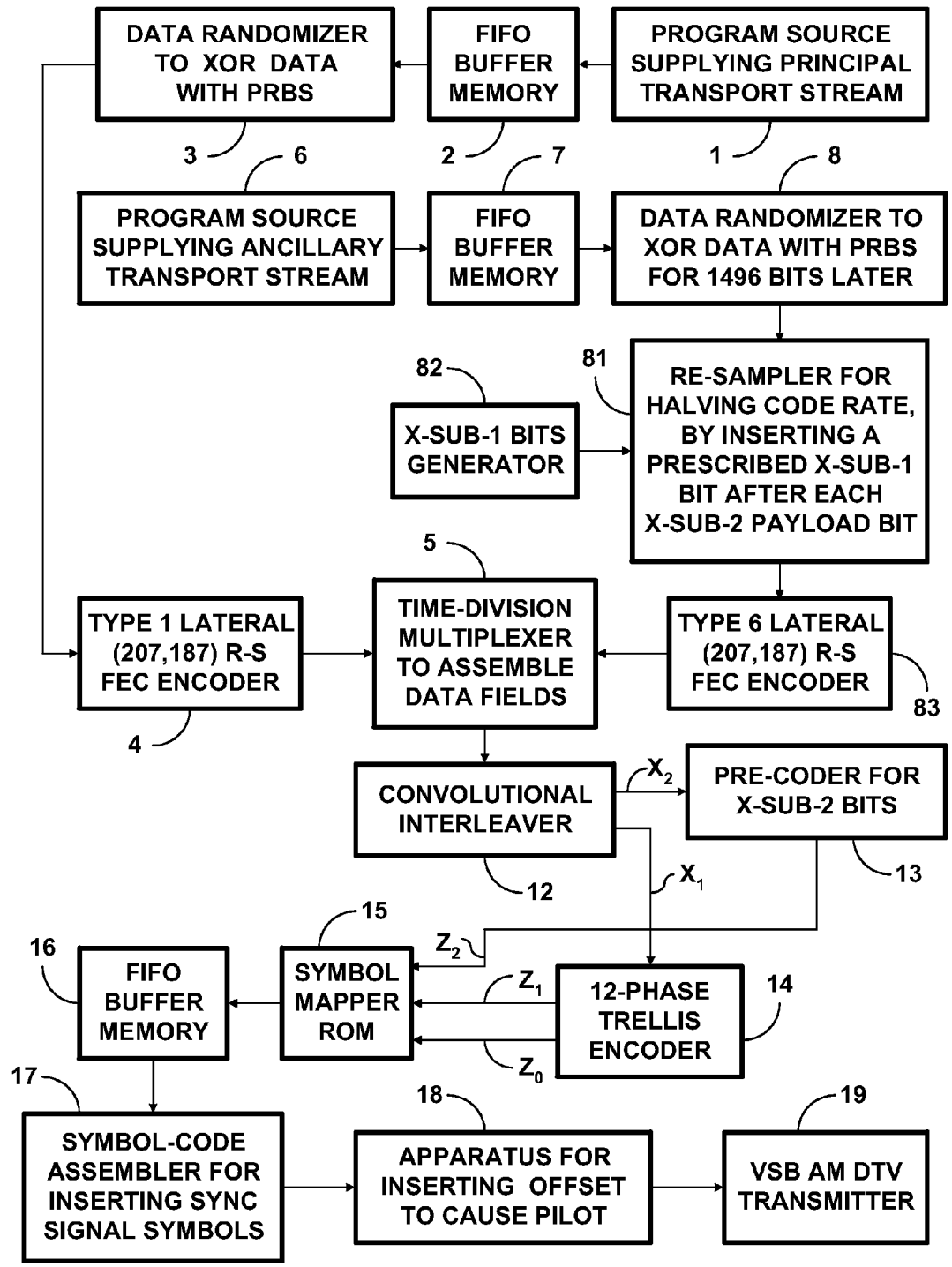
FIG. 15 is a generic schematic diagram of a DTV transmitter constructed in accordance with an aspect of the invention, which DTV transmitter provides for the transmission of ordinary 8VSB signals in time-division multiplex with more robust signals using a restricted symbol alphabet.
Figure 16:
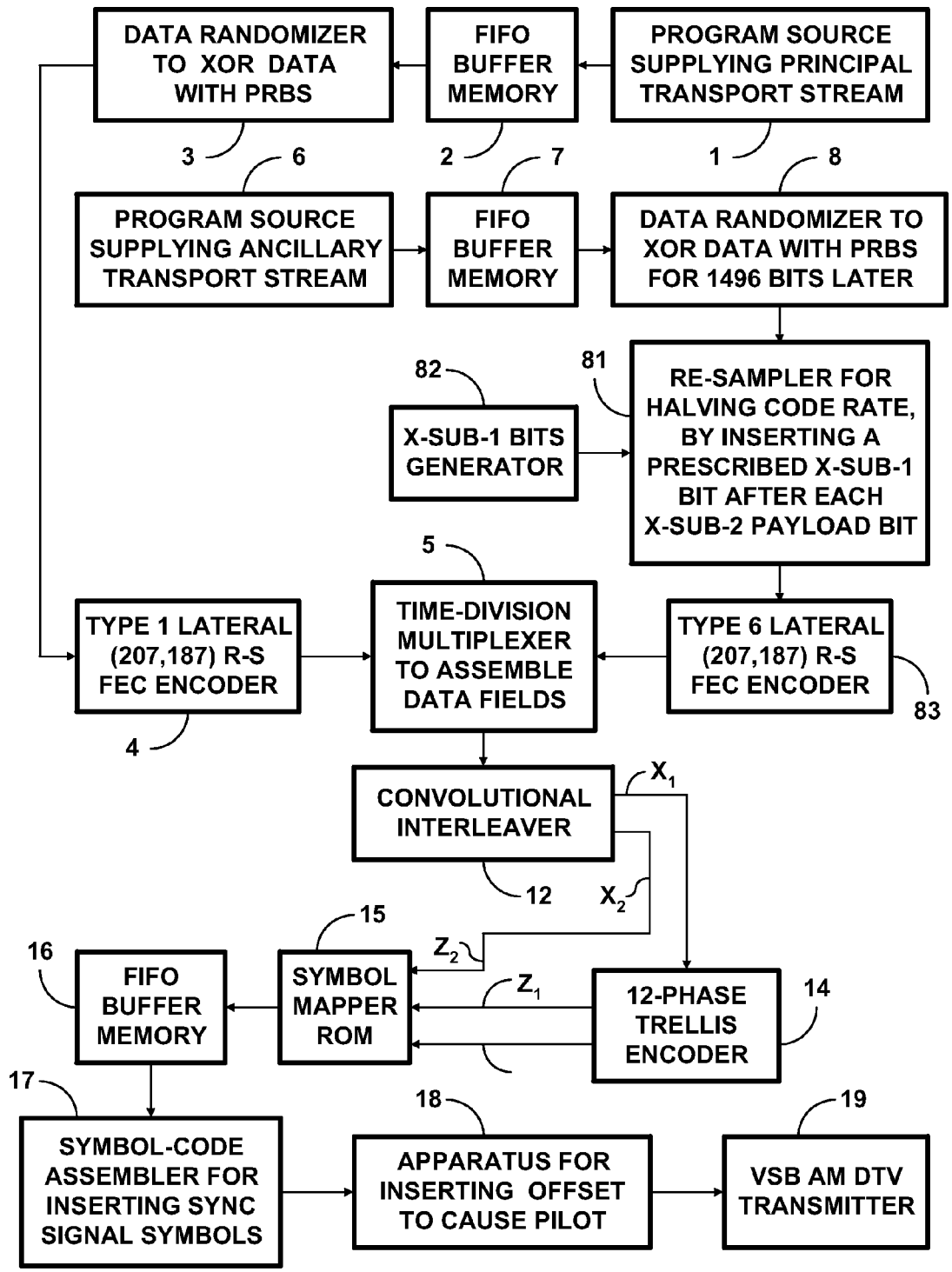
FIG. 16 is a generic schematic diagram of a DTV transmitter constructed in accordance with an aspect of the invention, which FIG. 16 DTV transmitter differs from the FIG. 15 DTV transmitter in not using a precoder for the most significant bits in 8VSB symbols.

The DTV transmitters of FIGS. 15 and 16 differ from those of FIGS. 1 and 2, respectively, in that the MPEG-2-compliant data packets are re-sampled to halved code rate before R-S FEC coding is done, rather than after R-S FEC coding is done. The DTV transmitters of FIGS. 15 and 16 dispense with the type 1 R-S FEC encoder 9, the re-sampler 10 and the $X_1$ bits generator 11 shown FIGS. 1 and 2. FIGS. 15 and 16 show a re-sampler 81 connected for inserting, after each of the $X_2$ bits it receives from the data randomizer 8, a respective $X_1$ bit received from an $X_1$ bits generator 82. The re-sampler 81 generates a respective pair of 187-byte data packets of halved code rate in response to each 187-byte randomized MPEG-2-compliant data packet that it receives from the data randomizer 8. FIGS. 15 and 16 show a lateral (207, 187) Reed-Solomon forward-error-correction encoder 83 connected for forward-error-correction encoding each 187-byte halved-code-rate data packet generated by the re-sampler 81 to generate a respective 207-byte Reed-Solomon forward-error-correction code of a sixth type. The encoder 83 appends to the concluding end of each randomized 187-byte data packet the respective twenty parity bytes of the sixth type of (207, 187) R-S FEC coding. This sixth type of (207, 187) R-S FEC coding is orthogonal to the first type of (207, 187) R-S FEC coding used by the lateral (207, 187) R-S FEC encoder 4.

Figure 17:
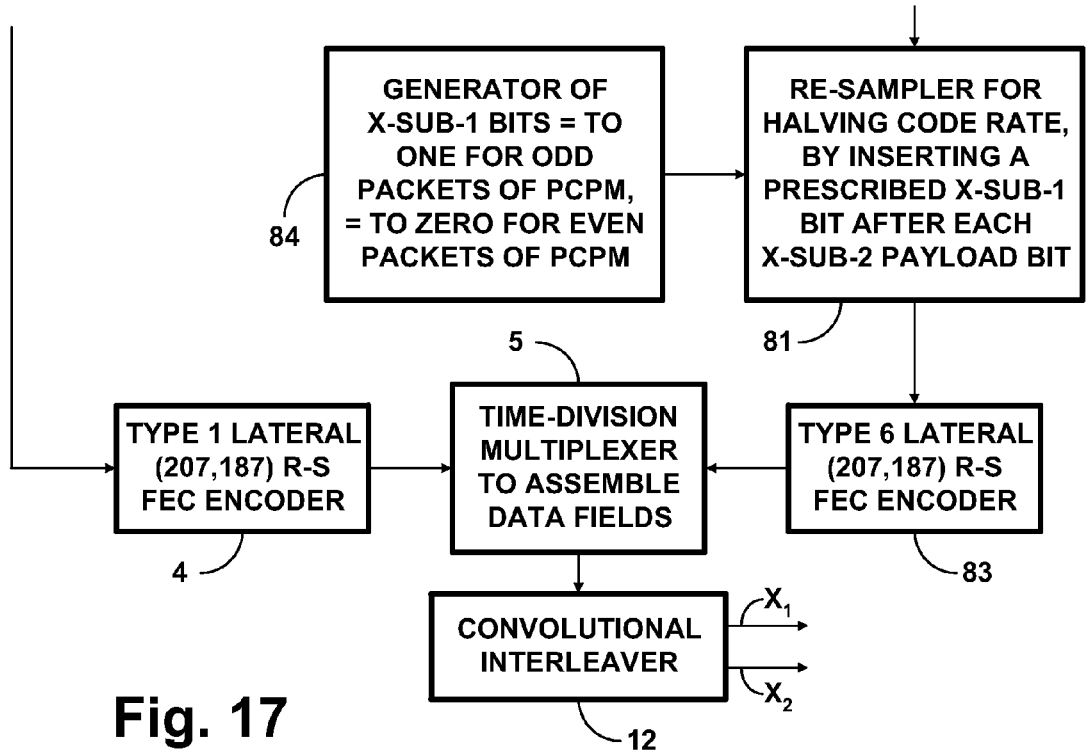
FIG. 17 is a schematic diagram showing how, in a species of the DTV transmitter of FIG. 15 or FIG. 16, the $X_1$ bits generator is of a novel type in which the $X_1$ bits are all ONEs in odd data segments of PCPM signal and all ZEROes in even data segments of PCPM signal.

FIG. 17 shows the generic $X_1$ bits generator 82 for the FIG. 15 DTV transmitter or for the FIG. 16 DTV transmitter more specifically as being an $X_1$ bits generator 84 of the following type. The $X_1$ bits generator 84 generates $X_1$ bits that are ONEs for "odd" data segments of PCPM and that are ZEROes for "even" data segments of PCPM.

Figure 18:
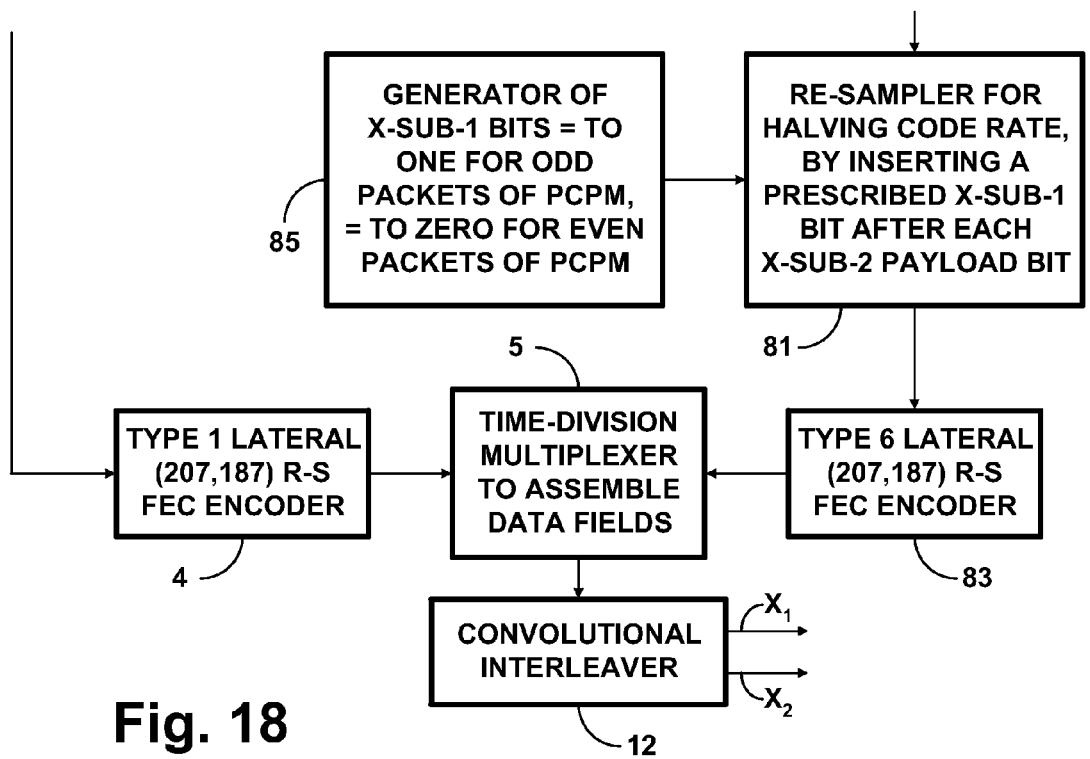
FIG. 18 is a schematic diagram showing how, in a species of the DTV transmitter of FIG. 15 or FIG. 16, the $X_1$ bits generator is of a novel type in which the $X_1$ bits are all ZEROes in odd data segments of PCPM signal and all ONEs in even data segments of PCPM signal.

FIG. 18 shows the generic $X_1$ bits generator 82 for the FIG. 15 DTV transmitter or for the FIG. 16 DTV transmitter more specifically as being an $X_1$ bits generator 85 of the following type. The $X_1$ bits generator 85 generates $X_1$ bits that are ZEROes for "odd" data segments of PCPM and that are ONEs for "even" data segments of PCPM. Suppose that one of the forms of PCPM described in connection with FIG. 17 and with FIG. 18 is adopted as a standard PCPM signal transmission. This will facilitate DTV receivers being able to determine from the transmission itself what portions of an MPEG-2 compliant data packet are encoded in each data segment thereof.

Figure 19:
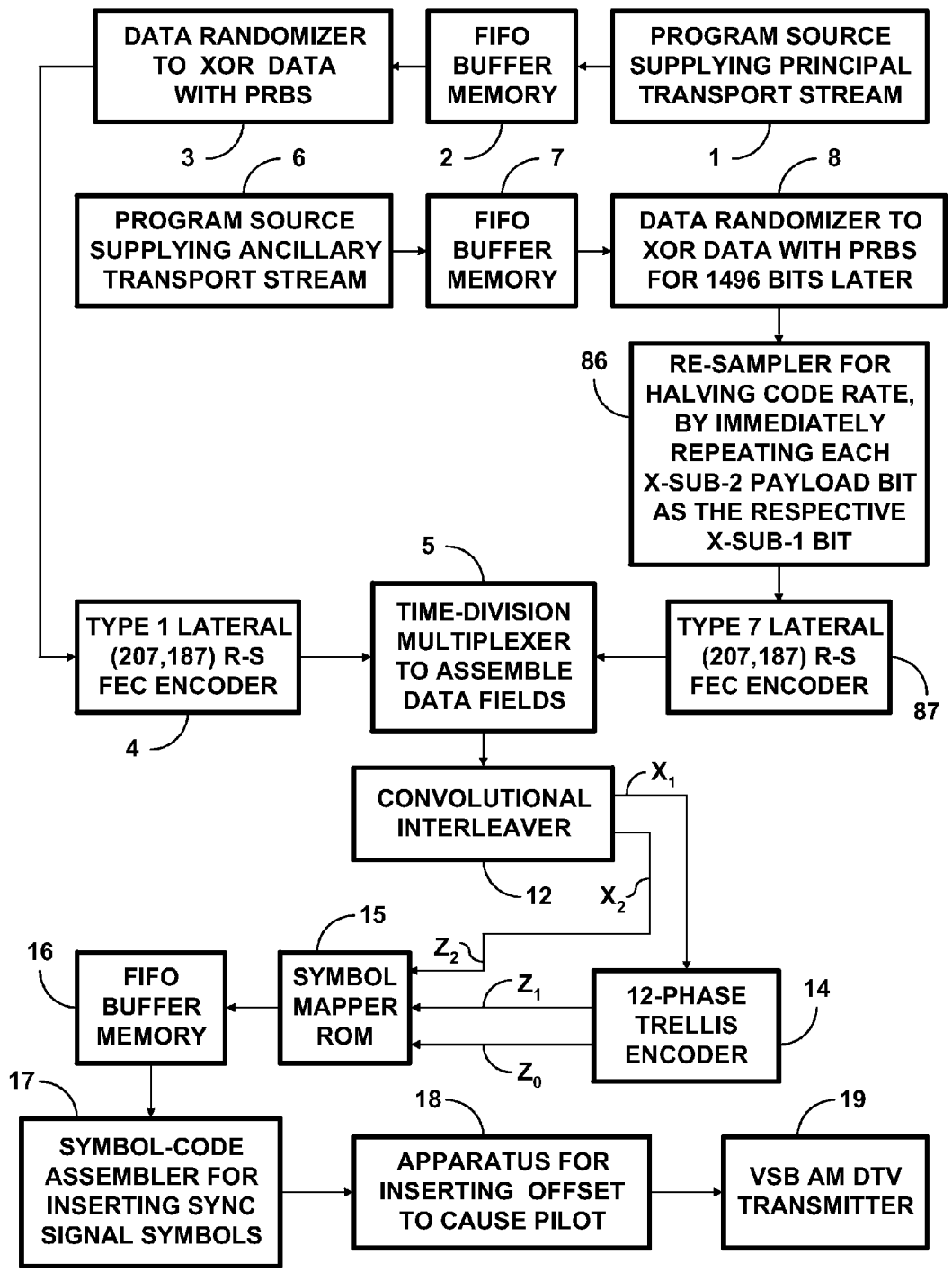
FIG. 19 is a schematic diagram of a DTV transmitter constructed in accordance with an aspect of the invention to provide for the transmission of pseudo-2VSB signals in time-division multiplex with ordinary 8VSB signals.

The FIG. 19 DTV transmitter modifies the FIG. 16 DTV transmitter to provide for the transmission of 8VSB and pseudo-2VSB signals in time-division multiplex. In the FIG. 19 DTV transmitter a re-sampler 86 replaces the re-sampler 81 and the $X_1$ bits generator 82 of the FIG. 12 DTV transmitter. The re-sampler 86 halves the code rate of its response by repeating each of the $X_2$ bits it receives from the data randomizer 8 as a respective $X_1$ bit inserted immediately thereafter. The lateral (207, 187) R-S FEC encoder 83 of the sixth type is replaced by a lateral (207, 187) Reed-Solomon forward-error-correction encoder 87 of a seventh type. The lateral (207, 187) R-S FEC encoder 87 is connected for forward-error-correction encoding each 187-byte halved-code-rate data packet generated by the re-sampler 86 to generate a respective 207-byte Reed-Solomon forward-error-correction code of the seventh type. The encoder 87 appends to the concluding end of each randomized 187-byte data packet the respective twenty parity bytes of the seventh type of (207, 187) R-S FEC coding. This seventh type of (207, 187) R-S FEC coding is orthogonal to the first type of (207, 187) R-S FEC coding used by the lateral (207, 187) R-S FEC encoder 4 and to the sixth type of (207, 187) R-S FEC coding used by the lateral (207, 187) R-S FEC encoder 83. The lateral (207, 187) R-S FEC encoder 87 is connected for supplying the (207, 187) R-S FEC codewords of the seventh type it generates to the time-division multiplexer 5. The multiplexer time-division multiplexes those codewords with the (207, 187) R-S FEC codewords of the first type from the lateral (207, 187) R-S FEC encoder 4 for application to the convolutional interleaver 12. The precoder 13 is not used, so the $X_2$ output bits supplied from the convolutional interleaver 12 are applied directly to the symbol mapper ROM 15 as the $Z_2$ input bits of a partial read address. The $X_1$ output bits supplied from the convolutional interleaver 12 and applied as $Y_1$ input bits to the 12-phase ⅔ trellis encoder 14 are relayed without changes to the symbol mapper ROM 15 as the $Z_1$ input bits of a partial read address. So, the $Z_1$ input bits of the ROM partial read address are the same as the $Z_2$ input bits they are concurrent with. This constrains the 8VSB symbol alphabet to the normalized modulation levels of −7, −5, +5 and +7 characterizing P-2VSB modulation when concurrent $Z_1$ and $Z_2$ bits originate from the re-sampler 86 and so are of the same value.

Figure 20:
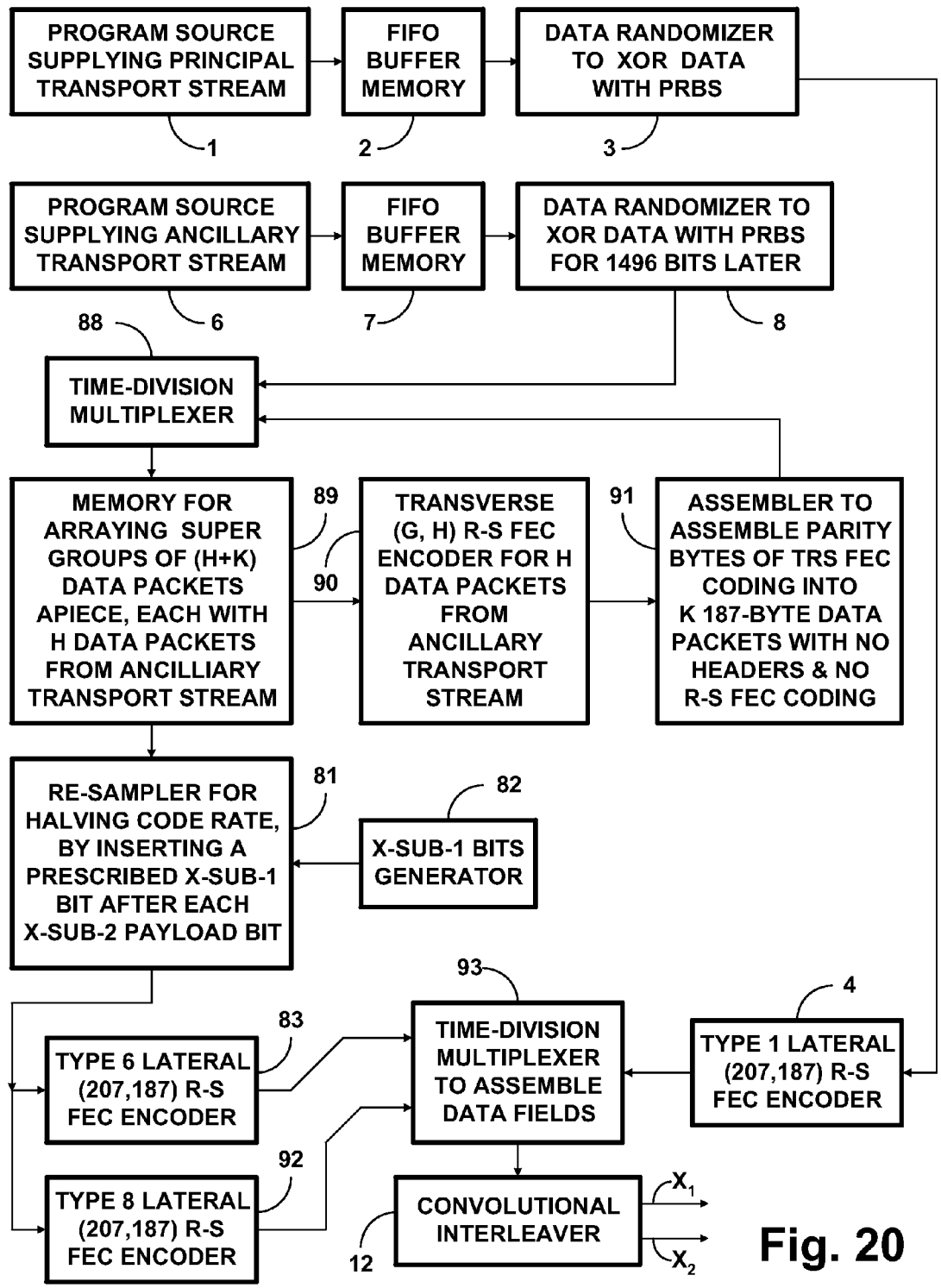
FIG. 20 is a schematic diagram of a modification of a DTV transmitter as shown in FIG. 15 or FIG. 16, which modification in accordance with an aspect of the invention provides transverse Reed-Solomon forward-error-correction coding to data for an ancillary service transmitted using a restricted alphabet of 8VSB symbols.

FIG. 20 shows a modification of the FIG. 15 DTV transmitter or the FIG. 16 DTV transmitter, in which modification the data packets in the ancillary transport stream are provided transverse Reed-Solomon forward-error-correction coding. The FIG. 20 DTV transmitter differs from the FIG. 7 DTV transmitter in that the MPEG-2-compliant data packets are re-sampled to halved code rate before, rather than after, lateral R-S FEC coding is done. In the FIG. 20 DTV transmitter the time-division multiplexer 25, the RAM 27, the transverse R-S FEC encoder 28 and the assembler 29, which are operative on 207-byte data segments, are replaced. A time-division multiplexer 88, a RAM 89, a transverse R-S FEC encoder 90 and an assembler 91, which are operative on 187-byte data packets, are used instead. The FIG. 20 DTV transmitter does not include the lateral (207, 187) R-S FEC encoders 9 and 26. The time-division multiplexer 88 has a first input port connected for receiving 187-byte data packets from the data randomizer 8. The time-division multiplexer 88 has a second input port connected for receiving 187-byte data segments from the assembler 91. The time-division multiplexer 88 has an output port at which 187-byte data segments from the data randomizer 8 and the assembler 91 are reproduced, connected for supplying these data segments to the random-access memory 89 for being written to one of two banks therein. The RAM 89 stores one 8-bit byte of code plus any byte extensions at each of its addressed storage locations. The RAM 89 has enough addressed storage locations to store at least two successive supergroups of (H+K) 187-byte data packets apiece.

After H successive ancillary-service data packets have been written into a bank of the RAM 89, read addressing is applied to this bank. This read addressing scans these H successive data packets in transverse direction to read H-byte transverse data packets to the transverse (G, H) Reed-Solomon forward-error-correction encoder 90. The data assembler 91 assembles the parity bytes generated by the transverse R-S FEC encoder 90 into K 187-byte packets with no headers. The data assembler 91 supplies each of these K packets to the second input port of the time-division multiplexer 88, which reproduces these K data packets for being written into a bank of the RAM 89 to complete the supergroup that is temporarily stored therein. The (H+K) data packets in this completed supergroup are then read seriatim from that bank of the RAM 89 to the re-sampler 81 at appropriate intervals. Preferably, the K data packets containing parity bytes from transverse R-S FEC coding are read from the RAM 89 before the H data packets containing the payload data selected for robust transmission. This procedure enables (or helps) a DTV receiver of new design to determine when the earliest of a supergroup of (H+K) data packets is received.

FIG. 20 shows the $X_1$ bits generator 82 connected for supplying the re-sampler 81 with $X_1$ bits, conditioning the re-sampler 81 to supply a pair of packets of PCPM signal responsive to each data packet read thereto from the RAM 89. That is, the re-sampler 81 and the $X_1$ bits generator 82 combine to provide a particular kind of code-rate-reduction encoder that halves code rate. FIG. 20 shows the re-sampler 81 connected for reading data packets to the lateral (207, 187) R-S FEC encoder 83 of the sixth type and to another lateral (207, 187) R-S FEC encoder 92 of an eighth type. FIG. 20 shows a time-division multiplexer 93 for assembling the fields of data segments supplied to the convolutional interleaver 12. The time-division multiplexer 93 has three input ports and replaces the time-division multiplexer 5 with only two input ports that the DTV transmitters of FIGS. 15 and 16 use for assembling data fields.

The lateral (207, 187) R-S FEC encoder 4 is connected for supplying 207-byte (207, 187) R-S FEC codewords of the first type to a first of the three input ports of the multiplexer 93. The multiplexer 93 is controlled so that it selectively responds to ones of those codewords of the first type that contain valid 8VSB signal, reproducing those codewords in its output signal supplied to the convolutional interleaver 12.

The lateral (207, 187) R-S FEC encoder 83 is connected for supplying 207-byte (207, 187) R-S FEC codewords of the sixth type to a second of the three input ports of the multiplexer 93. The multiplexer 93 is controlled so that it selectively responds to ones of those codewords of the sixth type that contain valid PCPM signal, reproducing those codewords in its output signal supplied to the convolutional interleaver 12.

The lateral (207, 187) R-S FEC encoder 92 is connected for supplying 207-byte (207, 187) R-S FEC codewords of an eighth type to a third of the three input ports of the multiplexer 93. The multiplexer 93 is controlled so that it selectively responds to ones of those codewords of the eighth type that contain parity bytes for transverse R-S FEC coding, reproducing those codewords in its output signal supplied to the convolutional interleaver 12.

Figure 21:
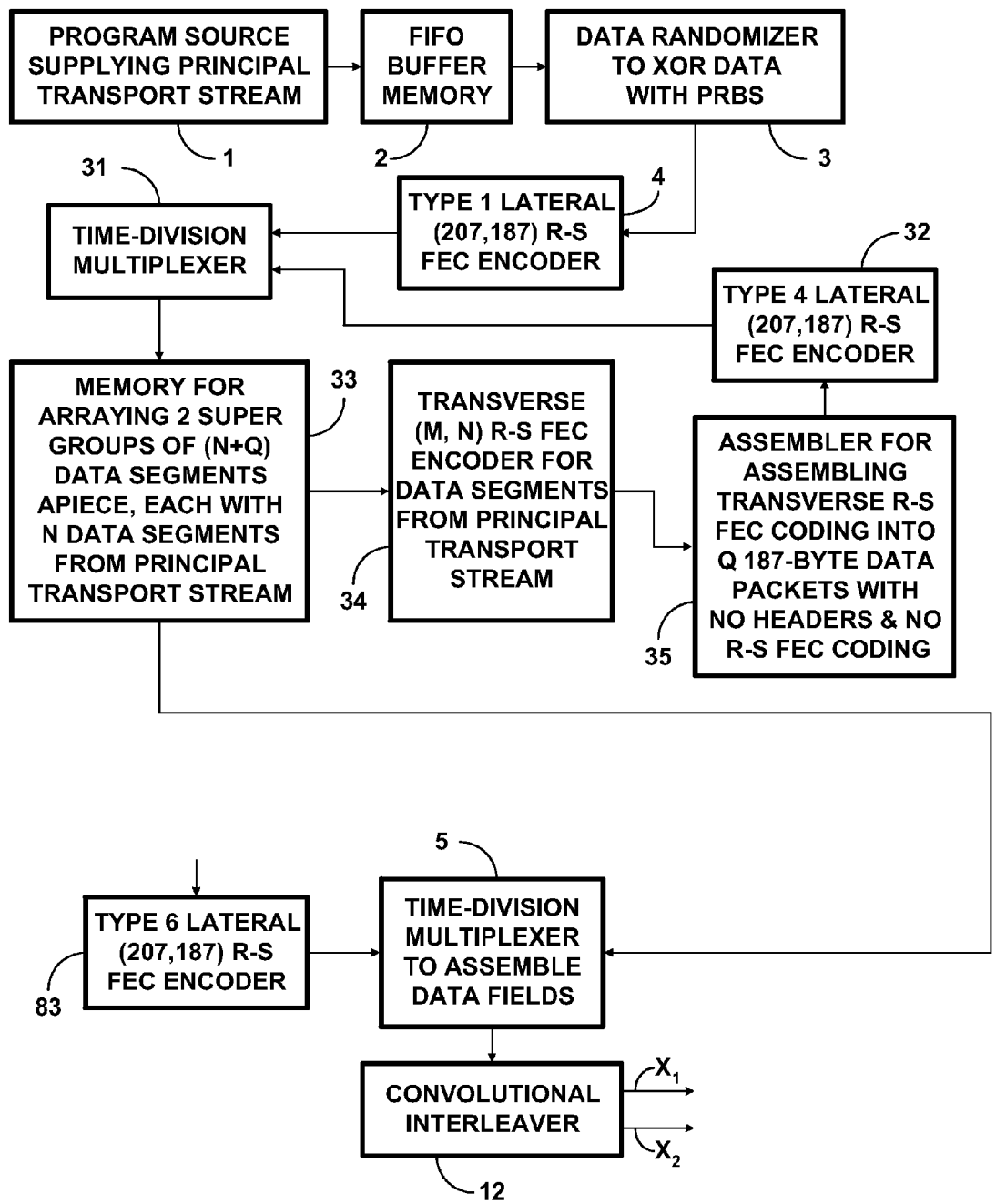
FIG. 21 is a schematic diagram of another modification of a DTV transmitter as shown in FIG. 15 or FIG. 16, which modification provides transverse Reed-Solomon forward-error-correction coding to data transmitted using the full alphabet of 8VSB symbols.

FIG. 21 shows a further modification that can be made to the FIG. 15 DTV transmitter or the FIG. 16 DTV transmitter, which modification provides transverse R-S FEC coding to data transmitted using the full alphabet of 8VSB symbols. The modification is similar to that shown in FIG. 9. The lateral (207, 187) R-S FEC coding provided by the encoders 4 and 32 combines with the subsequent transverse (M, N) R-S FEC coding to provide a form of two-dimensional FEC coding.

Figure 22:
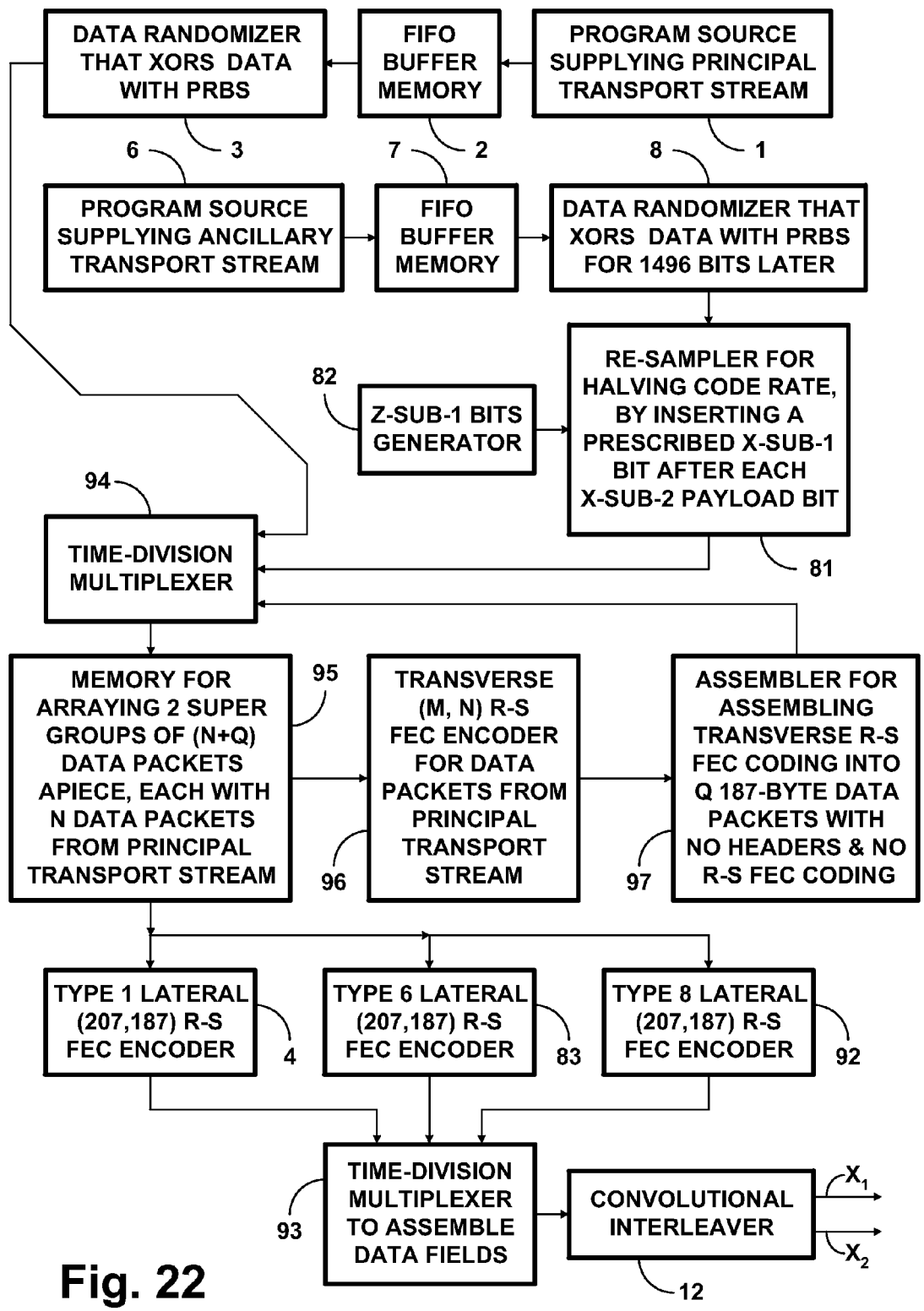
FIG. 22 is a schematic diagram of an alternative modification of the DTV transmitter as shown in FIG. 15 or FIG. 16, which modification provides transverse R-S FEC coding both to data subsequently transmitted using the full alphabet of 8VSB symbols and to data subsequently transmitted using a restricted alphabet of 8VSB symbols.

FIG. 22 shows a further modification that can be made to the FIG. 15 DTV transmitter or the FIG. 16 DTV transmitter, which modification provides transverse R-S FEC coding to data subsequently transmitted using a restricted alphabet of 8VSB symbols as well as to data subsequently transmitted using the full alphabet of 8VSB symbols. The transverse R-S FEC coding procedure is followed by various lateral R-S FEC coding procedures that provide a form of two-dimensional FEC coding for data subsequently transmitted using the restricted alphabet of 8VSB symbols, as well as for data subsequently transmitted using the full alphabet of 8VSB symbols. The program source 1 of a principal transport stream is connected for writing data packets to the FIFO buffer memory 2 for temporary storage therein. The data randomizer 3 is connected for receiving data packets read from the FIFO buffer memory 2 and randomizing the bits in those data packets. The program source 6 of an ancillary transport stream is connected for writing data packets to the FIFO buffer memory 7 for temporary storage therein. The data randomizer 8 is connected for receiving data packets read from the FIFO buffer memory 7 and randomizing the bits in those data packets. The re-sampler 81 generates a respective pair of 187-byte data packets of halved code rate in response to each 187-byte randomized MPEG-2-compliant data packet that it receives from the data randomizer 8. The re-sampler 81 is connected for inserting, after each of the $X_2$ bits it receives from the data randomizer 8, a respective $X_1$ bit received from the $X_1$ bits generator 82.

The FIG. 22 DTV transmitter differs from the FIG. 10 DTV transmitter in that the MPEG-2-compliant data packets are re-sampled to halved code rate before, rather than after, R-S FEC coding is done. In the FIG. 22 DTV transmitter the time-division multiplexer 38, the RAM 40, the transverse R-S FEC encoder 41 and the assembler 29, which are operative on 207-byte data segments, are replaced. A time-division multiplexer 88, a RAM 89, a transverse R-S FEC encoder 90 and an assembler 91, which are operative on 187-byte data packets, are used instead. The FIG. 22 DTV transmitter does not include the time-division multiplexer 36, the lateral (207, 187) R-S FEC encoder 37, the null segment generator 9 nor the lateral (207, 187) R-S FEC encoder 26.

A first input port of the time-division multiplexer 94 is connected to receive the 187-byte packets of randomized data generated by the data randomizer 3, which data are to be transmitted as ordinary 8VSB signal. A second input port of the time-division multiplexer 94 is connected to receive the 187-byte packets of randomized data generated by re-sampler 81, which data are to be transmitted as PCPM signal. A third input port of the time-division multiplexer 94 is connected to receive 187-byte packets of parity bytes for transversal (M, N) R-S FEC coding from the assembler 97. The random-access memory 95 is connected to an output port of the time-division multiplexer 94, which supplies 187-byte data packets for being written to one of two banks of memory in the RAM 95. The RAM 95 stores one 8-bit byte of code plus any byte extensions at each of its addressed storage locations. The RAM 95 has enough addressed storage locations to store at least two successive supergroups of (N+Q) 207-byte data packets apiece.

After N successive data packets have been written into a bank of the RAM 95, read addressing is applied to this bank This read addressing scans these N successive data packets in transverse direction to read H-byte transverse data segments to the transverse (M, N) Reed-Solomon forward-error-correction encoder 96. The data assembler 97 assembles the parity bytes generated by the transverse R-S FEC encoder 96 into Q 187-byte data packets with no headers. The data assembler 97 supplies each of these Q packets to the time-division multiplexer 94, which reproduces these Q packets for being written into a bank of the RAM 95 to complete the supergroup that is temporarily stored therein. After transverse R-S FEC coding is completed, the (N+Q) data packets in each completed supergroup are read in prescribed order from the RAM 95 to lateral (207, 187) R-S FEC encoders 4, 83 and 92.

The lateral (207, 187) R-S FEC encoder 4 is connected for supplying 207-byte (207, 187) R-S FEC codewords of the first type to a first of the three input ports of the multiplexer 93. The multiplexer 93 is controlled so that it selectively responds to ones of those codewords of the first type that contain valid 8VSB signal, reproducing those codewords in its output signal supplied to the convolutional interleaver 12.

The lateral (207, 187) R-S FEC encoder 83 is connected for supplying 207-byte (207, 187) R-S FEC codewords of the sixth type to a second of the three input ports of the multiplexer 93. The multiplexer 93 is controlled so that it selectively responds to ones of those codewords of the sixth type that contain valid PCPM signal, reproducing those codewords in its output signal supplied to the convolutional interleaver 12.

The lateral (207, 187) R-S FEC encoder 92 is connected for supplying 207-byte (207, 187) R-S FEC codewords of the eighth type to a third of the three input ports of the multiplexer 93. The multiplexer 93 is controlled so that it selectively responds to ones of those codewords of the eighth type that contain parity bytes for transverse R-S FEC coding, reproducing those codewords in its output signal supplied to the convolutional interleaver 12.

Either of the DTV transmitters shown in FIGS. 20 and 22 can be modified to provide for the transmission of 8VSB and pseudo-2VSB signals in time-division multiplex. The lateral (207, 187) R-S FEC encoder 87 of the seventh type, which identifies those data segments used for pseudo-2VSB transmission, replaces the lateral (207, 187) R-S FEC encoder 92 of the sixth type. The re-sampler 81 and the $X_1$ bits generator 82 of the DTV transmitter shown in FIG. 20 or 22 are replaced by the re-sampler 86 of FIG. 19. The re-sampler 86 halves code rate in the data stream it supplies to the lateral (207, 187) R-S FEC encoder 87 of the seventh type and to the (207, 187) R-S FEC encoder 92 of the eighth type.

Figure 23:
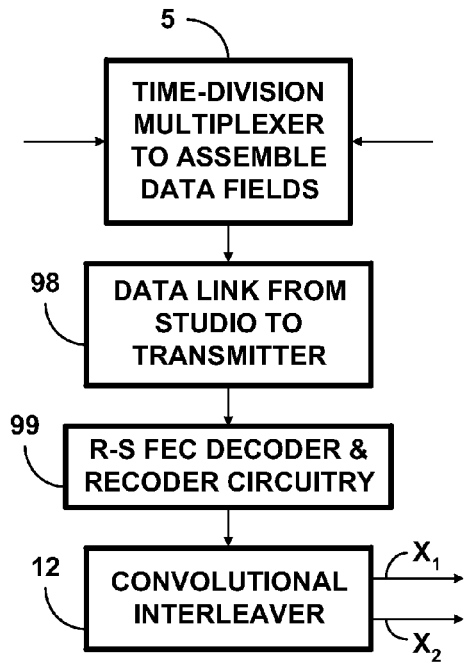
FIG. 23 is a schematic diagram showing how a data link from broadcast studio to remote transmitter site can be disposed in the DTV transmitters of FIGS. 1, 2, 7, 15, 16 and 19, for example.

FIG. 23 shows a data link 98 connecting the time division multiplexer 5 in a DTV broadcast studio to Reed-Solomon forward-error correction decoder and recoder circuitry 99 at a remote DTV transmitter. The circuitry 99 corrects errors in data that may have arisen in the data link 98 before that data is relayed to the convolutional interleaver 12 at the remote DTV transmitter. The overall DTV transmitter can correspond generally to one of those shown in FIGS. 1, 2, 7, 15, 16 and 19, for example. Or, the overall DTV transmitter can correspond generally to one of those shown in part in FIGS. 5, 6, 8, 9, 10, 17 and 18.

Figure 24:
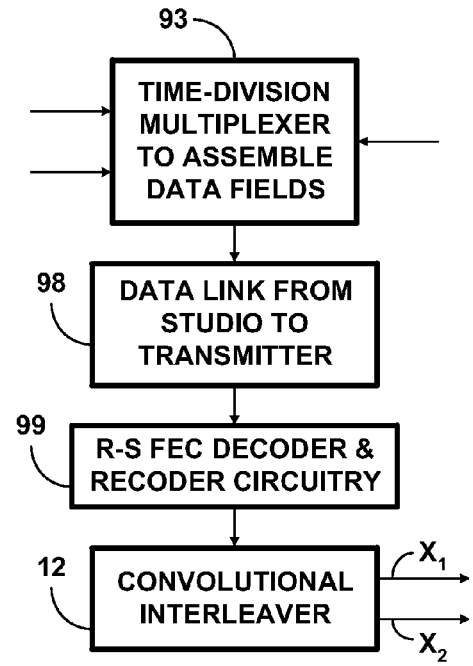
FIG. 24 is a schematic diagram showing how a data link from broadcast studio to remote transmitter site can be disposed in the portions of DTV transmitters in 20 and 22.

FIG. 24 shows a data link 98 connecting the time division multiplexer 93 in a DTV broadcast studio to Reed-Solomon forward-error correction decoder and recoder circuitry 99 at a remote DTV transmitter. The circuitry 99 corrects errors in data that may have arisen in the data link 98 before that data is relayed to the convolutional interleaver 12 at the remote DTV transmitter. The overall DTV transmitter can correspond generally to one of those shown in part in FIGS. 20, 21 and 22.

Placing the data link from the DTV broadcast studio to the remote DTV transmitter as shown in FIGS. 23 and 24 avoids the need for de-interleaving convolutionally interleaved data in order to correct errors in data that may have arisen in the data link. The buffering of data in the Reed-Solomon forward-error correction decoder and recoder circuitry 99 is relatively simple because data input and data output rates can be similar.

Figure 25:
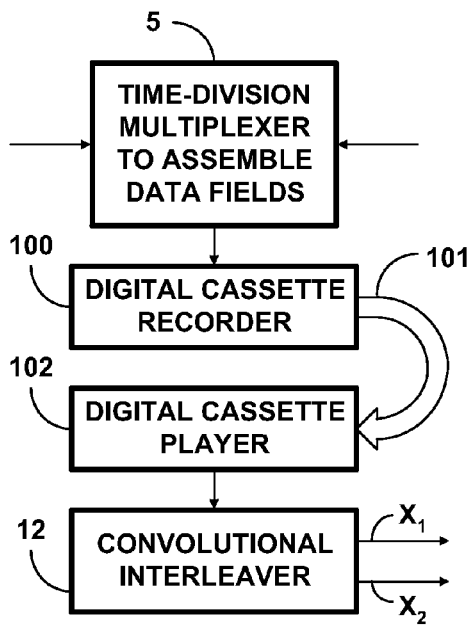
FIG. 25 is a schematic diagram showing how digital recording can be utilized in the DTV transmitters of FIGS. 1, 2, 7, 15, 16 and 19, for example.

FIG. 25 is a schematic diagram showing how digital cassette recording can be utilized in the DTV transmitters of FIGS. 1, 2, 7, 15, 16 and 19, for example, or in DTV transmitters as shown in part in FIGS. 5, 6, 8, 9, 10, 17 and 18. The fields of data still to be convolutionally interleaved are supplied by the time-division multiplexer 5 for recording by a digital cassette recorder 100.

Figure 26:
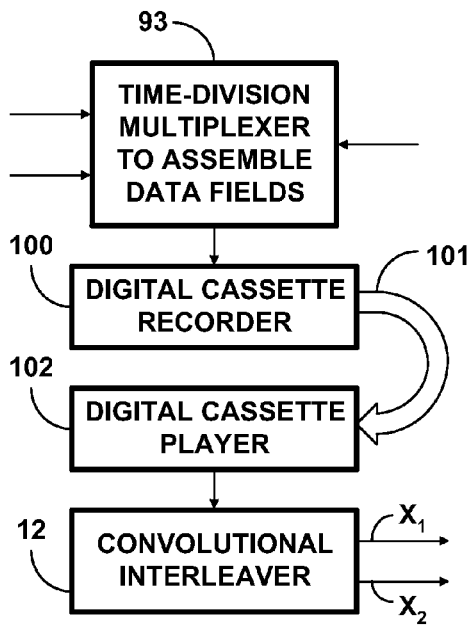
FIG. 26 is a schematic diagram showing how digital recording can be utilized in the portions of DTV transmitters in 20 and 22.

FIG. 26 is a schematic diagram showing how digital cassette recording can be utilized in DTV transmitters as shown in part in FIGS. 20, 21 and 22. The fields of data still to be convolutionally interleaved are supplied by the time-division multiplexer 93 for recording by a digital cassette recorder 100. FIGS. 25 and 26 both show a transfer 101 of the recorded digital cassette to a digital cassette recorder 102 for playing back the fields of data to the convolutional interleaver 12 in the DTV transmitter. The digital cassette recorder 102 can be designed to use Reed-Solomon forward-error correction decoder and recoder circuitry that takes advantage of the R-S FEC coding in the DTV signals as recorded.

Figure 27A:
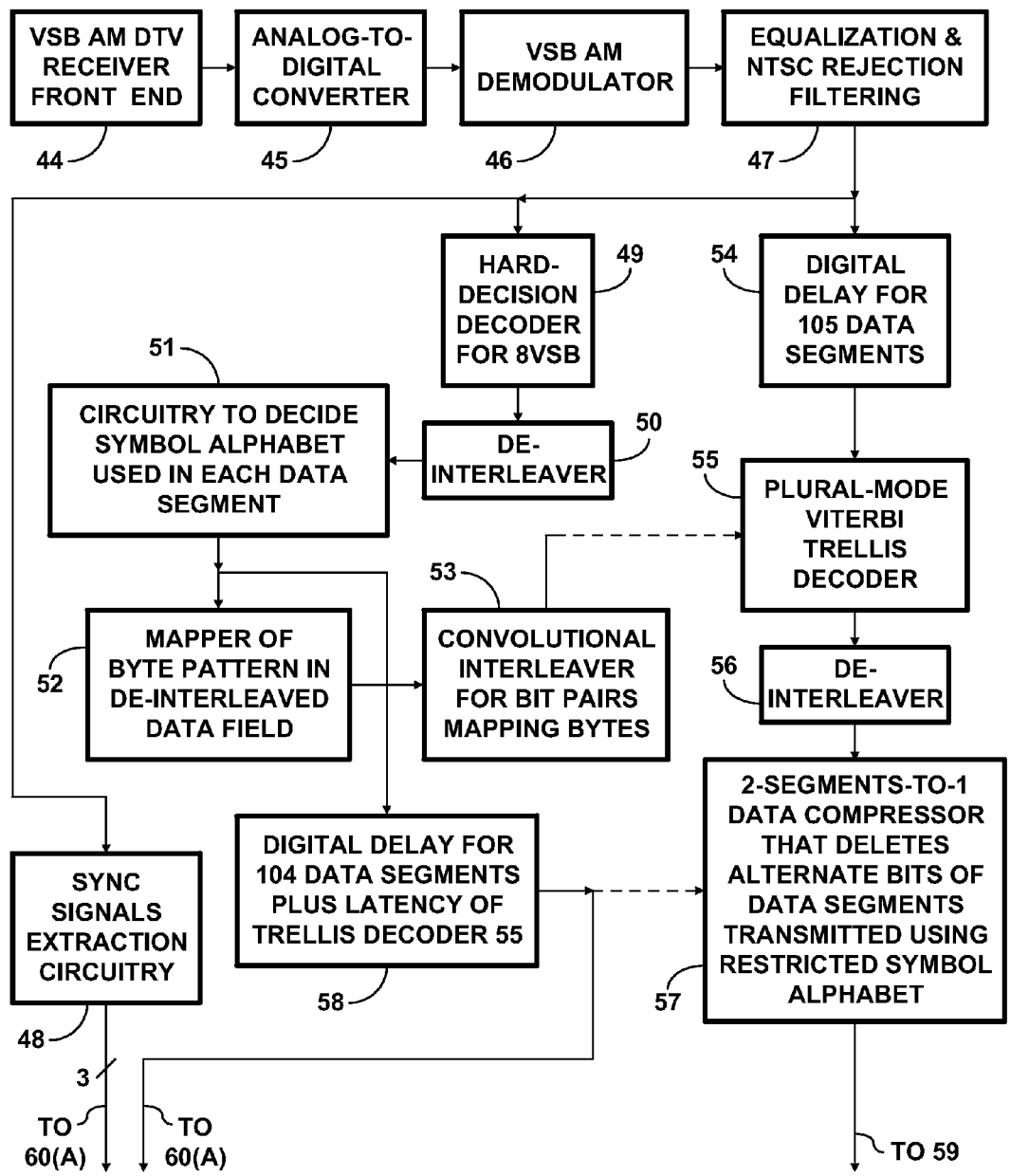
FIGS. 27A, 27B and 27C combine to form a FIG. 27 schematic diagram of a DTV receiver capable of receiving DTV signals as transmitted by the DTV transmitters of FIGS. 1, 2 and 7, for example, or modifications of those DTV transmitters.
Figure 27B:
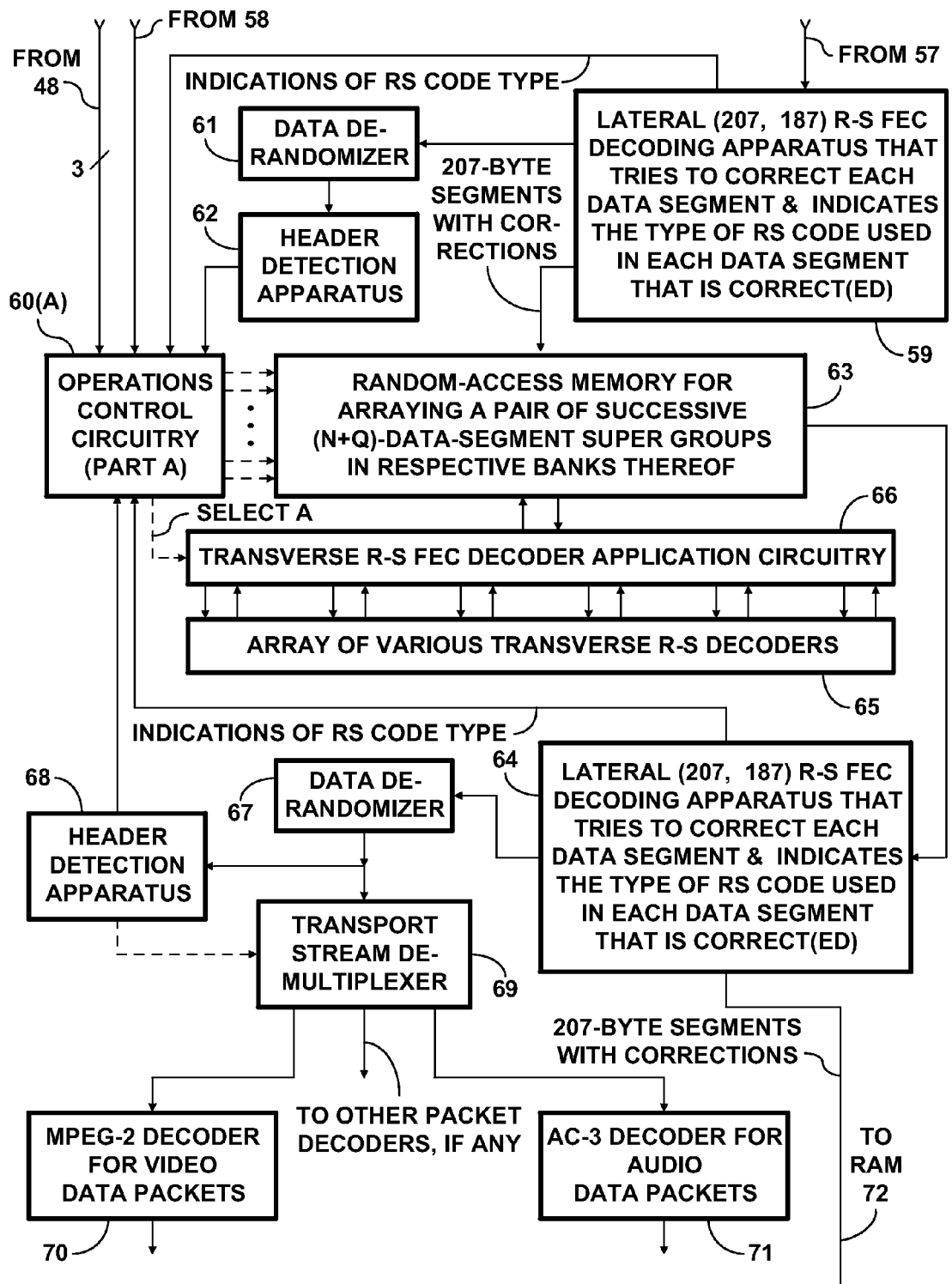
Figure 27C:
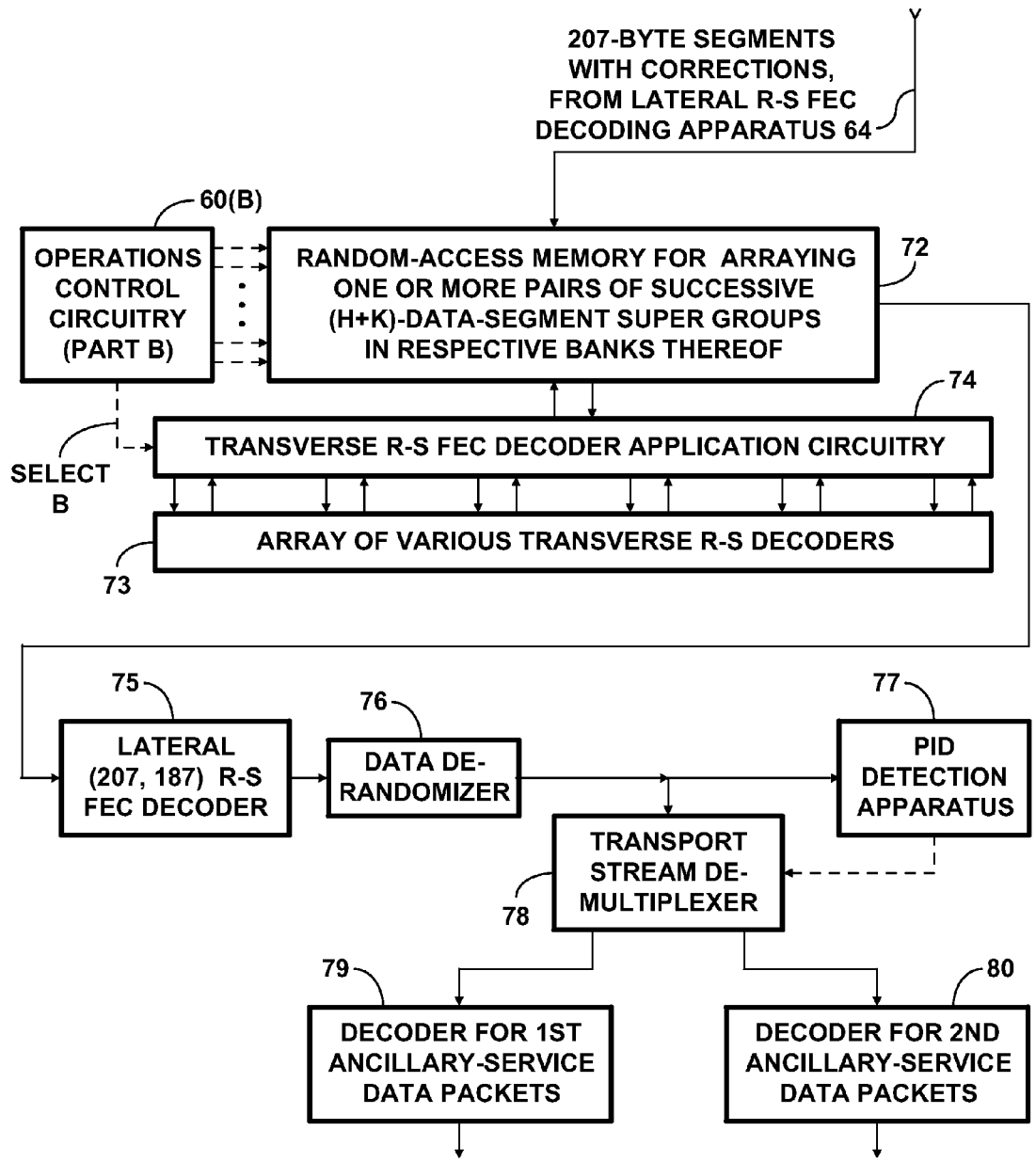

FIGS. 27A, 27B and 27C combine to form a FIG. 27 schematic diagram of a DTV receiver capable of receiving DTV signals as transmitted by the DTV transmitters described supra with reference to FIGS. 1 to 10 of the drawing. The FIG. 27A portion of the DTV receiver includes a vestigial-sideband amplitude-modulation (VSB AM) DTV receiver front-end 44 for selecting a radio-frequency DTV signal for reception, converting the selected RF DTV signal to an intermediate-frequency DTV signal, and for amplifying the IF DTV signal. An analog-to-digital converter 45 is connected for digitizing the amplified IF DTV signal supplied from the DTV receiver front-end 44. A demodulator 46 is connected for demodulating the digitized VSB AM IF DTV signal to generate a digitized baseband DTV signal, which is supplied to digital filtering 47 for equalization of channel response and for rejection of co-channel interfering NTSC signal. Synchronization signals extraction circuitry 48 is connected for receiving the digital filtering 47 response. Responsive to data-field-synchronization (DFS) signals, the sync signals extraction circuitry 48 detects the beginnings of data frames and fields. Responsive to data-segment-synchronization (DSS) signals, the sync signals extraction circuitry 48 detects the beginnings of data segments.

FIG. 27A shows circuitry for analyzing the symbol alphabet used in various portions of the reproduced baseband DTV signal. This circuitry includes a hard-decision decoder 49 for 8VSB symbols, which is connected for receiving the response of the digital filtering 47 for equalization of channel response and for rejection of co-channel interfering NTSC signal. The decisions that the decoder 49 makes concerning the 3-bit symbols are supplied to a de-interleaver 50 that complements the convolutional interleaver 12 in the DTV transmitter. However, the de-interleaver 50 operates with 12-bit bytes, rather than standard 8-bit bytes, and supplies symbol code to circuitry 51 to decide the symbol alphabet used in each data segment. The circuitry 51 decides the symbol alphabet used in each data segment by evaluating the distribution of 8VSB symbols used in each data segment, which procedures are described in more detail further on in this specification. Assuming that besides the full 8VSB alphabet two or three restricted alphabets are used, the decisions that the circuitry 51 supplies are expressed as bit pairs. E.g., 00 indicates full 8VSB alphabet; 01 indicates the first-coset restricted-symbol-alphabet; 10 indicates the second-coset restricted-symbol-alphabet; 11 indicates pseudo-2VSB restricted-symbol-alphabet. The first-coset restricted-symbol-alphabet signal excludes the −7, −5, +1 and +3 symbol values of the full 8VSB alphabet. The second-coset restricted-symbol-alphabet signal excludes the −3, −1, +5 and +7 symbol values of the full 8VSB alphabet.

Presuming that PCPM is of a preferred form in which $Z_1$ is constant in value throughout each data segment, a typical construction of the circuitry 51 is as follows. The two output lines from the typical circuitry 51 are biased from high impedance sources to the 00 condition. This is so that, absent any finding that a data segment currently being evaluated is part of a robust signal transmission, the circuitry 51 supplies a 00 default indication that the data segment currently being evaluated is part of an ordinary 8VSB signal transmission. The typical circuitry 51 includes a set of eight decoders, each supplied as its respective input signal the 3-bit symbol codes that the de-interleaver 50 supplies. Each of these decoders uniquely responds with a ONE when and only when a respective one of the eight 3-bit symbol codes occurs.

The typical circuitry 51 determines in the following way that a data segment is transmitted using the full alphabet of 8VSB symbols. Respective counters are used to count the ONES in each of the responses of the set of eight decoders that occur during the 207-byte data segment. The counts are compared to a threshold value somewhat above 104, say 127, to determine if one of the symbol codes appears more frequently than would be expected in a 207-byte segment of 8VSB signal. A plural-input NOR gate is connected for receiving these eight decisions and decisions concerning whether or not the data segment was transmitted using pseudo-2VSB, the first-coset restricted-symbol-alphabet exclusively, or the second-coset restricted-symbol-alphabet exclusively. The response of this plural-input NOR gate being a ONE at the conclusion of a data segment is a reasonably reliable indication that the data segment was transmitted using the full alphabet of 8VSB symbols. This indication conditions a first pair of tri-states to assert the 00 bit pair from low source impedances on the output lines from the circuitry 51.

The typical circuitry 51 determines in the following way whether or not a data segment is transmitted using the first-coset restricted-symbol-alphabet exclusively. The responses of the decoders for 010, 011, 110 and 111 symbol codes are applied to respective input ports of a first 4-input OR gate. The ONEs that this first 4-input OR gate generates in the 828 symbol epochs of each data segment are counted. The count is compared to a prescribed threshold value, such as 777. If this threshold is exceeded, this is an indication that the data segment was transmitted using the first-coset restricted-symbol-alphabet. This indication conditions a second pair of tri-states to assert the 01 bit pair from low source impedances on the output lines from the circuitry 51.

The typical circuitry 51 determines in the following way whether or not a data segment is transmitted using the second-coset restricted-symbol-alphabet exclusively. The responses of the decoders for 000, 001, 100 and 101 symbol codes are applied to respective input ports of a second 4-input OR gate. The ONEs that this second 4-input OR gate generates in the 828 symbol epochs of each data segment are counted. The count is compared to a prescribed threshold value, such as 777. If this threshold is exceeded, this is an indication that the data segment was transmitted using the second-coset restricted-symbol-alphabet. This indication conditions a third pair of tri-states to assert the 10 bit pair from low source impedances on the output lines from the circuitry 51.

The typical circuitry 51 determines in the following way whether or not a data segment is transmitted using pseudo-2VSB. The de-interleaver 50 supplies the circuitry 51 with a succession of 3-bit symbol codes. The $Z_2$ and $Z_1$ bits of these symbol codes are applied to respective input ports of a first two-input exclusive-NOR gate, which responds with a ONE to all symbols included in the pseudo-2VSB set and with a ZERO to all symbols excluded from the pseudo-2VSB set. The ONEs that the first exclusive-NOR gate generates in the 828 symbol epochs of each data segment are counted. The count is compared to a prescribed threshold value, such as 777. If this threshold is exceeded, this is an indication that the data segment was transmitted using pseudo-2VSB. This indication conditions a fourth pair of tri-states to assert the 11 bit pair from low source impedances on the output lines from the circuitry 51.

The bit pairs coding the circuitry 51 decisions are supplied to a mapper 52 of the byte pattern in the de-interleaved data field. The mapper 52 extends each bit pair decision by repeating it 206 times, to map the 207 bytes of a data segment as a line of bit pair decisions. A convolutional interleaver 53 generates the pattern of bit pair decisions mapping byte characteristics in the interleaved data field of the baseband DTV signal supplied as response from the digital filtering 47 for equalization of channel response and for rejection of co-channel interfering NTSC signal.

Digital delay circuitry 54 delays the digital filtering 47 response by 105 or so data segments to align it temporally with the bit pairs from the convolutional interleaver 53 that describe symbol usage in the interleaved data field. A plural-mode 12-phase trellis decoder 55 of Viterbi type is connected for receiving the digital filtering 47 response as delayed by the digital delay circuitry 54. When the bit pair decisions from the convolutional interleaver 53 indicate restricted-alphabet symbols are currently being supplied to the plural-mode trellis decoder 55, the decision tree in the trellis decoding is selectively pruned. This pruning excludes decisions that currently received symbols have normalized modulation levels that are excluded from the restricted alphabet of 8VSB symbols currently in use. The trellis decoder 55 is connected to supply bytes of data to a de-interleaver 56 that complements the convolutional interleaver 12 in the DTV transmitter.

When the convolutional interleaver 53 supplies the bit pair 00 as a control signal indicating to the plural-mode 12-phase trellis decoder 55 that the symbols it currently receives are from ordinary 8VSB transmission, the ranges of decision in the trellis decoder 55 are the conventional ones for receiving A/53 DTV broadcasts. The decision tree in the plural-mode 12-phase trellis decoder 55 is not pruned. When the convolutional interleaver 53 supplies the bit pair 01 as a control signal indicating to the trellis decoder 55 that the symbols it currently receives are exclusively from the first coset, the ranges of decision are adjusted accordingly. Also, the decision tree is pruned in the trellis decoder 55 so as to preclude −7, −5, +1 and +3 symbol decisions. When the convolutional interleaver 53 supplies the bit pair 10 as a control signal indicating to the trellis decoder 55 that the symbols it currently receives are exclusively from the second coset, the ranges of decision are adjusted accordingly. Also, the decision tree is pruned in the trellis decoder 55 so as to preclude −3, −1, +5 and +7 symbol decisions. When the convolutional interleaver 53 supplies the bit pair 11 as a control signal indicating to the trellis decoder 55 that the symbols it currently receives are from pseudo-2VSB transmission, the ranges of decision are adjusted accordingly. Also, the decision tree is pruned in the trellis decoder 55 so as to preclude −3, −1, +1 and +3 symbol decisions.

If PCPM is of an alternative form in which a data segment is transmitted using symbols with a predetermined sequence of $Z_1$ bits, the circuitry 51 can determine in the following way whether or not a data segment is transmitted using symbols with that predetermined sequence of $Z_1$ bits. The $Z_1$ bits of the 3-bit symbol codes that the de-interleaver 50 supplies are applied to a first input port of a second two-input exclusive-NOR gate, which has the prescribed sequence of $Z_1$ bits applied to its second input port. The ONEs that the second exclusive-NOR gate generates in the 828 symbol epochs of each data segment are counted. The count is compared to a prescribed threshold value, such as 777. If this threshold is exceeded, this is an indication that the data segment was transmitted using symbols with a predetermined sequence of $Z_1$ bits. This indication conditions a pair of tri-states to assert the 01 bit pair from low source impedances on the output lines from the circuitry 51.

If PCPM is of that alternative form in which a data segment is transmitted using symbols with a predetermined sequence of $Z_1$ bits, circuitry similar to that shown in FIG. 3 is associated with the plural-mode 12-phase trellis decoder 55 of Viterbi type. This circuitry provides the trellis decoder 55 information concerning which symbols are precluded at which locations in the data field when the convolutional interleaver 53 signals the trellis decoder 55 that this form of PCPM is being used. Symbols transmitted at −7, −5, +1 and +3 normalized modulation levels are precluded from locations in the data field reserved for the first coset of possible symbols. Symbols transmitted −3, −1, +5 and +7 normalized modulation levels are precluded from locations in the data field reserved for the second coset of possible symbols. The ranges of decision in the plural-mode 12-phase trellis decoder 55 are adjusted to accommodate the decision tree being pruned in a time-dependent way as locations in the data field are scanned.

Information concerning the symbol sets used for generating each data segment in the de-interleaved data field can be encoded in the "reserved" portions of the data field synchronization data segments, as known in the prior art. Such information can be decoded and used to validate circuitry 51 response. Alternatively, such information can be used by the mapper 52 instead of the circuitry 51 response for determining the pattern of data segments in the de-interleaved data field that are transmitted using symbols from a restricted alphabet. This avoids the need for the digital delay 54. This facilitates hard-decision decoding on which adaptation of the equalization and NTSC rejection filtering is based being constructed to depend on the bit-pair decisions that the convolutional interleaver 53 supplies as to the nature of received symbols, so that tracking of dynamic multipath can be improved.

A novel feature of the FIG. 27 DTV receiver is a 2-segments-to-1 data compressor 57 for data segments decoded from restricted-alphabet symbols. The data compressor 57 is connected for receiving from the de-interleaver 56 successive data segments of de-interleaved data fields. The data compressor 57 is connected for receiving from digital delay circuitry 58 bit pairs indicating previous decisions made by the circuitry 51 concerning whether the data segments the de-interleaver 56 currently supplies were or were not decoded from 8VSB symbols that had alphabet restrictions. The digital delay circuitry 58 delays these bit pairs for 104 data segments plus the latent delay of the trellis decoder 55. Supposing a 00 bit pair indicates full 8VSB alphabet, the bits in the bit pair from the circuitry 51 can be ORed to generate indications of whether data were or were not decoded from 8VSB symbols that had alphabet restrictions. The digital delay circuitry 58 can then be modified to delay these single-bit indications rather than bit-pair indications.

The data compressor 57 is selective in operation, its response reproducing without modification data segments decoded from 8VSB symbols that had no alphabet restrictions. The data compressor 57 converts each pair of data segments decoded from restricted-alphabet symbols to a respective single data segment. The data compressor 57 treats the pair of data segments as a succession of $X_2$, $X_1$ bit pairs and eliminates the $X_1$ bits to leave a succession of $X_2$ bits. This succession of $X_2$ bits reproduces the single data segment at original code rate that the DTV transmitter used to generate the pair of data segments at halved code rate.

The trellis decoder 55 can be designed to supply an extension to each byte it supplies, which extension comprises one or more additional bits indicative of the confidence level that the byte is correct. The de-interleaver 56 and the 2-segments-to-1 data compressor 57 can be designed to preserve those byte extensions in their responses, so those byte extensions are available to help locate byte errors in subsequent R-S FEC decoding procedures. The 2-segments-to-1 data compressor 57 is connected for supplying its response to a lateral (207, 187) R-S FEC decoding apparatus 59 shown in FIG. 27B.

FIGS. 27B and 27C show parts 60(A) and 60(B), respectively, of operations control circuitry 60 for controlling transverse Reed-Solomon forward-error-correction decoding procedures. Showing the operations control circuitry 60 in two parts is an artifice used in the drawings to avoid running numerous connections from elements shown in FIGS. 27A and 27B to elements shown in FIG. 27C. FIG. 27B shows the operations control circuitry 60 connected for receiving DFS signal, DSS signal and clocking signal at an even multiple of symbol rate via respective connections from the sync signals extraction circuitry 48 in FIG. 27A. These signals are provided with respective delays by means not explicitly shown, which delays compensate for latent delays accumulated in the FIG. 27A circuitry and in the lateral (207, 187) R-S FEC decoding apparatus 59 shown in FIG. 27B. FIG. 27B shows the operations control circuitry 60 connected for receiving the response of the digital delay circuitry 58 in FIG. 27A, which response provides indications of whether data segments were or were not decoded from 8VSB symbols that had alphabet restrictions.

A de-randomizer 61 is connected for providing de-randomized response to 187-byte data packet portions of corrected data segments supplied from the lateral (207, 187) R-S FEC decoding apparatus 59. Header detection apparatus 62 detects the PID portions of the de-randomized data packets to provide the operations control circuitry 60 information concerning the types of corrected data segments supplied from the lateral (207, 187) R-S FEC decoding apparatus 59. The operations control circuitry 60 uses this information when transverse R-S FEC decoding is to be performed only on selected types of data segments. A banked random-access memory 63 is employed in certain transverse R-S FEC decoding procedures. Writing to and reading from the banks of the RAM 63 is controlled by the operations control circuitry 60.

The lateral (207, 187) R-S FEC decoding apparatus 59 is connected for supplying successive bytes of corrected data segments to the RAM 63 to be written into one of two banks of memory therein. Each of these banks of memory is capable of storing the (N+Q) data segments in a supergroup. Each addressed location in the RAM 63 is capable of temporarily storing a byte supplied from the lateral (207, 187) R-S FEC decoding apparatus 59, plus any extension or extensions of that byte. Consider successive supergroups of (N+Q) data segments to be ordinally numbered. The respective cycles of operation for the two banks of the RAM 63 are shifted with respect to each other in time. This shift is such that bytes of odd-numbered supergroups of (N+Q) data segments are written to one bank, and bytes of even-numbered supergroups of (N+Q) data segments are written to the other bank. The RAM 63 is operated so that, while bytes of a newly received supergroup of (N+Q) data segments are being written to one bank of the memory, the previous supergroup of (N+Q) data segments that was written to the other bank of memory can be corrected for byte errors. Writing each successive byte of a newly received supergroup of (N+Q) data segments to an addressed storage location in one bank of the RAM 63 overwrites a byte from two such supergroups previous. Just before being overwritten, the contents of storage locations for the N data segments containing payload information are read to a lateral (207, 187) Reed-Solomon forward-error-correction decoding apparatus 64. If (N+Q) equals 156 or a multiple thereof, a data segment read from the RAM 63 to the R-S FEC decoding apparatus 64 will occupy the same position in a data field that it had when written into the RAM 63. This simplifies subsequent data de-randomization of data packets.

The operations control circuitry 60 supplies the addressing for writing and reading operations of the RAM 63. The operations control circuitry 60 includes counter circuitry for counting at an even multiple of the rate bytes are supplied from the lateral (207, 187) R-S FEC decoding apparatus 59. The count from this counter circuitry is synchronized with the received data fields and data segments using the synchronizing signals extracted by the synchronization signal extraction circuitry 48. Portions of the count from this counter provide read addressing to a pair of read-only memories. These ROMs respectively generate the addressing supplied to each bank of the RAM 63. Storage locations in one of the RAM 63 banks are addressed by row and by column for being overwritten with a supergroup of (N+Q) data segments supplied from the lateral (207, 187) R-S FEC decoding apparatus 59. N previously stored data segments are read from this bank of the RAM 63 to the lateral (207, 187) Reed-Solomon forward-error-correction decoding apparatus 64 in the read before overwriting procedure described in the previous paragraph. Successive addresses occur at the rate that bytes are supplied from the R-S FEC decoding apparatus 59.

The initial writing of a supergroup of (N+Q) data segments into a bank of the RAM 63 has to take into account the effects of data compression by the 2-segments-to-1 data compressor 57. The operations control circuitry 60 is connected for receiving the response of digital delay circuitry 58, which response includes indication of the initial data segment in a pair of data segments transmitted using a restricted symbol alphabet. The operations control circuitry 60 arranges for the RAM 63 to be written with a segment of null bytes during the portion of the de-interleaved data field that was originally occupied by the initial data segment in a pair of data segments transmitted using a restricted symbol alphabet. This "shortens" the supergroup of (N+Q) data segments temporarily stored in the RAM 63 so as to reproduce the supergroup of (N+Q) data segments resulting from transverse R-S FEC coding at the transmitter.

While a new supergroup of (N+Q) data segments is being written into one bank of the RAM 63, the storage locations in the other of the RAM 63 banks are transversally addressed for reading to a selected one of an array 65 of transverse Reed- Solomon forward-error-correction decoders. The selection is made by transverse Reed-Solomon forward-error-correction decoder application circuitry 66 responsive to a SELECT A control signal supplied by the operations control circuitry 60. The operations control circuitry 60 determines which transverse R-S FEC decoder, if any, to select from indications the lateral (207, 187) R-S FEC decoding apparatus 59 supplies as to the type of R-S FEC coding it finds will render a data segment correct(ed). These indications indicate which segments include parity bytes of transverse R-S FEC decoding and the type of transverse R-S FEC decoding these parity bytes are associated with. After the bytes in each transversal path have had errors therein corrected to the extent the transverse R-S FEC code permits, these bytes are written back to the same storage locations in this other of the RAM 63 banks they were read from.

Successive addresses in the transverse scanning of storage locations in a bank of the RAM 63 occur at a multiple of twice the rate bytes are supplied from the lateral (207, 187) R-S FEC decoding apparatus 59. If only one type of transverse R-S FEC coding is employed in each supergroup of (N+Q) data segments, successive addresses for transverse scanning of storage locations in the RAM 63 can occur at only twice the rate bytes are supplied from the lateral (207, 187) R-S FEC decoding apparatus 59. If two types of transverse R-S FEC coding are employed in each supergroup of (N+Q) data segments, independent transverse scanning of storage locations in the RAM 63 for each type of transverse R-S FEC coding may be desired. Successive addresses for such transverse scans have to be supplied at four times or more the rate bytes are supplied from the lateral (207, 187) R-S FEC decoding apparatus 59. Alternative designs in which transverse scanning of each bank of RAM is clocked independently of the lateral scanning of the other bank of RAM are possible. For example, such designs can be implemented using dual porting techniques.

The (207, 187) Reed-Solomon forward-error-correction decoding apparatus 64 is connected for receiving 207-byte data segments read from the RAM 63 after having been corrected insofar as possible by transverse R-S FEC decoding procedures. The (207, 187) R-S FEC decoding apparatus 64 performs lateral Reed-Solomon forward-error-correction on these 207-byte data segments and forces to ONE the Transport Error Indicator (TEI) bit in each data packet in those segments in which the decoding apparatus 64 finds byte errors that still remain uncorrected. A data de-randomizer 67 is connected for receiving the portion of each data segment supplied by the lateral (207, 187) R-S FEC decoding apparatus 64 other than its twenty R-S FEC code parity bytes as a 187-byte data packet. The data de-randomizer 67 is connected for supplying de-randomized data packets to header detection apparatus 69 and to a transport stream de-multiplexer 69.

The transport stream de-multiplexer 69 responds to the header detection apparatus 69 detecting selected PIDs in certain types of the de-randomized data packets from the data de-randomizer 67 for sorting those types of de-randomized data packets to appropriate packet decoders. For example, video data packets are sorted to an MPEG-2 decoder 70. The MPEG-2 decoder 70 responds to the TEI bit in a data packet indicating that it still contains byte errors by not using the packet and by instituting measures to mask the effects of the packet not being used. By way of further example, audio data packets are sorted to an AC-3 decoder 71.

The (207, 187) R-S FEC decoding apparatus 64 supplies corrected 207-byte data segments to a banked random-access memory 72 shown in FIG. 27C. Each addressed location in the RAM 71 is capable of temporarily storing a byte supplied from the lateral (207, 187) R-S FEC decoding apparatus 64, plus any extension or extensions of that byte. Each bank of memory in the RAM 72 is capable of storing the (H+K) data segments in a supergroup used in an ancillary-service transmission. These (H+K) data segments can occur during a number of supergroups of (N+Q) data segments.

The operations control circuitry 60 controls the writing and reading operations of the RAM 72. The lateral (207, 187) R-S FEC decoding apparatus 64 notifies the operations control circuitry 60 when one of the K segments containing parity bytes for a supergroup of transverse (G, H) R-S FEC coding occurs in the response of the decoding apparatus 64 supplied to the RAM 72. Responsive to such notification, the operations control circuitry 60 enables the writing of this segment into a bank of the RAM 72. When one of the H data segments in a supergroup of transverse (G, H) R-S FEC coding occurs in the response of the lateral (207, 187) R-S FEC decoding apparatus 64, it is de-randomized by the data de-randomizer 67 for application to the header detection apparatus 69. The header detection apparatus 69 notifies the operations control circuitry 60 of the occurrence of the de-randomized PID of this de-randomized data segment. Responsive to such notification, the operations control circuitry 60 enables the writing of this data segment into a bank of the RAM 72. A counter within the operations control circuitry 60 keeps track of how many of the (H+K) data segments in the supergroup of transverse (G, H) R-S FEC coding are temporarily stored in a respective bank of the RAM 72. When a full complement of (H+K) data segments is temporarily stored in a respective bank of the RAM 72, the operations control circuitry 60 generates addressing that scans transverse paths through storage locations in that RAM 72 bank. These storage locations are read to a selected one of an array 73 of transverse Reed-Solomon forward-error-correction decoders. Transverse Reed-Solomon forward-error-correction decoder application circuitry 74 makes the selection responsive to a SELECT B control signal supplied by the operations control circuitry 60. Responsive to information that the lateral (207, 187) R-S FEC decoding apparatus 64 supplies, the operations control circuitry 60 determines which transverse R-S FEC decoder, if any, to select. This information concerns the type of segments including parity bytes of transverse R-S FEC decoding that the R-S FEC decoding apparatus 64 finds to be correctable. After the bytes in each transversal path have had errors therein corrected to the extent the transverse R-S FEC code permits, these bytes are written back to the same storage locations in the RAM 72 bank they were read from. The operations control circuitry 60 generates addressing for reading the H data segments from the RAM 72 bank to a lateral (207, 187) Reed-Solomon forward-error-correction decoder 75.

The (207, 187) Reed-Solomon forward-error-correction decoder 75 is connected for receiving 207-byte data segments read from the RAM 72 after having been corrected insofar as possible by transverse R-S FEC decoding procedures. The (207, 187) R-S FEC decoder 75 performs lateral Reed-Solomon forward-error-correction on these 207-byte data segments and forces to ONE the Transport Error Indicator (TEI) bit in each data packet in those segments in which the decoder 75 finds byte errors that still remain uncorrected. A data de-randomizer 76 is connected for receiving the portion of each data segment supplied by the lateral (207, 187) R-S FEC decoder 74 other than its twenty R-S FEC code parity bytes as a 187-byte data packet. The data de-randomizer 76 is connected for supplying de-randomized data packets to header detection apparatus 77 and a transport stream de-multiplexer 78. The header detection apparatus 77 responds to the PIDs in the de-randomized data packets to develop control signals for the transport stream de-multiplexer 78. Responsive to these control signals, the transport stream de-multiplexer 78 sorts the de-randomized data packets to appropriate packet decoders. FIG. 27C shows a decoder 79 for the data packets of a first ancillary service and a decoder 80 for the data packets of a second ancillary service, each being connected for receiving selected data packets from the transport stream de-multiplexer 78.

The FIG. 27 DTV receiver can be modified so that RAM 72 is written with data segments selected directly from the response of the lateral (207, 187) R-S FEC decoding apparatus 59, rather than from the response of the lateral (207, 187) R-S FEC decoding apparatus 64. This avoids the latent delay associated with temporarily storing data segments in the RAM 63. However, data segments selected directly from the response of the lateral (207, 187) R-S FEC decoding apparatus 59 will generally contain more byte errors than data segments selected from the response of the lateral (207, 187) R-S FEC decoding apparatus 64.

Figure 28A:
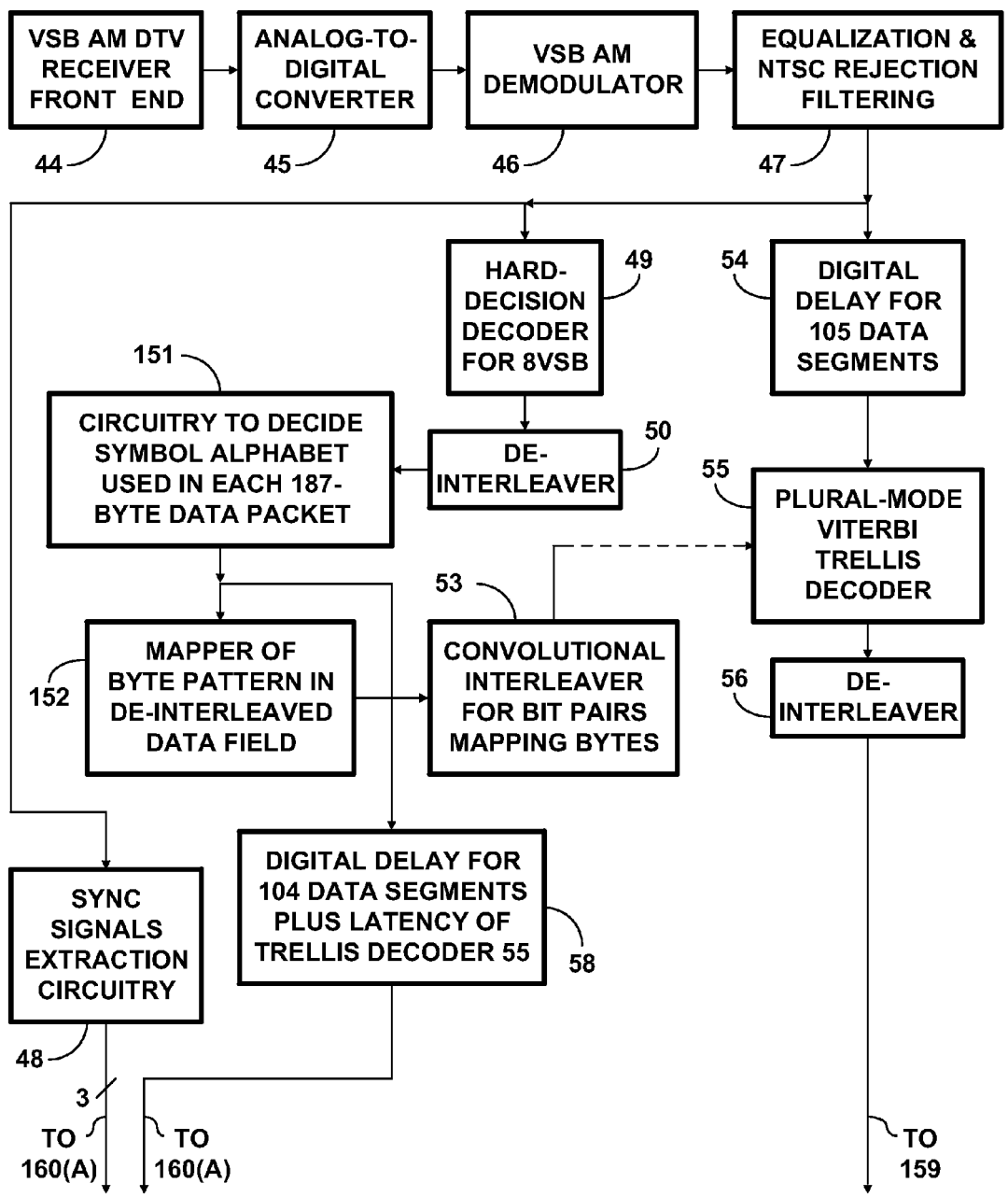
FIGS. 28A, 28B and 28C combine to form a FIG. 28 schematic diagram of a DTV receiver capable of receiving DTV signals as transmitted by the DTV transmitters of FIGS. 15, 16 and 19, for example, or modifications of those DTV transmitters.
Figure 28B:
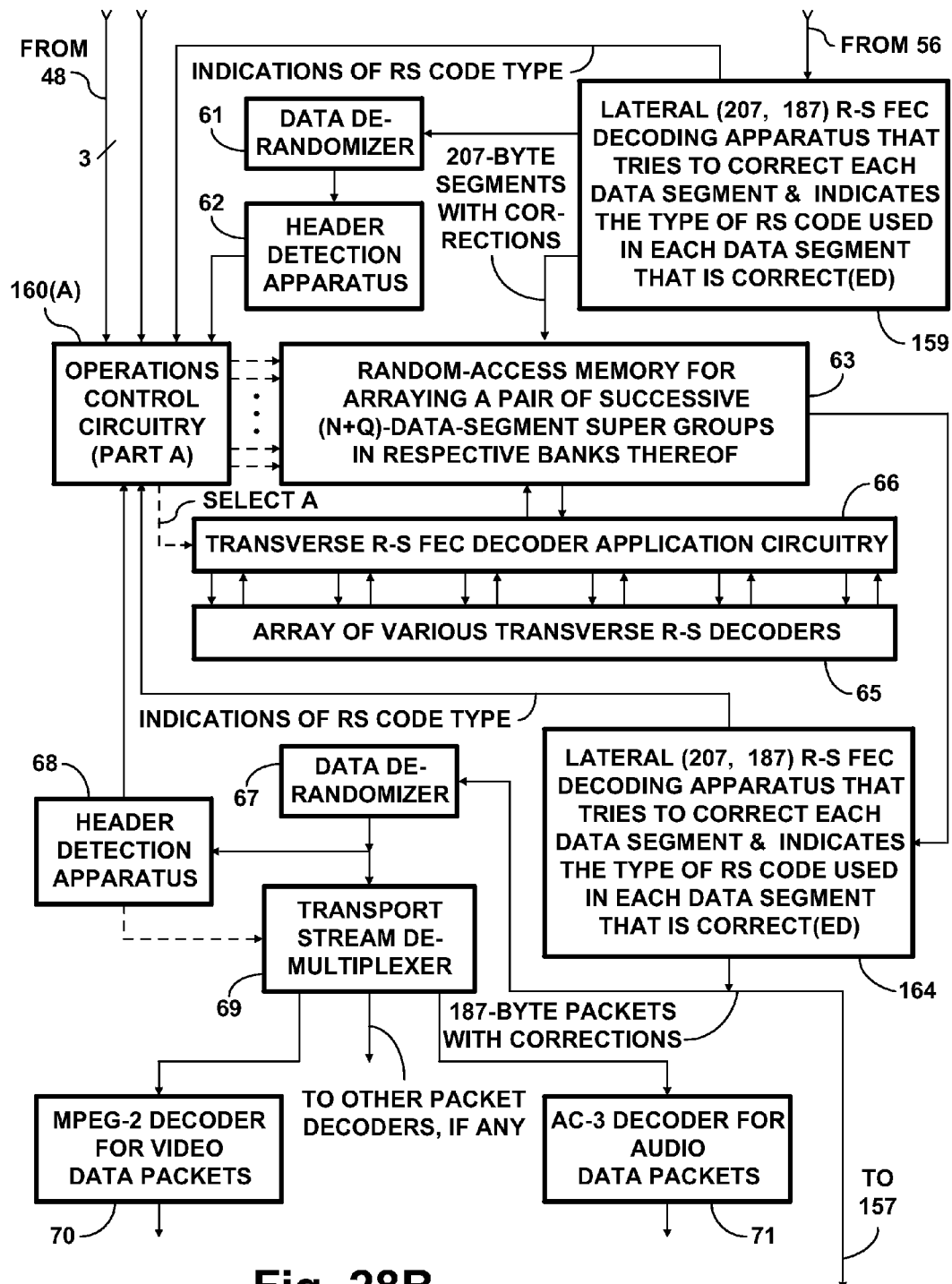
Figure 28C:
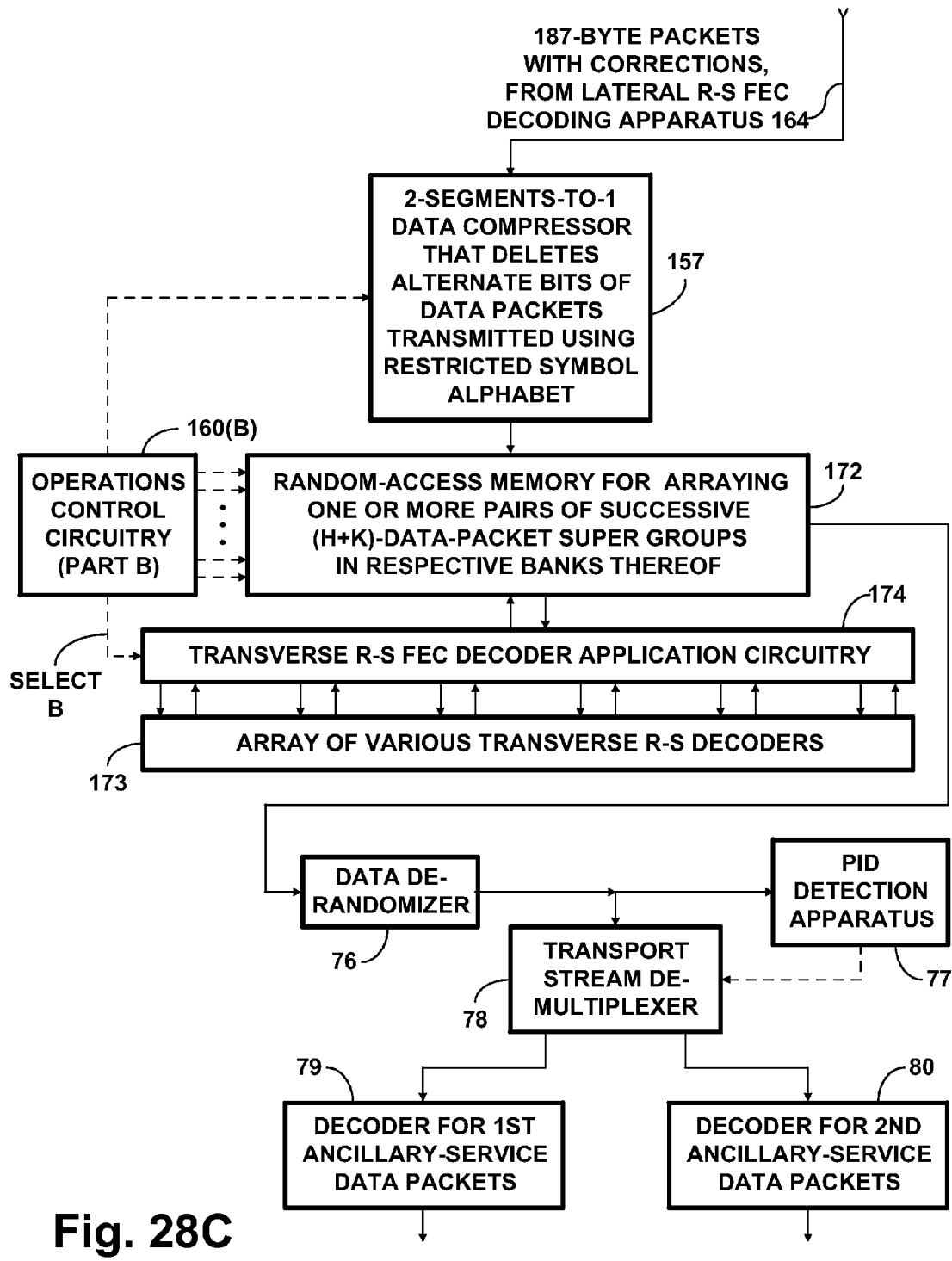

FIGS. 28A, 28B and 28C combine to form a FIG. 28 schematic diagram of a DTV receiver capable of receiving DTV signals as transmitted by the DTV transmitters described supra with reference to FIGS. 15 to 22 of the drawing. The FIG. 28A portion of the DTV receiver includes the VSB AM DTV receiver front-end 44, the analog-to-digital converter 45, the demodulator 46, the digital filtering 47 and the sync signals extraction circuitry 48 connected and operated as in the FIG. 27 DTV receiver.

FIG. 28A shows circuitry for analyzing the symbol alphabet used in various portions of the reproduced baseband DTV signal. This circuitry includes the hard-decision decoder 49 for 8VSB symbols, which is connected for receiving the response of the digital filtering 47 for equalization of channel response and for rejection of co-channel interfering NTSC signal. The decisions that the decoder 49 makes concerning the 3-bit symbols are supplied to the de-interleaver 50 that complements the convolutional interleaver 12 in the DTV transmitter. The circuitry 51 used in the FIG. 27A portion of the FIG. 27 DTV receiver for deciding the symbol alphabet used in each 207-byte data segment is replaced in the FIG. 28 DTV receiver by circuitry 151. The circuitry 151 decides the symbol alphabet used in the initial 187 bytes of each 207-byte data segment by evaluating the distribution of 8VSB symbols used in those initial 187 bytes. The final twenty bytes are left out of the evaluation of each successive data segment supplied from the de-interleaver 50 because these are R-S FEC parity bytes that use the full alphabet of 8VSB symbols irrespective of the symbol coding in the preceding 187-byte data packet. Assuming that besides the full 8VSB alphabet two or three restricted alphabets are used in the 187-byte packets, the decisions that the circuitry 151 supplies are expressed as bit pairs. E.g., 00 indicates full 8VSB alphabet; 01 indicates the first-coset restricted-symbol-alphabet; 10 indicates the second-coset restricted-symbol-alphabet; 11 indicates pseudo-2VSB restricted-symbol-alphabet.

Presuming that PCPM is of a preferred form in which $Z_1$ is constant in value throughout the first 187-bytes of each data segment, a typical construction of the circuitry 151 is as follows. The two output lines from the typical circuitry 151 are biased from high impedance sources to the 00 condition. This is so that, absent any finding that a data segment currently being evaluated is part of a robust signal transmission, the circuitry 151 supplies a 00 default indication that the data segment currently being evaluated is part of an ordinary 8VSB signal transmission. The typical circuitry 151 includes a set of eight decoders, each supplied as its respective input signal the 3-bit symbol codes that the de-interleaver 50 supplies. Each of these decoders uniquely responds with a ONE when and only when a respective one of the eight 3-bit symbol codes occurs.

The typical circuitry 151 determines in the following way that a data segment is transmitted using the full alphabet of 8VSB symbols. Respective counters are used to count the ONES that occur in each of the responses of the set of eight decoders within the initial 748 symbol epochs of the data segment. The eight counts are compared to a threshold value somewhat above 93.5, say 112, to determine if one of the symbol codes appears more frequently than would be expected in an 8VSB signal packet. A plural-input NOR gate is connected for receiving these eight decisions and decisions concerning whether or not the data segment was transmitted using pseudo-2VSB, the first-coset restricted-symbol-alphabet exclusively, or the second-coset restricted-symbol-alphabet exclusively. The response of this plural-input NOR gate being a ONE at the conclusion of a data segment is a reasonably reliable indication that the data segment was transmitted using the full alphabet of 8VSB symbols. This indication conditions a first pair of tri-states to assert the 00 bit pair from low source impedances on the output lines from the circuitry 151.

The typical circuitry 151 determines in the following way whether or not a data packet is transmitted using the first-coset restricted-symbol-alphabet exclusively. The responses of the decoders for 010, 011, 110 and 111 symbol codes are applied to respective input ports of a first 4-input OR gate. The ONEs that this first 4-input OR gate generates in the initial 748 symbol epochs of each data segment are counted. The count is compared to a prescribed threshold value, such as 702. If this threshold is exceeded, this is an indication that the data packet was transmitted using the first-coset restricted-symbol-alphabet. This indication conditions a second pair of tri-states to assert the 01 bit pair from low source impedances on the output lines from the circuitry 151.

The typical circuitry 151 determines in the following way whether or not a data packet is transmitted using the second-coset restricted-symbol-alphabet exclusively. Responses of the decoders for 000, 001, 100 and 101 symbol codes are applied to respective input ports of a second 4-input OR gate. The ONEs that this second 4-input OR gate generates in the initial 748 symbol epochs of each data segment are counted. The count is compared to a prescribed threshold value, such as 702. If this threshold is exceeded, this is an indication that the data packet was transmitted using the second-coset restricted-symbol-alphabet. This indication conditions a third pair of tri-states to assert the 10 bit pair from low source impedances on the output lines from the circuitry 151.

The typical circuitry 151 determines in the following way whether or not a data packet is transmitted using pseudo-2VSB. The de-interleaver 50 supplies the circuitry 151 with a succession of 3-bit symbol codes. The $Z_2$ and $Z_1$ bits of these symbol codes are applied to respective input ports of a first two-input exclusive-NOR gate, which responds with a ONE to all symbols included in the pseudo-2VSB set and with a ZERO to all symbols excluded from the pseudo-2VSB set. The ONEs that the first exclusive-NOR gate generates in the initial 748 symbol epochs of each data segment are counted. The count is compared to a prescribed threshold value, such as 702. If this threshold is exceeded, this is an indication that the data segment was transmitted using pseudo-2VSB. This indication conditions a fourth pair of tri-states to assert the 11 bit pair from low source impedances on the output lines from the circuitry 151.

The bit pairs coding the circuitry 151 decisions are supplied to a mapper 152 of the byte pattern in the de-interleaved data field. The mapper 152 extends each bit pair decision by repeating it 186 times, to map the 187 bytes of a data packet as a line of bit pair decisions. The mapper 152 appends to the conclusion of each line of bit pair decisions twenty more bit pairs indicative of the full-alphabet 8VSB coding used for the lateral R-S FEC parity bytes that conclude each data segment. The convolutional interleaver 53 generates the pattern of bit pair decisions mapping byte characteristics in the interleaved data field of the baseband DTV signal supplied as response from the digital filtering 47 for equalization of channel response and for rejection of co-channel interfering NTSC signal.

The digital delay circuitry 54 delays the digital filtering 47 response by 105 or so data segments to align it temporally with the bit pairs from the convolutional interleaver 53 that describe symbol usage in the interleaved data field. The plural-mode 12-phase trellis decoder 55 of Viterbi type is connected for receiving the digital filtering 47 response as delayed by the digital delay circuitry 54. When the bit pair decisions from the convolutional interleaver 53 indicate restricted-alphabet symbols are currently being supplied to the plural-mode trellis decoder 55, the decision tree in the trellis decoding is selectively pruned. This pruning excludes decisions that currently received symbols have normalized modulation levels that are excluded from the restricted alphabet of 8VSB symbols currently in use. The trellis decoder 55 is connected to supply bytes of data to a de-interleaver 56 that complements the convolutional interleaver 12 in the DTV transmitter. The de-interleaver 56 is connected for supplying its response to a lateral (207, 187) R-S FEC decoding apparatus 159 shown in FIG. 28B.

Information concerning the symbol sets used for generating each data segment in the de-interleaved data field can be encoded in the "reserved" portions of the data field synchronization data segments, as known in the prior art. Such information can be decoded and used to validate circuitry 151 response. Alternatively, such information can be used by the mapper 152 instead of the circuitry 151 response for determining the pattern of data segments in the de-interleaved data field that are transmitted using symbols from a restricted alphabet. This avoids the need for the digital delay 54. This facilitates hard-decision decoding on which adaptation of the equalization and NTSC rejection filtering is based being constructed to depend on the bit-pair decisions that the convolutional interleaver 53 supplies as to the nature of received symbols, so that tracking of dynamic multipath can be improved.

FIGS. 28B and 28C show parts 160(A) and 160(B), respectively, of operations control circuitry 160 for controlling transverse Reed-Solomon forward-error-correction decoding procedures. Showing the operations control circuitry 160 in two parts is an artifice used in the drawings to avoid running numerous connections from elements shown in FIGS. 28A and 28B to elements shown in FIG. 28C. FIG. 28B shows the operations control circuitry 160 connected for receiving DFS signal, DSS signal and clocking signal at an even multiple of symbol rate via respective connections from the sync signals extraction circuitry 48 in FIG. 28A. These signals are provided with respective delays by means not explicitly shown, which delays compensate for latent delays accumulated in the FIG. 28A circuitry and in the lateral (207, 187) R-S FEC decoding apparatus 159 shown in FIG. 28B. FIG. 28B shows the operations control circuitry 160 connected for receiving the response of the digital delay circuitry 58 in FIG. 28A, which response provides indications of whether data segments were or were not decoded from 8VSB symbols that had alphabet restrictions.

A de-randomizer 61 is connected for providing de-randomized response to 187-byte data packet portions of corrected data segments supplied from the lateral (207, 187) R-S FEC decoding apparatus 159. Header detection apparatus 62 detects the PID portions of the de-randomized data packets to provide the operations control circuitry 160 information concerning the types of corrected data segments supplied from the lateral (207, 187) R-S FEC decoding apparatus 159. The operations control circuitry 160 uses this information when transverse R-S FEC decoding is to be performed only on selected types of data segments. A banked random-access memory 63 is employed in certain transverse R-S FEC decoding procedures operative on 207-byte data segments. Writing to and reading from the banks of the RAM 63 is controlled by the operations control circuitry 160.

The lateral (207, 187) R-S FEC decoding apparatus 159 is connected for supplying successive bytes of corrected data segments to the RAM 63 to be written into one of two banks of memory therein. Each of these banks of memory is capable of storing the (N+Q) data segments in a supergroup. Each addressed location in the RAM 63 is capable of temporarily storing a byte supplied from the lateral (207, 187) R-S FEC decoding apparatus 159, plus any extension or extensions of that byte. Consider successive supergroups of (N+Q) data segments to be ordinally numbered. The respective cycles of operation for the two banks of the RAM 63 are shifted with respect to each other in time. This shift is such that bytes of odd-numbered supergroups of (N+Q) data segments are written to one bank, and bytes of even-numbered supergroups of (N+Q) data segments are written to the other bank. The RAM 63 is operated so that, while bytes of a newly received supergroup of (N+Q) data segments are being written to one bank of the memory, the previous supergroup of (N+Q) data segments that was written to the other bank of memory can be corrected for byte errors. Writing each successive byte of a newly received supergroup of (N+Q) data segments to an addressed storage location in one bank of the RAM 63 overwrites a byte from two such supergroups previous. Just before being overwritten, the contents of storage locations for the N data segments containing payload information are read to a lateral (207, 187) Reed-Solomon forward-error-correction decoding apparatus 164. If (N+Q) equals 156 or a multiple thereof, a data segment read from the RAM 63 to the R-S FEC decoding apparatus 164 will occupy the same position in a data field that it had when written into the RAM 63, which simplifies subsequent data de-randomization of data packets.

The operations control circuitry 160 supplies the addressing for writing and reading operations of the RAM 63. The operations control circuitry 160 includes counter circuitry for counting at an even multiple of the rate bytes are supplied from the lateral (207, 187) R-S FEC decoding apparatus 159. The count from this counter circuitry is synchronized with the received data fields and data segments using the synchronizing signals extracted by the synchronization signal extraction circuitry 48. Portions of the count from this counter provides read addressing to a pair of read-only memories. These ROMs respectively generate the addressing supplied to each bank of the RAM 63. Storage locations in one of the RAM 63 banks are addressed by row and by column for being overwritten with a supergroup of (N+Q) data segments supplied from the lateral (207, 187) R-S FEC decoding apparatus 159. N previously stored data segments are read from this bank of the RAM 63 to the lateral (207, 187) Reed-Solomon forward-error-correction decoding apparatus 164 in the read before overwriting procedure described in the previous paragraph. Successive addresses occur at the rate that bytes are supplied from the R-S FEC decoding apparatus 159.

While a new supergroup of (N+Q) data segments is being written into one bank of the RAM 63, the storage locations in the other of the RAM 63 banks are transversally addressed for reading to a selected one of an array 65 of transverse Reed-Solomon forward-error-correction decoders. The selection is made by transverse Reed-Solomon forward-error-correction decoder application circuitry 66 responsive to a SELECT A control signal supplied by the operations control circuitry 160. The operations control circuitry 160 determines which transverse R-S FEC decoder, if any, to select from information the lateral (207, 187) R-S FEC decoding apparatus 159 supplies. This information concerns the type of segments including parity bytes of transverse R-S FEC decoding that the R-S FEC decoding apparatus 159 finds to be correctable. After the bytes in each transversal path have had errors therein corrected to the extent the transverse R-S FEC code permits, these bytes are written back to the same storage locations in this other of the RAM 63 banks they were read from.

Successive addresses in the transverse scanning of storage locations in a bank of the RAM 63 occur at a multiple of twice the rate bytes are supplied from the lateral (207, 187) R-S FEC decoding apparatus 159. If only one type of transverse R-S FEC coding is employed in each supergroup of (N+Q) data segments, successive addresses for transverse scanning of storage locations in the RAM 63 can occur at only twice the rate bytes are supplied from the lateral (207, 187) R-S FEC decoding apparatus 159. If two types of transverse R-S FEC coding are employed in each supergroup of (N+Q) data segments, independent transverse scanning of storage locations in the RAM 63 for each type of transverse R-S FEC coding may be desired. Successive addresses for such transverse scans have to be supplied at four times or more the rate bytes are supplied from the lateral (207, 187) R-S FEC decoding apparatus 159. Alternative designs in which transverse scanning of each bank of RAM is clocked independently of the lateral scanning of the other bank of RAM are possible. For example, such designs can be implemented using dual porting techniques.

A (207, 187) Reed-Solomon forward-error-correction decoding apparatus 164 is connected for receiving 207-byte data segments read from the RAM 63 after having been corrected insofar as possible by transverse R-S FEC decoding procedures. The (207, 187) R-S FEC decoding apparatus 164 performs lateral Reed-Solomon forward-error-correction on these 207-byte data segments and toggles the Transport Error Indicator (TEI) bit in each data packet in those segments in which the decoding apparatus 164 finds byte errors that still remain uncorrected. A data de-randomizer 67 is connected for receiving the portion of each data segment supplied by the lateral (207, 187) R-S FEC decoding apparatus 164 other than its twenty R-S FEC code parity bytes as a 187-byte data packet. The data de-randomizer 67 is connected for supplying de-randomized data packets to header detection apparatus 69 and to a transport stream de-multiplexer 69.

The transport stream de-multiplexer 69 responds to the header detection apparatus 69 detecting selected PIDs in certain types of the de-randomized data packets from the data de-randomizer 67 for sorting those types of de-randomized data packets to appropriate packet decoders. For example, video data packets are sorted to an MPEG-2 decoder 70. The MPEG-2 decoder 70 responds to the TEI bit in a data packet indicating that it still contains byte errors by not using the packet and instituting measures to mask the effects of the packet not being used. By way of further example, audio data packets are sorted to an AC-3 decoder 71.

The (207, 187) R-S FEC decoding apparatus 164 supplies corrected 187-byte data segments to a 2-segments-to-1 data compressor 157 for data packets decoded from restricted-alphabet symbols. FIG. 28C shows the data compressor 157 connected for supplying data packets to a banked random-access memory 172. Each addressed location in the RAM 72 is capable of temporarily storing an 8-bit byte of data, plus any extension or extensions of that byte. Each bank of memory in the RAM 172 is capable of storing the (H+K) data packets in a supergroup used in an ancillary-service transmission. These (H+K) data packets can occur during a number of supergroups of (N+Q) data segments.

The operations control circuitry 160 controls the writing and reading operations of the RAM 172. The lateral (207, 187) R-S FEC decoding apparatus 164 notifies the operations control circuitry 160 when one of the K packets containing parity bytes for a supergroup of transverse (G, H) R-S FEC coding occurs in the response of the data compressor 157 supplied to the RAM 172. Responsive to such notification, the operations control circuitry 160 enables the writing of this packet into a bank of the RAM 172. When one of the H data packets in a supergroup of transverse (G, H) R-S FEC coding occurs in the response of the lateral (207, 187) R-S FEC decoding apparatus 164, it is de-randomized by the data de-randomizer 67 for application to the header detection apparatus 68. The header detection apparatus 68 notifies the operations control circuitry 160 of the occurrence of the de-randomized PID of this de-randomized data packet. Responsive to such notification, the operations control circuitry 160 enables the writing of this data packet into a bank of the RAM 172. A counter within the operations control circuitry 160 keeps track of how many of the (H+K) data packets in the supergroup of transverse (G, H) R-S FEC coding are temporarily stored in a respective bank of the RAM 172. When a full complement of (H+K) data packets is temporarily stored in a respective bank of the RAM 172, the operations control circuitry 160 generates addressing that scans transverse paths through storage locations in that RAM 172 bank These storage locations are read to a selected one of an array 173 of transverse Reed-Solomon forward-error-correction decoders. Transverse Reed-Solomon forward-error-correction decoder application circuitry 174 makes the selection responsive to a SELECT B control signal supplied by the operations control circuitry 160. Responsive to information that the lateral (207, 187) R-S FEC decoding apparatus 164 supplies, the operations control circuitry 160 determines which transverse R-S FEC decoder, if any, to select. This information concerns the type of segments including parity bytes of transverse R-S FEC decoding that the R-S FEC decoding apparatus 164 finds to be correctable. After the bytes in each transversal path have had errors therein corrected to the extent the transverse R-S FEC code permits, these bytes are written back to the same storage locations in the RAM 172 bank they were read from. The operations control circuitry 160 generates addressing for reading the H data packets from the RAM 172 bank to the data de-randomizer 76. The data de-randomizer 76 is connected for supplying de-randomized data packets to the header detection apparatus 77 and the transport stream de-multiplexer 78. The header detection apparatus 77 responds to the PIDs in the de-randomized data packets to develop control signals for the transport stream de-multiplexer 78. Responsive to these control signals, the transport stream de-multiplexer 78 sorts the de-randomized data packets to appropriate packet decoders. FIG. 28C shows the decoder 79 for the data packets of a first ancillary service and the decoder 80 for the data packets of a second ancillary service, each being connected for receiving selected data packets from the transport stream de-multiplexer 78.

The FIG. 28 DTV receiver can be modified so that the data compressor 157 is written with data packets selected directly from the response of the lateral (207, 187) R-S FEC decoding apparatus 159, rather than from the response of the lateral (207, 187) R-S FEC decoding apparatus 164. This avoids the latent delay associated with temporarily storing data segments in the RAM 63. However, data packets selected directly from the response of the lateral (207, 187) R-S FEC decoding apparatus 159 will generally contain more byte errors than data segments selected from the response of the lateral (207, 187) R-S FEC decoding apparatus 164.

Robust transmission of an MPEG-2-compliant data packet at one-half or at one-quarter normal 8VSB code rate involves determining the data segment in which the packet commences and the data segment in which the packet concludes. Transmitting the packet so it spans contiguous segments in the de-interleaved data field simplifies these determinations and facilitates "automatic" operation of the 2-segments-to-1 data compressor in the DTV receiver. Transmitting a "robust" data packet so it always begins in an "odd" one of consecutively numbered data segments in the de-interleaved data field and concludes in a succeeding "even" one of those data segments further simplifies these determinations and facilitates the operation of the 2-segments-to-1 data compressor. This is especially so for P2VSB robust transmissions. The data segments in which PCPM transmission of an MPEG-2-compliant data packet at one-half normal 8VSB code rate commences and concludes can be deduced from the $Z_1$ bits in the initial and final ones of the pair of data segments containing symbols descriptive of that packet. In a robust transmission system in which a lateral (207, 187) R-S FEC codeword extends over a pair of data segments, the correctness of the pairing can be confirmed by the codeword being determined to contain a correct or correctable data packet. In a robust transmission system in which every data segment is a lateral (207, 187) R-S FEC codeword, different (207, 187) R-S FEC coding schemes can be used for the successive ones of a group of data segments used for transmitting an MPEG-2-compliant data packet at reduced code rate.

Figure 29:
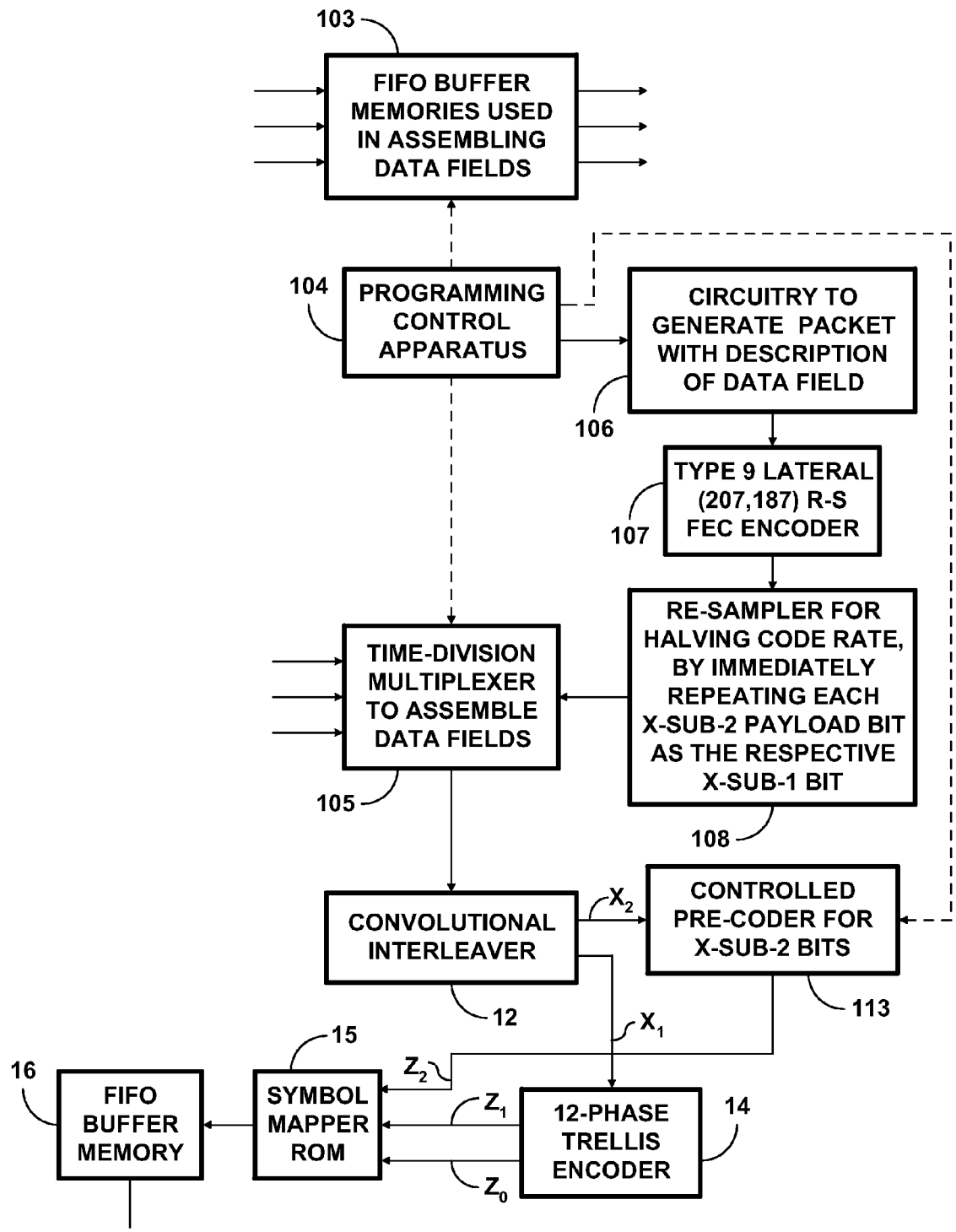
FIG. 29 is a schematic diagram of a modification made to a DTV transmitter of the general type shown in FIGS. 1, 2 and 7 for supplying DTV receivers with advance information concerning the nature of robust transmissions.

FIG. 29 shows a modification made to a DTV transmitter of the general type shown in FIGS. 1, 2 and 7 for supplying DTV receivers with advance information concerning the nature of robust transmissions. A block 103 of first-in/first-out buffer memories used in assembling data fields comprises the FIFO buffer memories 2 and 7 of the FIG. 1, FIG. 2 or FIG. 7 DTV transmitter, for example. Programming control apparatus 104 controls the writing and the reading of these FIFO buffer memories. The programming control apparatus 104 also controls the assembly of data fields by a time-division multiplexer 105 that replaces the time-division multiplexer 95 of the FIG. 1, FIG. 2 or FIG. 7 DTV transmitter. Furthermore, the programming control apparatus 104 supplies information concerning its programming procedures to circuitry 106 for generating a respective 187-byte description of each data field, which description includes a listing of the type of modulation employed in each successive data segment of that particular data field. A lateral (207, 187) Reed-Solomon forward-error-correction encoder 107 of a ninth type is connected for generating a respective 207-byte R-S FEC code responsive to each 187-byte description of a data field. A re-sampler 108 is connected for receiving these 207-byte segments from the lateral (207, 187) R-S FEC encoder 107 and generates in response to each of these 207-byte segments a respective pair of 207-byte segments at halved code rate for application to the time-division multiplexer 105. FIG. 29 shows the re-sampler 108 as being of the type that immediately repeats each $X_2$ payload bit as the succeeding $X_1$ bit, so as to generate P-2VSB data segments for application to the multiplexer 105. Alternatively, the re-sampler 108 is replaced by re-sampling circuitry as shown in FIG. 5 or in FIG. 6, to generate PCPM data segments for application to the multiplexer 105.

FIG. 29 shows a controlled pre-coder 113 for $X_2$ payload bits supplied from the convolutional interleaver 12. The programming control apparatus 104 supplies control signal to the controlled pre-coder 113 that disables pre-coding at least when bytes of P-2VSB signal are to be transmitted. So long as NTSC analog television signals are being transmitted, the programming control apparatus 104 enables pre-coding by the controlled pre-coder 113 when bytes of ordinary 8VSB signal or bytes of PCPM signal are to be transmitted. After the cut-off date for transmitting NTSC analog television signals pre-coding of $X_2$ payload bits will be discontinued.

Figure 30:
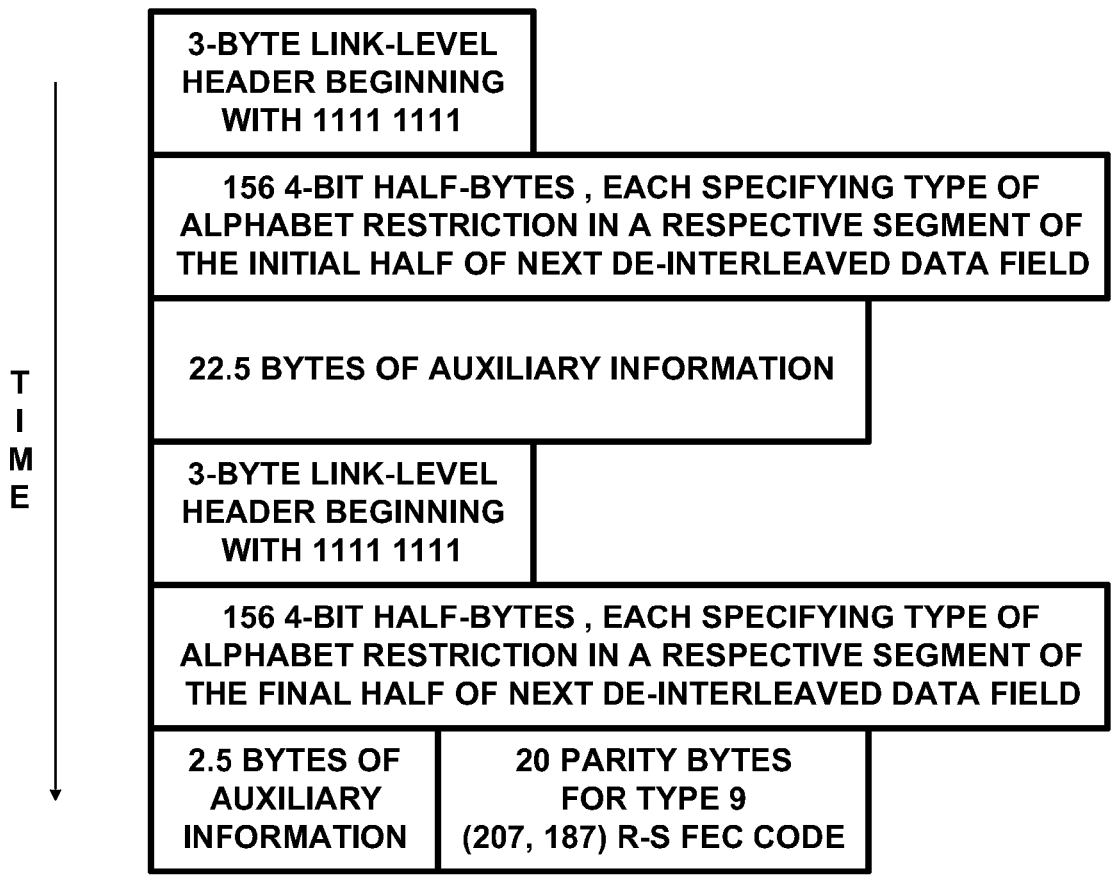
FIG. 30 depicts the signal the FIG. 29 transmitter modification uses for supplying DTV receivers with advance information concerning the nature of robust transmissions.

FIG. 30 shows the response of the lateral (207, 187) R-S FEC encoder 107 to a 187-byte description of a future data field supplied from the circuitry 106 for generating a respective 187-byte description of each data field, which description is of a representative type. This 207-byte data segment consists of two consecutive half segments of data. Each of these half segments of data begins with a link level header that is three bytes long and that begins with 1111 1111. The link level header of the final half segment repeats the link level header of the initial half segment except for the modulo-sixteen continuity count incrementing by one. In each of these half segments of data the link level header is followed by 156 four-bit half-bytes describing the modulation scheme used in a respective segment of the future data field. The initial half segment of data concludes with 22.5 bytes of auxiliary information. The final half segment of data concludes with 2.5 bytes of auxiliary information followed by twenty parity bytes for the lateral (207, 187) Reed-Solomon forward-error-correction coding.

Some useful auxiliary information is which of successive future data fields will use the pattern of robust transmission specified by the four-bit half-bytes describing the modulation scheme used in a respective data segment. This facilitates redundant transmission of information concerning the patterns of robust transmission.

Using a four-bit half-byte to describe the modulation scheme used in a respective segment of the future data field offers greater flexibility than using just a bit pair. An extra bit can be used for distinguishing the initial and final ones of a pair of data segments using P-2VSB from each other, for example, which helps parsing segments of P-2VSB signal. That same extra bit can be used to indicate whether or not the trellis coding of 8VSB or PCPM signals includes pre-coding of $X_2$ bits. Another extra bit can be used to indicate that there is block coding within data segments for halving their code rate. If only a bit pair is used to describe the modulation scheme used in a respective segment of the future data field, two data segments of P-2VSB signal or PCPM signal can specify the alphabet restrictions in a complete data frame, rather than in a single data field.

When a 207-byte data segment of the sort shown in FIG. 30 is re-sampled by the re-sampler 108, which halves the code rate by immediately repeating each bit of the data segment, two 207-byte data segments are generated, each starting with 1111 1111 1111 1111. The first bits of these data segments both being ONEs indicates to a legacy DTV receiver that there are transport errors in the data packets of these data segments. The fourth through sixteenth bits of these data segments all being ONEs indicates to a legacy DTV receiver that the initial 187 bytes of each of these data segments is a null packet.

Figure 31:
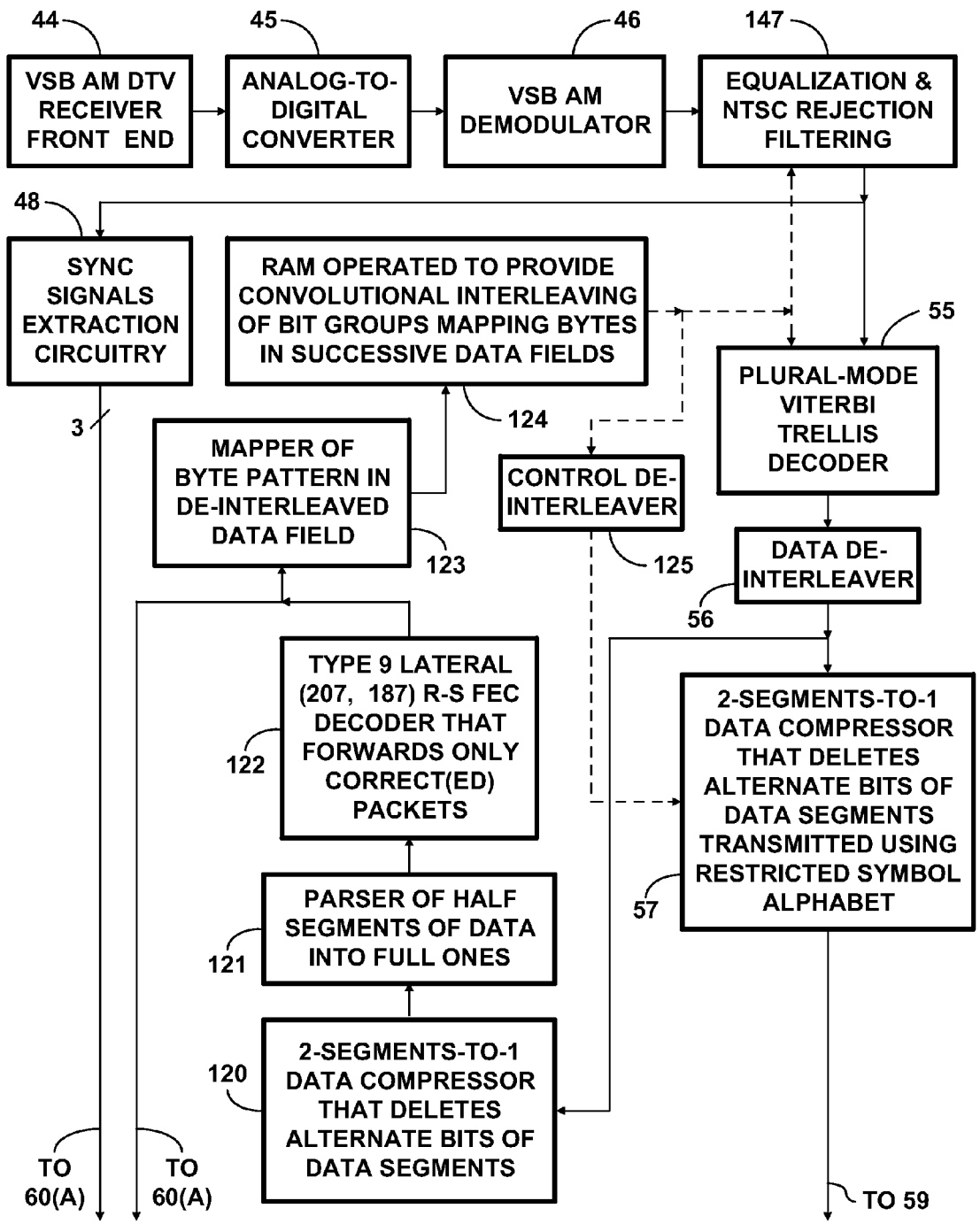
FIG. 31 is a schematic diagram of a modification made to the FIG. 27 DTV receiver, which modification implements the extraction of advance information concerning the nature of robust transmissions from a signal similar to that shown in FIG. 30.

FIG. 31 shows how the FIG. 27A portion of the FIG. 27 DTV receiver is modified for use with a DTV transmitter modified per FIG. 29. Elements 49, 50, 51, 52, 53, 54 and 58 of FIG. 27A are not included in FIG. 31, nor are their connections. In FIG. 31 digital filtering 147 for equalization of channel response and for rejection of co-channel interfering NTSC signal replaces the digital filtering 47 shown in FIG. 27A. The response of the digital filtering 147 is supplied without delay to the Viterbi trellis decoder 55 in FIG. 31. The data recovered by the plural-mode 12-phase Viterbi trellis decoder 55 are applied to the data de-interleaver 56. The de-interleaver 56 undoes the convolutional interleaving of data bytes done at the DTV transmitter and supplies successive data segments of de-interleaved data fields to the selectively operated data compressor 57. A 2-segments-to-1 data compressor 120 deletes alternate bits of data segments supplied from the de-interleaver 56, generating half segments of data supplied to a parser 121 for generating full segments of data. The parser 121 combines each successive half segment of data with its predecessor to generate a successive full segment of data for application to a lateral (207, 187) Reed-Solomon forward-error-correction decoder 122 for locating and correcting byte errors in R-S FEC codewords of a ninth type. If and only if the R-S FEC decoder 122 finds the initial 187-bytes of the full data segment to be a correct(ed) data packet, does the R-S FEC decoder 122 forward those 187 bytes to a mapper 123 of the byte pattern in an interleaved data field. In a variant of the FIG. 31 DTV receiver circuitry, the forwarding of the correct(ed) data packet is alternatively conditioned or further conditioned on the three-byte link-level headers indicating that the packet specifies the type of alphabet restrictions in a data field. The mapper 123 repeats each of the 312 half-bytes of data specifying the type of alphabet restriction, if any, in a respective segment of the de-interleaved data field 206 times for writing to a random-access memory 124. The RAM 124 stores the byte arrangement in a plurality of data fields. The RAM 124 is read one row of 207 storage locations after another, to supply signal for controlling operation of the digital filtering 147 and operation of the plural-mode 12-phase Viterbi trellis decoder 55. It is convenient to use dual-porting in the RAM 124, reading each successive row of 207 storage locations out through a shift register. Writing of the RAM 124 storage locations with the mapper 123 output signal is done addressing the RAM such that the byte information is stored in convolutionally interleaved manner for subsequent reading out to the digital filtering 147, to the trellis decoder 55 and to a control de-interleaver 125. The control de-interleaver 125 supplies the selectively operated data compressor 57 with de-interleaved indications of whether or not its response should omit alternative bits of each de-interleaved data segment in its input signal from the data interleaver 56.

Figure 32:
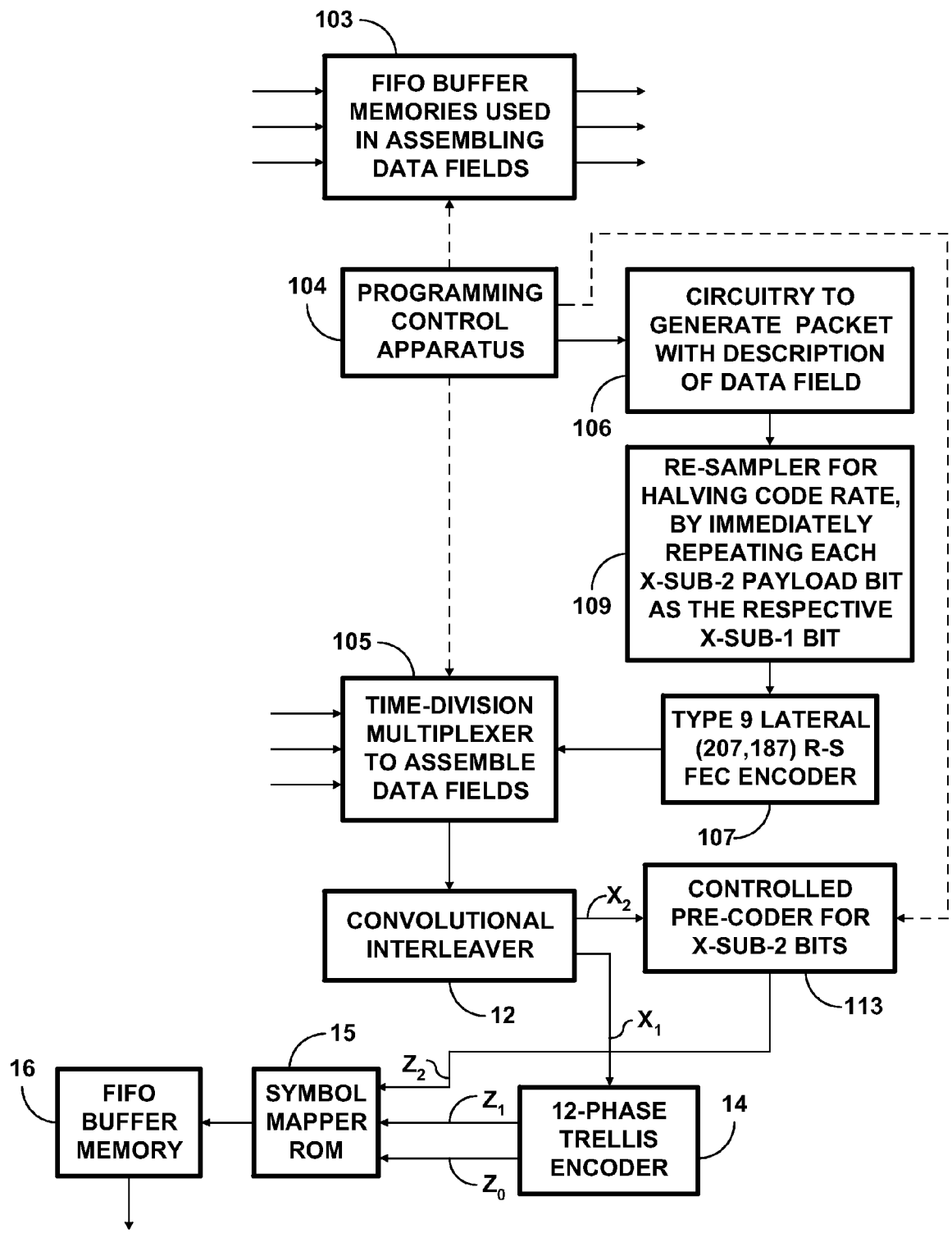
FIG. 32 is a schematic diagram of a modification made to a DTV transmitter of the general type shown in FIGS. 15, 16 and 19 for supplying DTV receivers with advance information concerning the nature of robust transmissions.

FIG. 32 shows a modification made to a DTV transmitter of the general type shown in FIGS. 15, 16 and 19 for supplying DTV receivers with advance information concerning the nature of robust transmissions. The FIG. 32 DTV transmitter modification includes the controlled pre-coder 113 for selectively pre-coding $X_2$ payload bits. The programming control apparatus 114 in the FIG. 32 DTV transmitter modification is similar to the programming control apparatus 104 in the FIG. 29 DTV transmitter modification, except for the control signals supplied to the controlled pre-coder 113 differing slightly to accommodate different R-S FEC encoding procedure. The re-sampler 108 is not included in the FIG. 32 DTV transmitter modification. The lateral (207, 187) R-S FEC encoder 107 is connected for supplying 207-byte segments to the time-division multiplexer 105 directly. In response to the respective 187-byte description of each data field supplied by the circuitry 106, a re-sampler 109 generates a respective pair of 187-byte segments at halved code rate, for application to the lateral (207, 187) R-S FEC encoder 107. FIG. 32 shows the re-sampler 109 as being of the type that immediately repeats each $X_2$ payload bit as the succeeding $X_1$ bit, so as to generate P-2VSB data packets for application to the R-S FEC encoder 107. Alternatively, the re-sampler 109 is replaced by re-sampling circuitry as shown in FIG. 17 or in FIG. 18, to generate PCPM data segments for application to the multiplexer 105.

Figure 33:
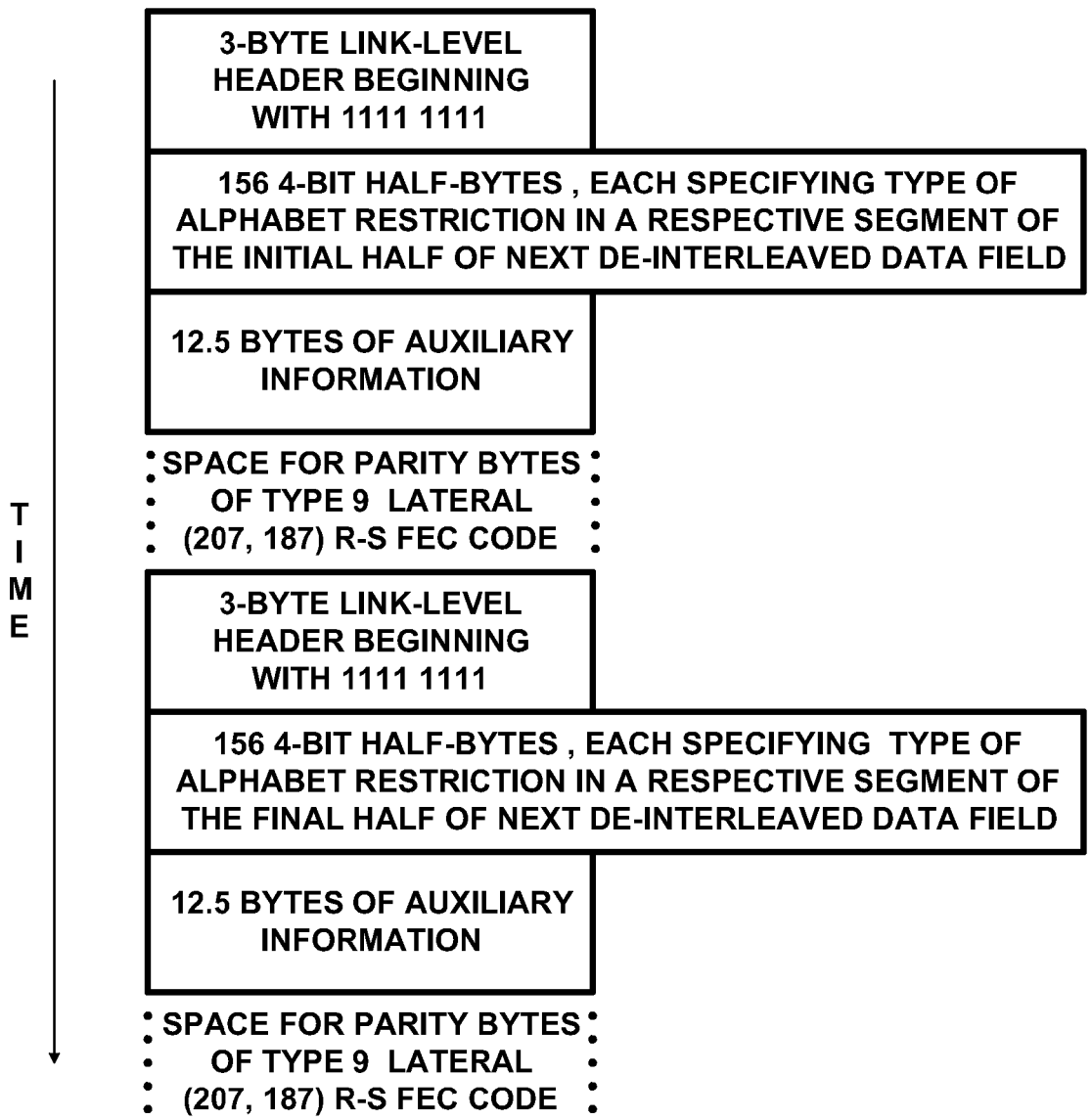
FIG. 33 depicts the signal the FIG. 32 transmitter modification uses for supplying DTV receivers with advance information concerning the nature of robust transmissions.

FIG. 33 shows the 187-byte description of a future data field supplied from the circuitry 106 for generating a respective 187-byte description of each data field, which description is of a representative type. This 187-byte data segment consists of two consecutive half packets of data. Each of these half packets begins with a link level header that is three bytes long and that begins with 1111 1111. The link level header of the final half packet repeats the link level header of the initial half packet except for the modulo-sixteen continuity count incrementing by one. In each of these half packets of data the link level header is followed by 156 four-bit half-bytes describing the modulation scheme used in a respective segment of the future data field. The half packets each conclude with 12.5 bytes of auxiliary information. If only a bit pair is used to describe the modulation scheme used in a respective segment of the future data field, just one data segment of P-2VSB signal or PCPM signal can specify the alphabet restrictions in a single data field, rather than a pair of data segments being required.

Figure 34:
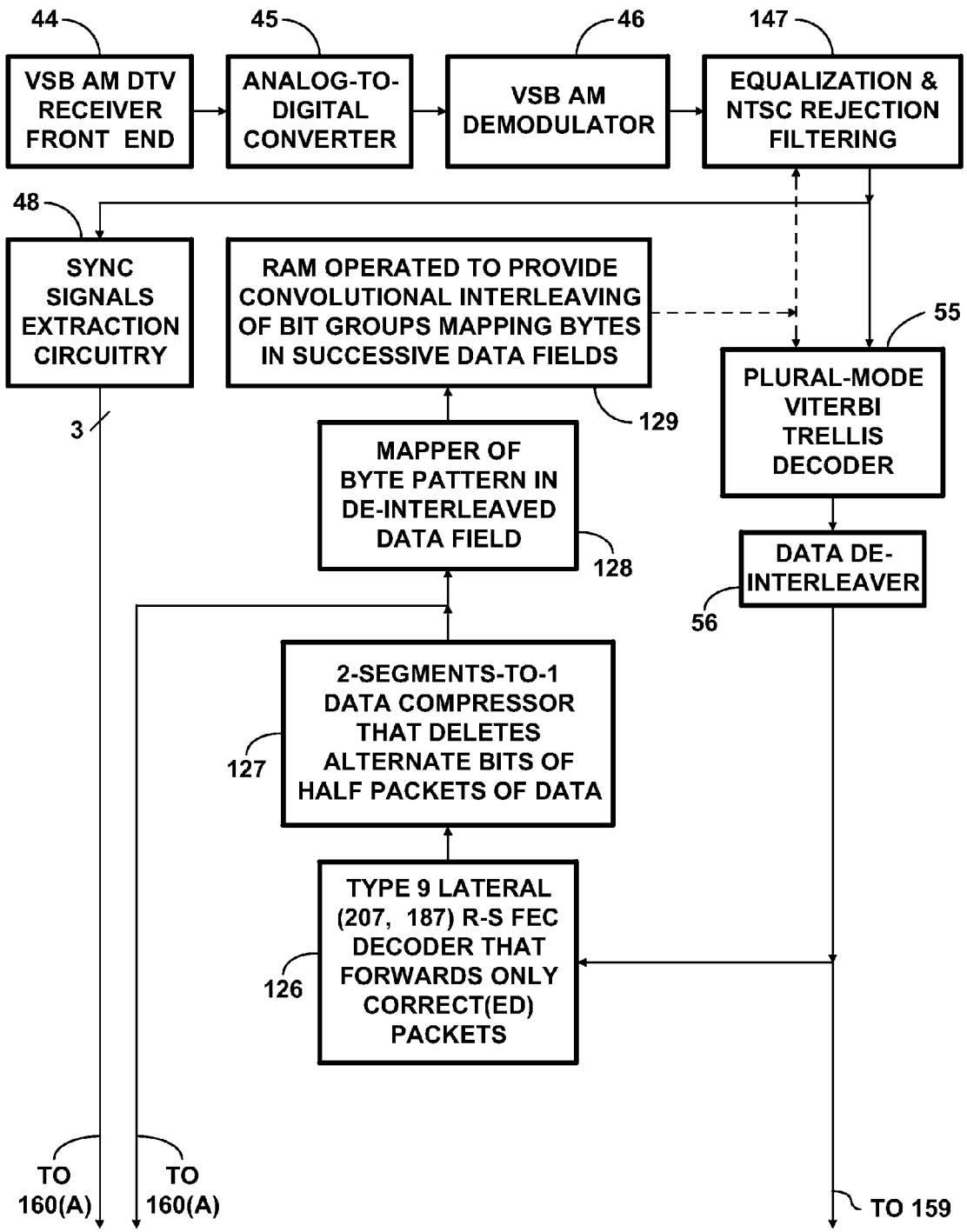
FIG. 34 is a schematic diagram of a modification made to the FIG. 28 DTV receiver, which modification implements the extraction of advance information concerning the nature of robust transmissions from a signal similar to that shown in FIG. 33.

FIG. 34 shows how the FIG. 28A portion of the FIG. 28 DTV receiver is modified for use with a DTV transmitter modified per FIG. 32. Elements 49, 50, 151, 152, 53, 54 and 58 of FIG. 28A are not included in FIG. 34, nor are their connections. In FIG. 31 digital filtering 147 for equalization of channel response and for rejection of co-channel interfering NTSC signal replaces the digital filtering 47 shown in FIG. 27A. In FIG. 34 digital filtering 147 for equalization of channel response and for rejection of co-channel interfering NTSC signal replaces the digital filtering 47 shown in FIG. 28A. The response of the digital filtering 147 is supplied without delay to the Viterbi trellis decoder 55 in FIG. 34. The data recovered by the plural-mode 12-phase Viterbi trellis decoder 55 are applied to the data de-interleaver 56. The de-interleaver 56 undoes the convolutional interleaving of data bytes done at the DTV transmitter and supplies successive data segments of de-interleaved data fields to the lateral (207, 187) R-S FEC decoding apparatus 159 shown in FIG. 28B. FIG. 34 shows the de-interleaver 56 connected for also supplying these data segments directly to a lateral (207, 187) Reed-Solomon forward-error-correction decoder 126 for locating and correcting byte errors in R-S FEC codewords of the ninth type. If and only if the R-S FEC decoder 126 finds the initial 187-bytes of the a data segment to be a correct(ed) data packet within an R-S FEC codeword of the ninth type, does the R-S FEC decoder 126 forward those 187 bytes to a 2-segments-to-1 data compressor 127 and subsequently to a mapper 128 of the byte pattern in an interleaved data field. The 2-segments-to-1 data compressor 127 deletes alternate bits in half packets of data forwarded to it by the R-S FEC decoder 126. The mapper 128 repeats each of the 312 halfbytes of data specifying the type of alphabet restriction, if any, in a respective packet of the de-interleaved data field 186 times for writing to a random-access memory 129. The mapper 129 appends twenty additional half bytes of data to each string of 187 half bytes, which twenty additional half bytes indicate that the parity bytes of the R-S FEC code giving rise to the string were transmitted at full code rate for 8VSB symbols. The RAM 129 stores the byte arrangement in a plurality of data fields. The RAM 129 is read one row of 207 storage locations after another, to supply signal for controlling operation of the digital filtering 147 and operation of the plural-mode 12-phase Viterbi trellis decoder 55. It is convenient to use dual-porting in the RAM 129, reading each successive row of 207 storage locations out through a shift register. Writing of the RAM 129 storage locations with the mapper 123 output signal is done addressing the RAM such that the byte information is stored in convolutionally interleaved manner for subsequent reading out to the digital filtering 147 and to the trellis decoder 55.

Figure 35:
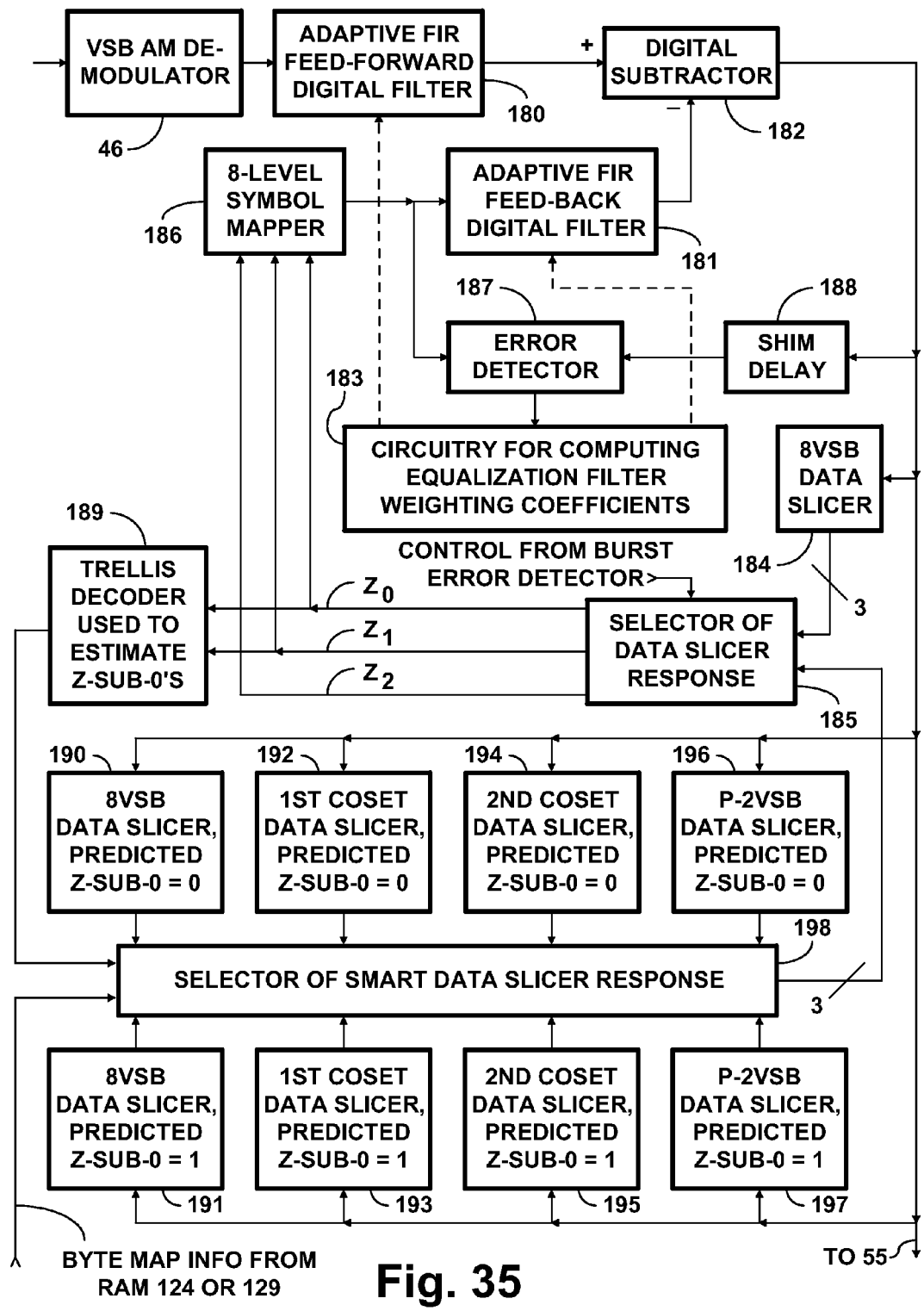
FIG. 35 is a detailed schematic diagram of decision-feedback equalization filtering included either in the FIG. 27 DTV receiver modified per FIG. 33 or in the FIG. 28 DTV receiver modified per FIG. 34.

FIG. 35 illustrates one way of constructing decision-feedback equalization (DFE) filtering for inclusion either in the FIG. 27 DTV receiver modified per FIG. 33 or in the FIG. 28 DTV receiver modified per FIG. 34. The DFE filtering comprises a feed-forward filter 180, a feedback filter 181 and a digital subtractor 182 connected for receiving the responses of filters 180 and 181 as its minuend and its subtrahend input signals, respectively. Both of the filters 180 and 181 are adaptive finite-impulse-response (FIR) digital filters kernels that are adjustable responsive to circuitry 183 for computing equalization filter weighting coefficients. The feed-forward filter 180 is connected for receiving as its input signal a digitized baseband DTV signal recovered by the VSB AM demodulator 46. The output signal from the subtractor 182 provides the response of the DFE filtering, which response is forwarded to the Viterbi trellis decoder 55 as its input signal. This response is supplied to a "simple" 8VSB data slicer 184 of conventional design, which recovers the respective $Z_0$, $Z_1$ and $Z_2$ bits encoded in each successive 8VSB symbol and supplies them to a selector 185 of data slicer response. The selector 185 supplies an 8-level symbol mapper 186 with $Z_0$, $Z_1$ and $Z_2$ bits reproducing those supplied to the selector 185 either from the "simple" 8VSB data slicer 184 or from a "smart" data slicer still to be described. The 8-level symbol mapper 186 is of the type shown in FIG. 7 of Annex D of ATSC Document A/53, the ATSC DIGITAL TELEVISION STANDARD. The response of the 8-level symbol mapper 186 is the decision feedback signal applied to the feedback filter 181 as its input signal. This signal is an estimate of the actual symbol sent by the DTV transmitter. An error detector 187 is connected for comparing this estimate to the symbol actually received as supplied in the DFE filtering response from the subtractor 182 as delayed by shim delay 188. The error detector 187 is connected to supply the differences of the received symbols from the estimates of the symbols actually transmitted to the circuitry 183 for computing equalization filter weighting coefficients. The circuitry 183 uses these differences as the basis for computing, in accordance with known technique or techniques, adjustments of the weighting coefficients in the kernels of the adaptive digital filters 180 and 181.

A 12-phase trellis decoder 189 is connected for responding to the $Z_1$ bits supplied from the selector 185 to predict the $Z_0$ bits the selector 185 should next receive, which predictions are used in novel "smart" data slicing procedures. The DFE filtering response supplied as output signal from the subtractor 102 is applied as input signal to data slicers 190, 191, 192, 193, 194, 195, 196 and 197. A selector 198 selects the response of one of the data slicers 190, 191, 192, 193, 194, 195, 196 and 197 to be applied as smart data slicer response to the selector 185 of data slicer response applied to the 8-level symbol mapper 186. Selection by the selector 198 is controlled in part by indications read from the RAM 124 or 129 as to the type of amplitude modulation used in the current byte. Selection by the selector 198 is controlled in further part by the $Z_0$ bits that trellis decoder 189 predicts for the symbols in the current byte.

Suppose the current byte is indicated to use 8VSB modulation. Then, if the $Z_0$ bit predicted for a current symbol is a ZERO, the selector 198 selects the response of a data slicer 190 to be smart data slicer response. The data slicer 190 is designed for quantizing the symbol to −7, −3, +1 or +5 normalized modulation level. However, if the $Z_0$ bit predicted for a current symbol is a ONE, the selector 198 selects the response of a data slicer 191 to be smart data slicer response. The data slicer 191 is designed for quantizing the symbol to −5, −1, +3 or +7 normalized modulation level.

Suppose the current byte is indicated to use PCPM modulation restricted to the first coset of 8VSB symbols. Then, if the $Z_0$ bit predicted for a current symbol is a ZERO, the selector 198 selects the response of a data slicer 192 to be smart data slicer response. The data slicer 192 is designed for quantizing the symbol to either −3 or +5 normalized modulation level. However, if the $Z_0$ bit predicted for a current symbol is a ONE, the selector 198 selects the response of a data slicer 193 to be smart data slicer response. The data slicer 193 is designed for quantizing the symbol to either −1 or +7 normalized modulation level.

Suppose the current byte is indicated to use PCPM modulation restricted to the second coset of 8VSB symbols. Then, if the $Z_0$ bit predicted for a current symbol is a ZERO, the selector 198 selects the response of a data slicer 194 to be smart data slicer response. The data slicer 194 is designed for quantizing the symbol to either −7 or +1 normalized modulation. However, if the $Z_0$ bit predicted for a current symbol is a ONE, the selector 198 selects the response of a data slicer 195 to be smart data slicer response. The data slicer 195 is designed for quantizing the symbol to either −5 or +3 normalized modulation level.

Suppose the current byte is indicated to use P-2VSB modulation. Then, if the $Z_0$ bit predicted for a current symbol is a ZERO, the selector 198 selects the response of a data slicer 196 to be smart data slicer response. The data slicer 196 is designed for quantizing the symbol to −7 or +5 normalized modulation level. However, if the $Z_0$ bit predicted for a current symbol is a ONE, the selector 198 selects the response of a data slicer 197 to be smart data slicer response. The data slicer 197 is designed for quantizing the symbol to either −5 or +7 normalized modulation level.

The selector 185 of data slicer response is connected for receiving a control signal from a burst error detector not explicitly shown in the drawing. The smart data slicer response supplied to the selector 185 as one of its input signal is prone to running error after protracted bursts of noise in the received DTV signal. So, the burst error detector conditions the selector 185 to reproduce the response of the simple 8VSB data slicer 184 for a few symbol epochs following a burst error being detected. When power is applied to the DTV receiver after a time that power has been withheld from the DTV receiver, the control signal supplied from the burst error detector conditions the selector 185 to reproduce for a few symbol epochs the response of the simple 8VSB data slicer 184.

The transmitters of FIGS. 29 and 32 can be modified to use PCPM, rather than P-2VSB, for transmitting a re-sampled data segment that specifies the alphabet restrictions in a data field. Halving code rate by inserting a respective ONE immediately following each bit of the initial half of the data segment being re-sampled generates a 207-byte data segment starting with 1111 1111 1111 1111. A legacy receiver identifies such a data segment as one containing a null packet and disregards it. Halving code rate by inserting a respective ZERO immediately following each bit of the final half of the data segment generates a 207-byte data segment starting with 1010 1010 1010 1010, which a legacy receiver may mistake for one containing a correct or correctable data packet. Such mistake is avoided by inserting a respective ONE immediately following the first eight bits of the final half of the data segment being re-sampled and a respective ZERO immediately following the succeeding bits of that final half of the data segment being re-sampled.

Consider the form of modulation generated by choosing the $Y_2$ bit in each two-bit symbol supplied to the ⅔ trellis encoder in an 8VSB DTV transmitter to be the bit complement of the $X_1$ bit. This restricts the 8VSB symbol alphabet to consist of only those symbols corresponding to normalized modulation levels of −3, −1, +1 and +3. While this form of half-code-rate modulation has a symbol-error-distance no greater than that of 8VSB, it can be used together with P-2VSB to keep average power within permitted bounds without having to reduce the distances between 8VSB modulation levels. Another interesting form of modulation is generated by choosing the $Y_2$ bit in each two-bit symbol supplied to the ⅔ trellis encoder in an 8VSB DTV transmitter to be the same as the $X_1$ bit of a symbol from a specified time previous. This form of half-code-rate modulation has a symbol-error-distance comparable to PCPM if smart data slicing is used, but it should be easier to remedy brief signal drop-outs. Alternatively, the $Y_2$ bit in each two-bit symbol supplied to the ⅔ trellis encoder in an 8VSB DTV transmitter can be generated through trellis coding of the $X_1$ bits of earlier symbols.

The invention as thusfar described includes teaching that will be useful in subsequent development of the transmission of data at reduced code rate through the 8VSB DTV broadcasting medium. This should be taken into consideration when evaluating the scopes of the claims that follow.

Previous proposals for transmitting data at reduced code rate through the 8VSB DTV broadcasting medium have attempted to map recoded 187-byte MPEG-2-compatible data packets or 207-byte Reed-Solomon codewords into 184-byte windows of 207-byte data segments. This presents substantial difficulties at the transmitter with interleaving data at reduced code rate with ordinary 8VSB data transmitted at normal code rate. The data at reduced code rate do not fit evenly into a small number of data segments.

The foregoing specification teaches how to transmit data at a submultiple (1/N) of normal code rate, such that a 187-byte MPEG-2-compatible data packet can be recoded into exactly N 187-byte data packets. This is made possible by Reed-Solomon coding the N 187-byte data packets using at least one type of (207, 187) Reed-Solomon coding that is orthogonal to the type of (207, 187) Reed-Solomon coding specified in A/53. The orthogonal type(s) of (207, 187) Reed-Solomon coding distinguish the recoded data from ordinary 8VSB data.

Furthermore, transmitting the orthogonal type(s) of (207, 187) Reed-Solomon coding guarantees that the recoded data will be discarded by legacy DTV receivers that do not have the capability to usefully receive the recoded data. There is no need to provide an individual PID in each 207-byte data segment in order to assure that the data in that segment will be discarded by legacy DTV receivers. So, data segments that employ the orthogonal type(s) of (207, 187) Reed-Solomon coding can provide a 187-byte window for data of any kind, rather than just a 184-byte window being available. This is significant when supplementary block coding techniques are applied to a number of 187-byte MPEG-2-compatible data packets or the 207-byte data segments containing such packets.

The foregoing specification also teaches how to transmit data at a submultiple (1/N) of normal code rate, such that a (207, 187) R-S FEC coded 187-byte MPEG-2-compatible data packet can be recoded into exactly N 207-byte data segments. This precludes each of the N 207-byte data segments being R-S FEC coded itself, but raises the specter that the R-S decoder in a legacy DTV receiver will find one or more of those data segments to be a correct(able) codeword for the first type of (207, 187) R-S FEC code. At least eleven of the 207 bytes of a (207, 187) R-S FEC codeword have to disagree with the other bytes for the codeword to be found to contain uncorrectable error. The chance of all eight bits in one byte not being considered to be in error is one in two raised to the eighth power—i.e., one chance in 256. The chance for none of the bits in eleven 8-bit bytes being considered to be in error is one chance in 256 raised to the eleventh power, which is to say one chance in two raised to the eighty-eighth power or one chance in 524 288. So there is one chance in 524 288 that a randomly generated 207-byte segment will be found to be a correct or correctable (207, 187) R-S FEC codeword. These fairly rare occurrences can be checked for at the transmitter and avoided simply by rearranging the data segment sequence supplied to the data randomizer. (Some of the supposedly correct(able) codewords would be rejected for other reasons such as invalid PID or as a supposedly repeated codeword.) Transmitting data at a submultiple (1/N) of normal code rate, such that a (207, 187) R-S FEC coded 187-byte MPEG-2-compatible data packet can be recoded into exactly N 207-byte data segments, is important to turbo coding.

In the claims which follow, the word "said" is used to indicated antecedence; and the definite article "the" is not so used, but rather is used for other grammatical purposes.

What is claimed is:

1. Apparatus for generating trellis-coded digital television signals that include more robust symbol coding using symbols selected from a full 8VSB symbol alphabet consisting of −7, −5, −3, −1, +1, +3, +5 and +7 normalized modulation levels superposed on a background modulation level, said apparatus for generating trellis-coded digital television signals comprising:

data randomization apparatus connected for randomizing the bits of MPEG-2-compliant 187-byte data packets to generate respective 187-byte packets of randomized data;

a Reed-Solomon forward-error-correction encoder connected for Reed-Solomon forward-error-correction encoding each of said 187-byte packets of randomized data to generate a respective one of 207-byte lateral Reed-Solomon codewords, each consisting of 187 data bytes plus twenty parity bytes;

a time-division multiplexer connected for assembling data fields of prescribed size and for arranging within said data fields of prescribed size 207-byte half-normal-code-rate data segments generated by a code-rate reduction encoder together with ones of any 207-byte data segments corresponding to said 207-byte lateral Reed-Solomon codewords that are to be transmitted at normal code rate;

a convolutional byte interleaver connected for convolutionally interleaving said 207-byte data segments as so arranged in said data fields, thereby to generate convolutionally interleaved data bytes;

a trellis encoder connected for generating 2/3 trellis coding responsive to said convolutionally interleaved data bytes; and apparatus for mapping said 2/3 trellis coding to eight-level symbols, inserting synchronizing symbols and introducing an offset level into the resulting stream of symbols for engendering said background modulation level, wherein some of succeeding bits that said code-rate-reduction encoder respectively inserts after original bits of each of said 207-byte lateral Reed-Solomon codewords that is to be transmitted at one-half of normal code rate are ZEROs and the rest are ONEs in accordance with a prescribed pattern dependent on the position said inserted bits will occupy in said data fields and independent of said original bits that said inserted bits succeed.

2. The claim 1 apparatus for generating trellis-coded digital television signals, wherein said prescribed pattern of bits inserted by said code-rate-reduction encoder is such that the average power in symbol coding generated from said reduced-code-rate data segments stays substantially the same as for symbol coding generated from lateral Reed-Solomon coded data segments that are not further encoded to reduce code rate therein.

3. The claim 1 apparatus for generating trellis-coded digital television signals, wherein said prescribed pattern of ZEROes and ONEs cyclically repeats itself, wherein each cycle of said prescribed pattern of ZEROes and ONEs contains just as many ONEs as ZEROes, and wherein each cycle of said prescribed pattern of ZEROes and ONEs has a number of bits evenly divisible by forty-eight.

4. Apparatus for generating trellis-coded digital television signals that include more robust symbol coding using symbols selected from a full 8VSB symbol alphabet consisting of −7, −5, −3, −1, +1, +3, +5 and +7 normalized modulation levels superposed on a background modulation level, said apparatus for generating trellis-coded digital television signals comprising:

data randomization apparatus connected for randomizing the bits of MPEG-2-compliant 187-byte data packets to generate respective 187-byte packets of randomized data;

a Reed-Solomon forward-error-correction encoder connected for Reed-Solomon forward-error-correction encoding each of said 187-byte packets of randomized data to generate a respective one of 207-byte lateral Reed-Solomon codewords, each consisting of 187 data bytes plus twenty parity bytes;

a time-division multiplexer connected for assembling data fields of prescribed size and for arranging within said data fields of prescribed size said 207-byte half-normal-code-rate data segments generated by a code-rate reduction encoder together with ones of any 207-byte data segments corresponding to said 207-byte lateral Reed-Solomon codewords that are to be transmitted at normal code rate:

a convolutional byte interleaver connected to convolutionally interleave said 207-byte data segments as so arranged in said data fields, thereby to generate convolutionally interleaved data bytes;

a trellis encoder connected for generating 2/3 trellis coding responsive to said convolutionally interleaved data bytes; and apparatus for mapping said 2/3 trellis coding to eight-level symbols, inserting synchronizing symbols and introducing an offset level into the resulting stream of symbols for engendering said background modulation level, wherein said code-rate-reduction encoder cooperates with said trellis encoder to restrict the symbol alphabet of at least certain ones of said 207-byte half-normal-code-rate data segments so as to consist of −7, −5, +5 and +7 normalized modulation levels.

5. Apparatus for generating trellis-coded digital television signals that include more robust symbol coding using symbols selected from a full 8VSB symbol alphabet consisting of −7, −5, −3, −1, +1, +3, +5 and +7 normalized modulation levels superposed on a background modulation level, said apparatus for generating trellis-coded digital television signals comprising:

data randomization apparatus connected for randomizing the bits of MPEG-2-compliant 187-byte data packets to generate respective 187-byte packets of randomized data;

a Reed-Solomon forward-error-correction encoder connected for Reed-Solomon forward-error-correction encoding each of said 187-byte packets of randomized data to generate a respective one of 207-byte lateral Reed-Solomon codewords, each consisting of 187 data bytes plus twenty parity bytes;

a time-division multiplexer connected for assembling data fields of prescribed size and for arranging within said data fields of prescribed size said 207-byte half-normal-code-rate data segments generated by a code-rate-reduction encoder together with ones of any 207-byte data segments corresponding to said 207-byte lateral Reed-Solomon codewords that are to be transmitted at normal code rate;

a convolutional byte interleaver connected to convolutionally interleave said 207-byte data segments as so arranged in said data fields, thereby to generate convolutionally interleaved data bytes;

a trellis encoder connected for generating 2/3 trellis coding responsive to said convolutionally interleaved data bytes; and apparatus for mapping said 2/3 trellis coding to eight-level symbols, inserting synchronizing symbols and introducing an offset level into the resulting stream of symbols for engendering said background modulation level, wherein said code-rate-reduction encoder repeats in its response each of said original bits of said certain ones of said 207-byte Reed-Solomon codewords that are to be transmitted at one-half of normal code rate.

6. Apparatus for generating trellis-coded digital television signals that include more robust symbol coding using symbols selected from a full 8VSB symbol alphabet consisting of −7, −5, −3, −1, +1, +3, +5 and +7 normalized modulation levels superposed on a background modulation level, said apparatus for generating trellis-coded digital television signals comprising:

data randomization apparatus connected for randomizing the bits of MPEG-2-compliant 187-byte data packets to generate respective 187-byte packets of randomized data;

a Reed-Solomon forward-error-correction encoder connected for Reed-Solomon forward-error-correction encoding each of said 187-byte packets of randomized data to generate a respective one of 207-byte lateral Reed-Solomon codewords, each consisting of 187 data bytes plus twenty parity bytes;

a time-division multiplexer connected for assembling data fields of prescribed size and for arranging within said data fields of prescribed size said 207-byte half-normal-code-rate data segments generated by a code-rate-reduction encoder together with ones of any 207-byte data segments corresponding to said 207-byte lateral Reed-Solomon codewords that are to be transmitted at normal code rate;

a convolutional byte interleaver connected to convolutionally interleave said 207-byte data segments as so arranged in said data fields, thereby to generate convolutionally interleaved data bytes;

a trellis encoder connected for generating 2/3 trellis coding responsive to said convolutionally interleaved data bytes; and apparatus for mapping said 2/3 trellis coding to eight-level symbols, inserting synchronizing symbols and introducing an offset level into the resulting stream of symbols for engendering said background modulation level, wherein said code-rate-reduction encoder is connected for further encoding each of said 207-byte lateral Reed-Solomon codewords that is to be transmitted at one-half of normal code rate by inserting after each of its original bits a respective succeeding bit from a prescribed binary sequence that repeats.

7. Apparatus for generating trellis-coded digital television signals that include more robust symbol coding using symbols selected from a full 8VSB symbol alphabet consisting of −7, −5, −3, −1, +1, +3, +5 and +7 normalized modulation levels superposed on a background modulation level, said apparatus for generating trellis-coded digital television signals comprising:

data randomization apparatus connected for randomizing the bits of MPEG-2-compliant 187-byte data packets to generate respective 187-byte packets of randomized data;

a Reed-Solomon forward-error-correction encoder connected for Reed-Solomon forward-error-correction encoding each of said 187-byte packets of randomized data to generate a respective one of 207-byte lateral Reed-Solomon codewords, each consisting of 187 data bytes plus twenty parity bytes;

a time-division multiplexer connected for assembling data fields of prescribed size and for arranging within said data fields of prescribed size said 207-byte half-normal-code-rate data segments generated by a code-rate-reduction encoder together with ones of any 207-byte data segments corresponding to said 207-byte lateral Reed-Solomon codewords that are to be transmitted at normal code rate;

a convolutional byte interleaver connected to convolutionally interleave said 207-byte data segments as so arranged in said data fields, thereby to generate convolutionally interleaved data bytes;

a trellis encoder connected for generating 2/3 trellis coding responsive to said convolutionally interleaved data bytes; and apparatus for mapping said 2/3 trellis coding to eight-level symbols, inserting synchronizing symbols and introducing an offset level into the resulting stream of symbols for engendering said background modulation level, wherein said code-rate-reduction encoder inserts a respective ONE after each original bit of the initial half of each of said 207-byte lateral Reed-Solomon code segments that is to be transmitted at one-half of normal code rate and inserts a respective ZERO after each original bit of the final half of each of said 207-byte lateral Reed-Solomon code segments that is to be transmitted at one-half of normal code rate, thereby restricting the symbol alphabet that further encodes the initial halves of ones of said 207-byte lateral Reed-Solomon code segments that are to be transmitted at one-half of normal code rate so as to consist of −3, −1, +5 and +7 normalized modulation levels, and thereby restricting the symbol alphabet that further encodes the final halves of ones of said 207-byte lateral Reed-Solomon code segments that are to be transmitted at one-half of normal code rate so as to consist of −7, −5, +1 and +3 normalized modulation levels.

8. Apparatus for generating trellis-coded digital television signals that include more robust symbol coding using symbols selected from a full 8VSB symbol alphabet consisting of −7, −5, −3, −1, +1, +3, +5 and +7 normalized modulation levels superposed on a background modulation level, said apparatus for generating trellis-coded digital television signals comprising:

data randomization apparatus connected for randomizing the bits of MPEG-2-compliant 187-byte data packets to generate respective 187-byte packets of randomized data;

a Reed-Solomon forward-error-correction encoder connected for Reed-Solomon forward-error-correction encoding each of said 187-byte packets of randomized data to generate a respective one of 207-byte lateral Reed-Solomon codewords, each consisting of 187 data bytes plus twenty parity bytes;

a time-division multiplexer connected for assembling data fields of prescribed size and for arranging within said data fields of prescribed size said 207-byte half-normal-code-rate data segments generated by a code-rate-reduction encoder together with ones of any 207-byte data segments corresponding to said 207-byte lateral Reed-Solomon codewords that are to be transmitted at normal code rate;

a convolutional byte interleaver connected to convolutionally interleave said 207-byte data segments as so arranged in said data fields, thereby to generate convolutionally interleaved data bytes;

a trellis encoder connected for generating 2/3 trellis coding responsive to said convolutionally interleaved data bytes; and apparatus for mapping said 2/3 trellis coding to eight-level symbols, inserting synchronizing symbols and introducing an offset level into the resulting stream of symbols for engendering said background modulation level, wherein said code-rate-reduction encoder inserts a respective ZERO after each original bit of the initial half of each of said 207-byte lateral Reed-Solomon code segments that is to be transmitted at one-half of normal code rate and inserts a ONE after each original bit of the final half of each of said 207-byte lateral Reed-Solomon code segments that is to be transmitted at one-half of normal code rate, thereby restricting the symbol alphabet that further encodes the initial halves of ones of said 207-byte lateral Reed-Solomon code segments that are to be transmitted at one-half of normal code rate so as to consist of −7, −5, +1 and +3 normalized modulation levels, and thereby restricting the symbol alphabet that further encodes the final halves of ones of said 207-byte lateral Reed-Solomon code segments that are to be transmitted at one-half of normal code rate so as to consist of −3, −1, +5 and +7 normalized modulation levels.

9. Apparatus for generating trellis-coded digital television signals that include more robust symbol coding using symbols selected from a full 8VSB symbol alphabet consisting of −7, −5, −3, −1, +1, +3, +5 and +7 normalized modulation levels superposed on a background modulation level, said apparatus for generating trellis-coded digital television signals comprising:

a first data randomizer connected for randomizing the bits of MPEG-2-compliant 187-byte data packets of a principal transport stream to generate respective 187-byte packets of randomized data that are to be transmitted at normal code rate;

a first Reed-Solomon forward-error-correction encoder connected for (207, 187) Reed-Solomon forward-error-correction encoding each of said 187-byte packets of randomized data that are to be transmitted at normal code rate, and for generating a respective 207-byte data segment from the result of encoding each of said 187-byte packets of randomized data from said principal transport stream that are to be transmitted at normal code rate;

a second data randomizer connected for randomizing the bits of an ancillary transport stream to generate a randomized ancillary transport stream;

outer encoding apparatus connected for encoding each successive 187-byte packet of said randomized ancillary transport stream that is to be transmitted at a submultiple (1/N)th of normal code rate, thereby to generate a respective group of 187-byte data packets N in number for transmission of said randomized ancillary transport stream at said submultiple (1/N)th of normal code rate;

a time-division multiplexer connected for arranging said 207-byte data segments in data fields;

a convolutional byte interleaver connected for convolutionally interleaving said 207-byte data segments as so arranged in said data fields, thereby to generate convolutionally interleaved data bytes;

a trellis encoder connected for generating 2/3 trellis coding responsive to said convolutionally interleaved data bytes; and apparatus for mapping said 2/3 trellis coding to eight-level symbols, inserting synchronizing symbols and introducing an offset level into the resulting stream of symbols for causing said background modulation level.

10. The claim 9 apparatus for generating trellis-coded digital television signals, wherein said outer encoding apparatus comprises a code-rate-reduction encoder for performing a redundant coding procedure.

11. The claim 9 apparatus for generating trellis-coded digital television signals, wherein said outer encoding apparatus comprises a code-rate-reduction encoder for performing a redundant coding procedure that consists of (N-1) times repetition of each one of the original bits of each of said 187-byte data packets that is to be transmitted at a submultiple (1/N)th of normal code rate.

12. The claim 9 apparatus for generating trellis-coded digital television signals, wherein said code-rate-reduction encoder will repeat in its response each of said original bits of each of said 187-byte data packets of said randomized ancillary transport stream that is to be transmitted at said submultiple of normal code rate.

13. The claim 9 apparatus for generating trellis-coded digital television signals, wherein N is 2, and wherein said outer encoding apparatus modifies each of said 187-byte data packets of said randomized ancillary transport stream that is to be transmitted at one-half normal rate by inserting after each of its original bits a respective succeeding bit of prescribed nature, thereby further encoding the initial and final halves of that 187-byte packet of said randomized ancillary transport stream as a respective pair of 187-byte half-normal-code-rate data packets.

14. The claim 9 apparatus for generating trellis-coded digital television signals, wherein said outer encoding apparatus will cooperate with said trellis encoder to restrict the symbol alphabet for coding of 187-byte data packets of said randomized ancillary transport stream transmitted at said submultiple of normal code rate so as to consist of −7, −5, +5 and +7 normalized modulation levels.

15. The claim 9 apparatus for generating trellis-coded digital television signals, wherein said outer encoding apparatus inserts a respective ONE after each original bit of the initial half of each of said 207-byte lateral Reed-Solomon code segments that is to be transmitted at one-half of normal code rate and inserts a respective ZERO after each original bit of the final half of each of said 207-byte lateral Reed-Solomon code segments that is to be transmitted at one-half of normal code rate, thereby restricting the symbol alphabet encoding that respective initial half of each of said 187-byte data packets of said randomized ancillary transport stream as a respective 187-byte half-normal-code-rate data packet so as to consist of −3, −1, +5 and +7 normalized modulation levels, and thereby restricting the symbol alphabet encoding that respective final half of each of said 187-byte data packets of said randomized ancillary transport stream as a respective 187-byte half-normal-code-rate data packet so as to consist of −7, −5, +1 and +3 normalized modulation levels.

16. The claim 9 apparatus for generating trellis-coded digital television signals, wherein said outer encoding apparatus inserts a respective ZERO after each original bit of the initial half of each of said 207-byte lateral Reed-Solomon code segments that is to be transmitted at one-half of normal code rate and inserts a respective ONE after each original bit of the final half of each of said 207-byte lateral Reed-Solomon code segments that is to be transmitted at one-half of normal code rate, thereby restricting the symbol alphabet encoding that respective initial half of each of said 187-byte data packets of said randomized ancillary transport stream as a respective 187-byte half-normal-code-rate data packet so as to consist of −7, −5, +1 and +3 normalized modulation levels, and thereby restricting the symbol alphabet encoding that respective final half of each of said 187-byte data packets of said randomized ancillary transport stream as a respective 187-byte half-normal-code-rate data packet so as to consist of −3, −1, +5 and +7 normalized modulation levels.

17. The claim 9 apparatus for generating trellis-coded digital television signals, wherein said second Reed-Solomon forward-error-correction encoder is connected for having more than ten bytes modified in each of the 207-byte codeword it generates, thereby generating a respective one of said 207-byte data segments arranged in data fields by said time-division multiplexer.

18. The claim 17 apparatus for generating trellis-coded digital television signals, wherein said second Reed-Solomon forward-error-correction encoder is connected for ones' complementing the bits of twenty parity bytes in each of the 207-byte codeword it generates, thereby generating a respective one of said 207-byte data segments arranged in data fields by said time-division multiplexer.

19. The claim 9 apparatus for generating trellis-coded digital television signals, wherein said (207, 187) Reed-Solomon forward-error-correction coding that said first Reed-Solomon forward-error-correction encoder is connected to perform is a shortened type of 255-byte Reed-Solomon forward-error-correction coding in which virtual bytes consist solely of ZERO-valued bits, and wherein said (207, 187) Reed-Solomon forward-error-correction coding that said second Reed-Solomon forward-error-correction encoder is connected to perform is a different shortened type of 255-byte Reed-Solomon forward-error-correction coding in which virtual bytes include a sufficient number of ONE-valued bits that its codewords are not apt to be mistaken for codewords generated by said first Reed-Solomon forward-error-correction encoder that subsequently acquire correctable errors.

20. The claim 9 apparatus for generating trellis-coded digital television signals, wherein said first and said second Reed-Solomon forward-error-correction encoders differ in the respective ways in which they encode respective sets of 187-byte data packets for generating 207-byte data segments therefrom.

21. Improved apparatus for generating 8VSB amplitude-modulation signals to transmit an ancillary transport stream of digital data together with MPEG-2-compliant 187-byte data packets of a principal transport stream in a time-division multiplex signal, said improved apparatus including:
   lateral Reed-Solomon forward-error-correction encoding apparatus for (207, 187) Reed-Solomon forward-error-correction coding randomized said MPEG-2-compliant 187-byte data packets of said principal transport stream and 187-byte sequences of response to said ancillary transport stream to form respective 207-byte data segments of data fields included in said time-division multiplex signal;
   a convolutional interleaver connected for convolutionally interleaving the bytes of said time-division multiplex signal to generate a convolutional interleaver response;
   12-phase 2/3 trellis encoding apparatus connected for receiving bits of said convolutional interleaver response as input signal and supplying three-bit symbols as the response of the 2/3trellis encoding apparatus, said 12-phase 2/3 trellis encoding apparatus functioning as inner encoding apparatus for said ancillary transport stream of digital data;
   apparatus for generating 8VSB amplitude-modulation signals from said three-bit symbols supplied from said 12-phase 2/3 trellis encoding apparatus as the response thereof,
   wherein the improved apparatus further comprises:
   a respective data randomizer for each transport stream for randomizing the bits therein; and
   outer encoding apparatus connected for supplying said lateral Reed-Solomon forward-error-correction encoding apparatus with said 187-byte sequences of response to said ancillary transport stream, said 187-byte sequences of response to said ancillary transport stream being the response of said outer encoding apparatus, said outer encoding apparatus cooperating with said 12-phase 2/3 trellis encoding apparatus functioning as inner encoding apparatus to improve the robustness of subsequent transmission of said ancillary transport stream of digital data.

22. The claim 21 improved apparatus wherein said outer encoding apparatus comprises:
   a re-sampler for halving code rate by inserting a respective prescribed further bit after each bit of said transversely Reed-Solomon forward-error-correction coded response from said respective transverse Reed-Solomon forward-error-correction encoding apparatus; and
   a generator of prescribed bits connected for supplying said re-sampler with each said respective prescribed further bit.

23. The claim 21 improved apparatus with the further improvement that said lateral Reed-Solomon forward-error-correction encoding apparatus for (207, 187) Reed-Solomon forward-error-correction coding randomized said MPEG-2-compliant 187-byte data packets of said principal transport stream and 187-byte sequences of response to said ancillary transport stream to form respective 207-byte data segments of data fields included in said time-division multiplex signal comprises:
   a first encoder for (207, 187) Reed-Solomon forward-error-correction codes of a conventional type, connected for laterally Reed-Solomon forward-error-correction coding randomized said MPEG-2-compliant 187-byte data packets of said principal transport stream;
   a second encoder for (207, 187) Reed-Solomon forward-error-correction codes of a further type distinguishable from (207, 187) Reed-Solomon forward-error-correction codes of said conventional type, connected for laterally Reed-Solomon forward-error-correction coding outer encoding apparatus response to randomized data bits from said transversely Reed-Solomon forward-error-correction coded response to said randomized digital data of said ancillary transport stream; and
   a third encoder for (207, 187) Reed-Solomon forward-error-correction codes of a still further type distinguishable both from (207, 187) Reed-Solomon forward-error-correction codes of said conventional type and from (207, 187) Reed-Solomon forward-error-correction codes of said further type, connected for laterally Reed-Solomon forward-error-correction coding outer encoding apparatus response to parity bits from said transversely Reed-Solomon forward-error-correction coded response to said randomized digital data of said ancillary transport stream.

24. The claim 21 improved apparatus, wherein said lateral Reed-Solomon forward-error-correction encoding apparatus encodes said 187-byte sequences of response to said ancillary transport stream differently than said randomized MPEG-2-compliant 187-byte data packets of said principal transport stream are encoded.

25. Improved apparatus for generating 8VSB amplitude-modulation signals to transmit a transport stream comprising a first transport stream of digital data together with MPEG-2-compliant 187-byte data packets of a second transport stream in a time-division multiplex signal, said improved apparatus including:
   a first data randomizer connected for randomizing of said transport stream;
   apparatus for (207, 187) Reed-Solomon forward-error-correction coding randomized said transport stream for incorporation within said time-division multiplex signal;
   a convolutional interleaver connected for convolutionally interleaving the bytes of said time-division multiplex signal to generate a convolutional interleaver response;
   12-phase 2/3 trellis encoding apparatus connected for receiving bits of said convolutional interleaver response as input signal and supplying three-bit symbols as is response of said 12-phase 2/3 trellis encoding apparatus, said 12-phase 2/3 trellis encoding apparatus functioning as inner encoding apparatus for said first transport stream of digital data;
   apparatus for generating 8VSB amplitude-modulation signals from said three-bit symbols supplied from said 12-phase 2/3 trellis encoding apparatus as said response thereof;
   a second data randomizer connected for randomizing the bits of said first transport stream of digital data to generate randomized first data; and
   apparatus for encoding bytes of said randomized data stream with two-dimensional forward-error-correction coding to generate two-dimensionally forward-errorcorrection coded randomized data, said apparatus for encoding bytes of said randomized data stream with two-dimensional forward-error-correction coding including outer encoding apparatus connected for receiving as input signal thereto said two-dimensionally forward-error-correction coded randomized data, response from said outer encoding apparatus connected for supplying outer encoding for incorporation within said time-division multiplex signal.

26. The claim 25 improved apparatus, wherein said apparatus for encoding bytes of said randomized data with two-dimensional forward-error-correction coding further includes:

apparatus for laterally coding each of said sequences of said bytes of said randomized data and for laterally coding each of said sequences of parity bytes, thereby to complete generation of said two-dimensionally forward-error-correction coded randomized data.

27. The claim 25 improved apparatus wherein said apparatus for encoding bytes of said randomized data with two-dimensional forward-error-correction coding further includes:

apparatus for laterally Reed-Solomon coding said transversely Reed-Solomon forward-error-correction coded response from said apparatus for transversely Reed-Solomon coding said bytes of said randomized data, thereby to complete generation of said two-dimensionally forward-error-correction coded randomized data.

28. The claim 27 improved apparatus, wherein said apparatus for (207, 187) Reed-Solomon forward-error-correction coding randomized transport stream for incorporation within said time-division multiplex signal essentially comprising:

a first encoder for (207, 187) Reed-Solomon forward-error-correction codes of a conventional type, and wherein said apparatus for laterally Reed-Solomon coding said transversely Reed-Solomon forward-error-correction coded response from said apparatus for transversely Reed-Solomon coding said bytes of said randomized data comprises:

a second encoder for (207, 187) Reed-Solomon forward-error-correction codes of a further type distinguishable from (207, 187) Reed-Solomon forward-error-correction codes of said conventional type, connected for laterally Reed-Solomon forward-error-correction coding outer encoding apparatus response to randomized data bits from said transversely Reed-Solomon forward-error-correction coded response; and a third encoder for (207, 187) Reed-Solomon forward-error-correction codes of a still further type distinguishable both from (207, 187) Reed-Solomon forward-error-correction codes of said conventional type and from (207, 187) Reed-Solomon forward-error-correction codes of said further type, connected for laterally Reed-Solomon forward-error-correction coding outer encoding apparatus response to parity bits from said transversely Reed-Solomon forward-error-correction coded response.

29. The claim 27 improved apparatus wherein said outer encoding apparatus comprises:

a re-sampler for halving code rate by inserting a respective prescribed further bit after each bit of said transversely Reed-Solomon forward-error-correction coded response from said respective transverse Reed-Solomon forward-error-correction encoding apparatus; and a generator of prescribed bits connected for supplying said re-sampler with each said respective prescribed further bit.

* * * * *